United States Patent
Nakajima

(10) Patent No.: US 9,153,688 B2
(45) Date of Patent: Oct. 6, 2015

(54) DETECTING AND DRIVING LOAD USING MOS TRANSISTOR

(71) Applicant: RENESAS ELECTRONICS CORPORATION, Kawasaki-shi (JP)

(72) Inventor: Sakae Nakajima, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/307,674

(22) Filed: Jun. 18, 2014

(65) Prior Publication Data

US 2015/0014687 A1    Jan. 15, 2015

(30) Foreign Application Priority Data

Jul. 10, 2013  (JP) .................................. 2013-144380
Mar. 31, 2014  (JP) .................................. 2014-074628

(51) Int. Cl.
  *H01L 29/78*   (2006.01)
  *G01R 19/00*   (2006.01)

(52) U.S. Cl.
  CPC ........ *H01L 29/7825* (2013.01); *G01R 19/0084* (2013.01)

(58) Field of Classification Search
  CPC ............ H01L 29/7825; H01L 27/0623; H01L 27/0705; H01L 27/088; G01R 19/0084; H03K 17/0822; H03K 17/6871
  See application file for complete search history.

(56) References Cited

U.S. PATENT DOCUMENTS

2011/0193541 A1*  8/2011  Nakahara ...................... 323/282
2011/0279152 A1*  11/2011  Nakahara ...................... 327/110

FOREIGN PATENT DOCUMENTS

| EP | 0 836 230 A2 | 4/1998 |
|---|---|---|
| JP | H 8-102649 A | 4/1996 |
| JP | H 10-116917 A | 5/1998 |
| JP | 2011-166518 A | 8/2011 |

* cited by examiner

*Primary Examiner* — Ermias Woldegeorgis
(74) *Attorney, Agent, or Firm* — McGinn IP Law Group, PLLC

(57) ABSTRACT

A semiconductor device includes an N-type semiconductor region, a back electrode, first and second P-type base regions, first and second $N^+$ diffusion layers, a gate insulating film, a gate electrode and a voltage detecting circuit. The first $N^+$ diffusion layer functions as a source of an output MOS transistor and functions as a source of a sense MOS transistor. The gate electrode is provided to oppose the N-type semiconductor region and the first and second P-type base regions through the gate insulating film 40. A load current flows between the back electrode and the first $N^+$ diffusion layer. The voltage detecting circuit generates a detection signal.

27 Claims, 40 Drawing Sheets

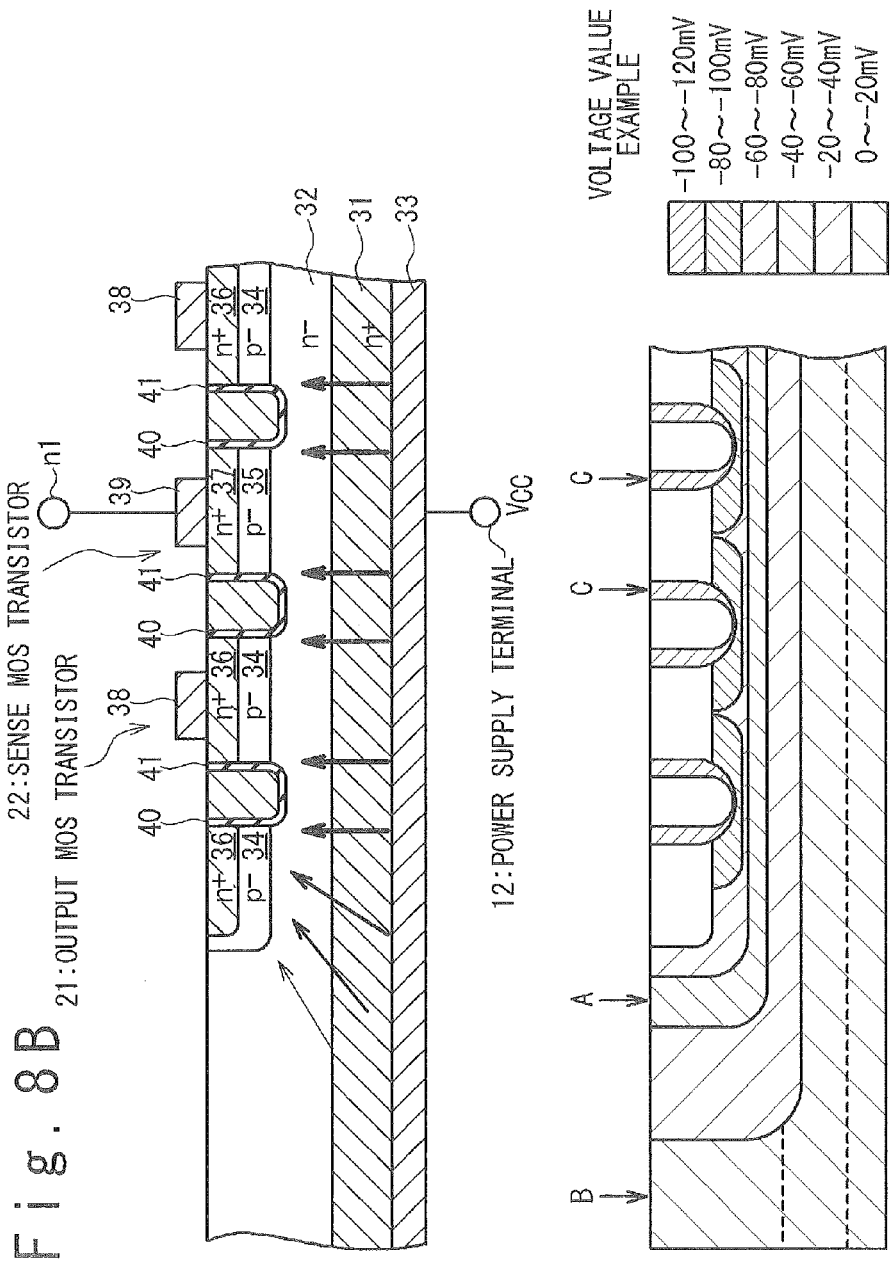

DETECTING AND DRIVING LOAD USING MOS TRANSISTOR

CROSS-REFERENCE

This application claims priorities on convention based on Japanese Patent Application Nos. JP 2013-144380 and JP 2014-074628. The disclosures thereof are incorporated herein by reference.

TECHNICAL FIELD

The present invention is related to a semiconductor device, and especially to a semiconductor device configured to drive a load by using a power transistor.

BACKGROUND ART

In a semiconductor device which drives a load by using a power transistor, there is a case where a detection function is implemented to detect the state of the load. As the detection of the state of the load, the detection of a load extraordinary state is exemplified (such as over-current, a light load state (a disconnected state of a part of the load), no load state (a fully disconnected state of the load), and the detection of the load current which flows through the load.

Various techniques are proposed to detect a load current precisely. For example, Patent Literature 1 (JP H10-116917A) discloses a technique of detecting the output current of a planar-type bipolar transistor. This Patent Literature discloses a structure that an electrode is provided in an exposed collector layer on the surface of a transistor chip to take out a voltage drop due to the resistance of a silicon substrate as a current detection signal.

Also, the current according to the output transistor provides a transistor for the flowing sense and Patent Literature 2 (JP 2011-166518A) discloses a technique that a current which flows through a sense transistor according to an output transistor is detected as a voltage drop due to a sense resistance.

Moreover, Patent Literature 3 (JP H08-102649A) discloses a technique that a current which flows through a sense MOS transistor according to a power MOS transistor used as an output transistor is detected by a current detecting circuit which is connected with a source of the sense MOS transistor. In the technique disclosed in the Patent Literature 3, a source-drain voltage of the power MOS transistor and a source-gate voltage of the sense MOS transistor are adjusted to be same by a voltage source connected between the source of the power MOS transistor and the minimum voltage point of the current detecting circuit.

CITATION LIST

[Patent Literature 1] JP H10-116917A
[Patent Literature 2] JP 2011-166518A
[Patent Literature 3] JP H08-102649A

SUMMARY OF THE INVENTION

However, according to the consideration by the inventor, in these prior arts, there are points to be improved in the detection precision of the state of the load.

Other problems and new features would be made clear from the description of Specification and the attached drawings.

In one embodiment, a semiconductor device includes a first semiconductor region of a first conductive type, a common drain electrode, second and third semiconductor regions of a second conductive type which is different from the first conductive type, first and second diffusion layers of the first conductive type, and a gate electrode. The common drain electrode is electrically connected with the first semiconductor region. The second semiconductor region is joined to the first semiconductor region and the first diffusion layer is formed in the second semiconductor region. The first diffusion layer functions as a source of a first transistor. The third semiconductor region is joined to the first semiconductor region and the second diffusion layer is formed in the third semiconductor region. The second diffusion layer functions as a source of a second transistor. The gate electrode is provided to oppose to the first semiconductor region, the second semiconductor region and the third semiconductor region through a gate insulating film. A load current flows between the common drain electrode and the first diffusion layer. The voltage of the second diffusion layer (that is, the source of the second transistor) is used for the detection of the load state.

In an example of the above embodiment, it is possible to improve the detection precision of the state of the load. In another example of the above embodiment, it is possible to improve the detection precision of the load current.

BRIEF DESCRIPTION OF THE DRAWINGS

FIG. 8B is a diagram showing current which flows inside the semiconductor device of the first embodiment and a voltage distribution inside the semiconductor device.

DESCRIPTION OF THE EMBODIMENTS

First Embodiment

Figure 1:
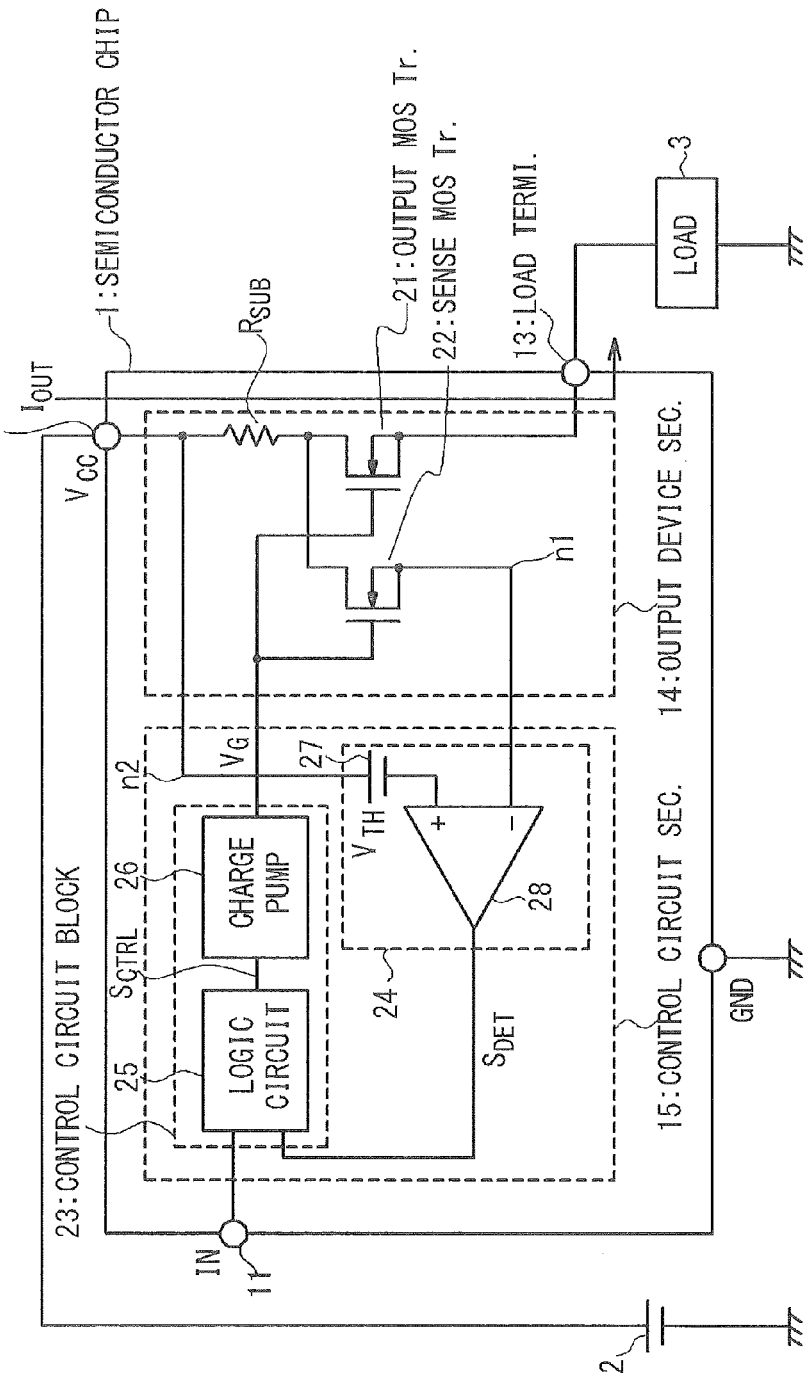
FIG. 1 is a diagram schematically showing a configuration of a semiconductor device according to a first embodiment.

FIG. 1 is a diagram schematically showing a configuration of a semiconductor device according to a first embodiment. As shown in FIG. 1, the semiconductor device in the first embodiment has a semiconductor chip 1 which functions as a high side driver IC (integrated circuit) disposed between a DC power supply 2 and a load 3. The semiconductor chip 1 receives supply of a power supply voltage $V_{CC}$ from the DC power supply 2 and has a function of switching the supply of the DC power supply voltage $V_{CC}$ to the load 3. For example, as the DC power supply 2, a battery is used.

The semiconductor chip 1 has a control input terminal 11, a power supply terminal 12, a load terminal 13, an output device section (SEC.) 14 and a control circuit section (SEC.) 15. That is, the control input terminal 11, the power supply terminal 12, the load terminal 13, the output device section 14 and the control circuit section 15 are integrated monolithically on the semiconductor chip 1. Here, the term "monolithically" means that they are integrated on the identical semiconductor chip. The control input terminal 11 is an external connection terminal which receives an external control signal IN from an external unit (e.g. CPU (central processing unit)). The power supply terminal 12 is an external connection terminal which is connected with the DC power supply 2, and receives the power supply voltage $V_{CC}$ supplied from the DC power supply 2. The load terminal 13 is a terminal which is connected with the load 3.

An output MOS transistor (Tr.) 21 and a sense MOS transistor (Tr.) 22 are integrated in the output device section 14 as power transistors for switching the supply of the power supply voltage $V_{CC}$ to the load 3. In the present embodiment, the output MOS transistor 21 and the sense MOS transistor 22 are both formed as NMOS transistors having a UMOS (U-groove MOS) structure. The output MOS transistor 21 and the sense MOS transistor 22 have drains connected in common (a common drain), and the common drain is connected with the power supply terminal 12. A source of the output MOS transistor 21 is connected with the load terminal 13 and a source of the sense MOS transistor 22 is connected with a node n1. The load current $I_{OUT}$ is supplied to the load 3 from the DC power supply 2 through the output MOS transistor 21.

Here, in FIG. 1, a symbol $R_{SUB}$ shows a substrate resistance. The substrate resistance $R_{SUB}$ can be expressed as a resistance in the common drain of the output MOS transistor 21 and the sense MOS transistor 22 in an equivalent circuit. Note that the output MOS transistor 21 and the sense MOS transistor 22 are shown as different devices in the equivalent circuit diagram of FIG. 1. However, the output MOS transistor 21 and the sense MOS transistor 22 are formed as a physically unitary body, to be mentioned later. The node n1 is connected with the source of the sense MOS transistor 22 and is used to detect a voltage drop due to the substrate resistance $R_{SUB}$, to be mentioned later.

The control circuit section 15 has a node n2 and has a control circuit block 23 and a voltage detecting circuit 24. As mentioned later, the node n2 is a node having a voltage corresponding to the voltage of a common drain electrode (an electrode connected with the common drain) of the output MOS transistor 21 and the sense MOS transistor 22. The take-out of a voltage to the node n2 will be described later in detail.

The control circuit block 23 has a logic circuit 25 and a charge pump 26. The logic circuit 25 generates a control signal $S_{CTRL}$ for controlling the charge pump 26 in response to the external control signal IN and a detection signal $S_{DET}$ outputted from the voltage detecting circuit 24. The control signal $S_{CTRL}$ supplied to the charge pump 26 is a signal to control the drive of the gates of the output MOS transistor 21 and the sense MOS transistor 22 by the charge pump 26. That is, the logic circuit 25 has a function of controlling the drive of the gates of the output MOS transistor 21 and the sense MOS transistor 22 by the charge pump 26 in response to the external control signal IN and the detection signal $S_{DET}$.

The charge pump 26 operates as a drive circuit for driving the gates of the output MOS transistor 21 and the sense MOS transistor 22 in response to the control signal $S_{CTRL}$ which is supplied from the logic circuit 25, and generates a gate voltage $V_G$ which should be supplied to the gates of the output MOS transistor 21 and the sense MOS transistor 22. The charge pump 26 is configured in such a manner that it can generate the gate voltage $V_G$ which is higher than the DC power supply voltage $V_{CC}$ (for example, the gate voltage $V_G$ of about twice of the DC power supply voltage $V_{CC}$). In the present embodiment, when the control signal $S_{CTRL}$ is in a high level, the charge pump 26 supplies the gate voltage $V_G$ of about twice of the DC power supply voltage $V_{CC}$ to the gates of the output MOS transistor 21 and the sense MOS transistor 22. When the control signal $S_{CTRL}$ is in a low level, it stops the drive of the gates of the output MOS transistor 21 and the sense MOS transistor 22.

The control circuit block 23 may contain circuits other than the logic circuit 25 and the charge pump 26, e.g. a short-circuit which connects the source and the gate in the output MOS transistor 21, and an abnormal detecting circuit and so on.

The voltage detecting circuit 24 is a circuit section which generates the detection signal $S_{DET}$ based on a voltage (a voltage difference) between the node n1 connected with the source of the sense MOS transistor 22 and the node n2. As described later in detail, the voltage between the node n1 and the node n2 corresponds to the current level of the load current $I_{OUT}$, and therefore, the voltage detecting circuit 24 has a function of detecting the current level of the load current $I_{OUT}$ as a voltage. The voltage detecting circuit 24 has a set threshold voltage generating section 27 and a comparator 28.

The set threshold voltage generating section 27 has a voltage source which generates a desired set threshold voltage $V_{TH}$. The set threshold voltage generating section 27 is connected with the node n2 on its higher voltage side and connected with the +input terminal (a non-inversion input) of the comparator 28 on its lower voltage side. That is, the +input terminal of the comparator 28 is set to a voltage which is lower than the voltage of the node n2 by the threshold voltage $V_{TH}$ through the operation of the set threshold voltage generating section 27.

The comparator 28 compares the voltage at the +input terminal and the voltage at the −input terminal (inversion input) to generate the detection signal $S_{DET}$ corresponding to the comparison result. In the present embodiment, the comparator 28 sets the detection signal $S_{DET}$ to the high level when the voltage at the +input terminal is higher than the voltage at the −input terminal, and sets the detection signal $S_{DET}$ to the low level in the other case. As a result, the detection signal $S_{DET}$ is in the high level when the voltage difference $\Delta V21$ (=Vn2−Vn1) between the voltage Vn1 at the node n1 and the voltage Vn2 at the node n2 is greater than the set threshold voltage $V_{TH}$, and is in the low level in the other case.

Figure 2A:
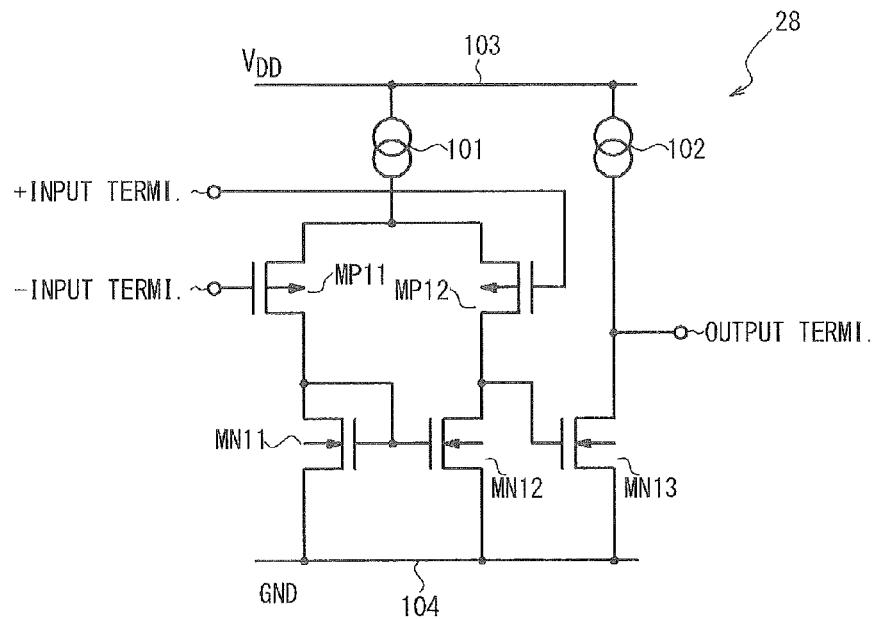
FIG. 2A is a diagram schematically showing an example of the configuration of a comparator.
Figure 2B:
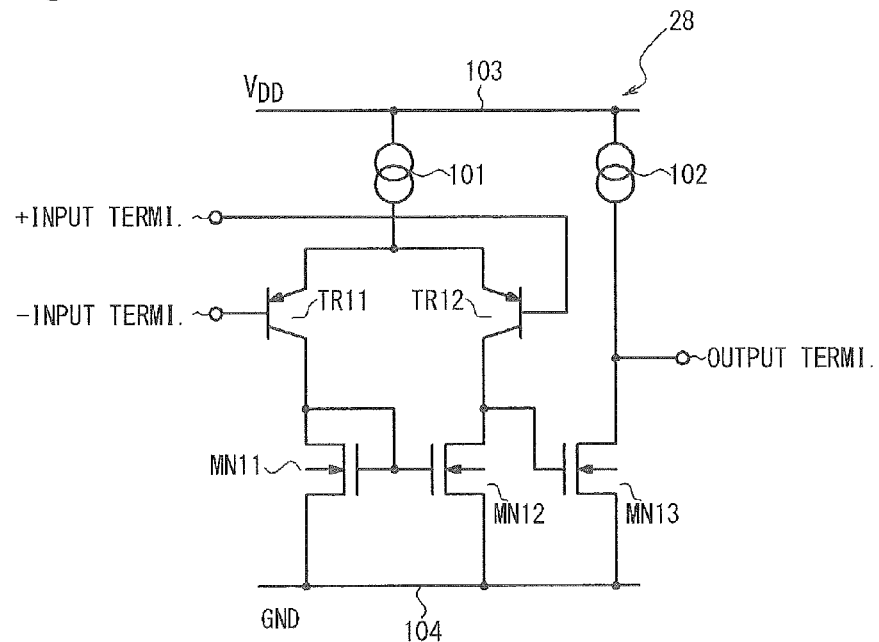
FIG. 2B is a diagram schematically showing another example of the configuration of the comparator.
Figure 2C:
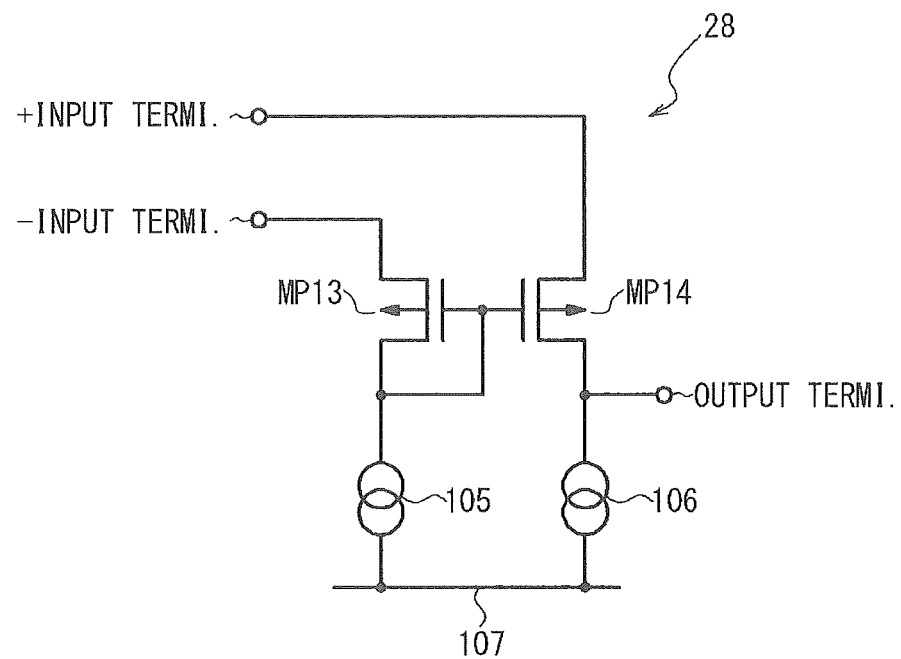
FIG. 2C is a diagram schematically showing another example of the configuration of the comparator.

FIG. 2A to FIG. 2C are diagrams schematically showing an example of the circuit configuration of the comparator 28.

In one example, the comparator 28 has a pair of MOS transistors as an input transistor pair. In this case, the gates of the MOS transistors may be used as the +input terminal and the −input terminal. FIG. 2A shows an example of the configuration of such a comparator 28.

In the configuration of FIG. 2A, the comparator 28 has PMOS transistors (P-channel MOS transistors) MP11 and MP12, and NMOS transistors (N-channel MOS transistors) MN11, MN12 and MN13 and constant current sources 101 and 102.

Sources of the PMOS transistors MP11 and MP12 are connected with one end of the constant current source 101 in common and gates thereof are respectively used as the −input terminal and the +input terminal in the comparator 28. The other end of the constant current source 101 is connected with a power supply line 103 to which the DC power supply voltage $V_{DD}$ is supplied. Here, the DC power supply voltage $V_{DD}$ is a voltage which is generated from the DC power supply voltage $V_{CC}$ supplied to the power supply terminal 12. The constant current source 101 supplies the constant current to an input transistor pair consisting of the PMOS transistors MP11 and MP12.

Drains of the NMOS transistors MN11 and MN12 are connected with the drains of the PMOS transistors MP11 and MP12, respectively, and the gates thereof are connected to the drain of the NMOS transistor MN11 in common and the sources thereof are connected to a power supply line 104 having a ground voltage GND, in common.

A drain of the NMOS transistor MN13 is connected with an output terminal of the comparator 28, a source thereof is connected with the power supply line 104, and a gate thereof is connected with the drain of the NMOS transistor MN12. The constant current source 102 is connected between the output terminal and the power supply line 103 and supplies a constant current to the NMOS transistor MN13.

In such a configuration, because the gates of the PMOS transistors MP11 and MP12 are used as the −input terminal and the +input terminal in the comparator 28, the input current is substantially zero.

Note that in FIG. 2A, the PMOS transistors MP11 and MP12 are used as the input transistor pair. However, the NMOS transistors may be used as the input transistor pair. In this case, the conductive type of each MOS transistor is reversed, and also the DC power supply voltage $V_{DD}$ is supplied to the power supply line 104 and the power supply line 103 is set to the ground voltage GND.

Also, as shown in FIG. 2B, instead of the PMOS transistors MP11 and MP12, PNP-type bipolar transistors TR11 and TR12 may be used. In this case, emitters of the bipolar transistors TR11 and TR12 are connected to the constant current source 101 in common and collectors thereof are connected with the drains of the NMOS transistors MN11 and MN12, respectively. Moreover, bases of the bipolar transistors TR11 and TR12 are used as the −input terminal and the +input terminal in the comparator 28, respectively.

In such a configuration, a minute input current flows through the comparator 28. Specifically, when the current supplied from the constant current source 101 to the bipolar transistors TR11 and TR12 is 5 •A and the DC amplification factors $h_{FE}$ of the bipolar transistors TR11 and TR12 are 50, the input current is 0.1 •A.

In FIG. 2B, the PNP-type bipolar transistors TR11 and TR12 are used as the input transistor pair. However, NPN-type bipolar transistors can be used as the input transistor pair. In this case, the conductive type of each transistor is reversed, and also the DC power supply voltage $V_{DD}$ is supplied to the power supply line 104, and the power supply line 103 is set to the ground voltage GND.

FIG. 2C shows an example of another configuration of the comparator 28. In the configuration of FIG. 2C, the comparator 28 has PMOS transistors MP13 and MP14 and constant current sources 105 and 106. Drains of the PMOS transistors MP13 and MP14 are connected with one ends of the constant current sources 105 and 106, respectively, and gates thereof are connected to the drain of PMOS transistor MP13 in common. The other ends of the constant current sources 105 and 106 are connected with a ground line 107 which has the ground voltage GND. Sources of the PMOS transistors MP13 and MP14 are used as the −input terminal and the +input terminal in the comparator 28, respectively, and the drain of the PMOS transistor MP14 is used as an output terminal.

Here, in any case of the circuit configurations of FIG. 2A to FIG. 2C, the detection signal $S_{DET}$ which is outputted from the comparator 28 depends on the voltages of the +input terminal and the −input terminal. However, note that the input current of the comparator 28 is kept at a constant value (except for the influence of undesired phenomena such as a change of the DC power supply voltage). In this meaning, the comparator 28 (or the voltage detecting circuit 24 having the set threshold voltage generating section 27 and the comparator 28) is a circuit which detects voltage.

Figure 3:
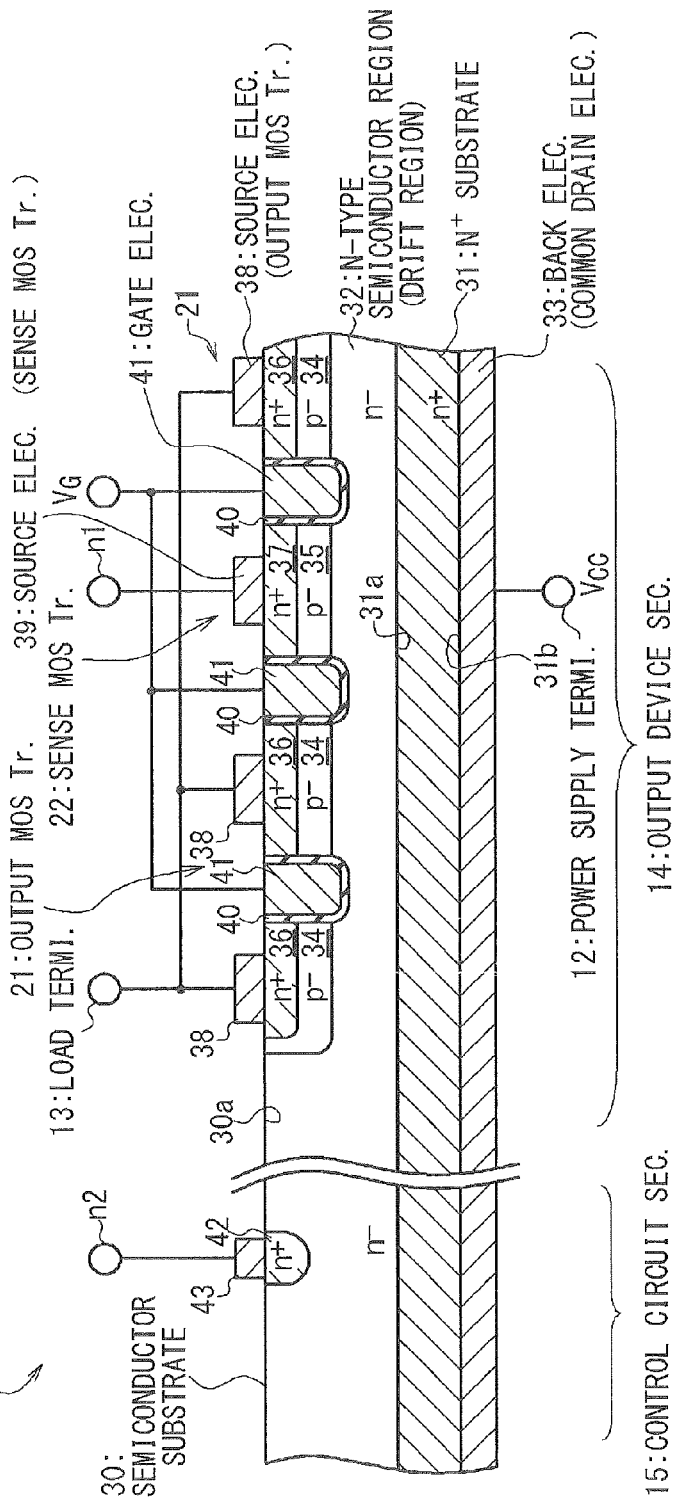
FIG. 3 is a sectional view showing the structure of an output device section and a control circuit section in the first embodiment.

FIG. 3 is a cross-sectional view showing a structure of the semiconductor chip 1 in which the circuit of FIG. 1 is integrated, especially, the structure of the output MOS transistor 21 and the sense MOS transistor 22. The semiconductor chip 1 has a semiconductor substrate 30. The semiconductor substrate 30 has an N+ substrate 31 and an N-type semiconductor region 32 formed on a front-side main surface 31a of the N+ substrate 31. The N+ substrate 31 is an N-type (impurity heavily doped) semiconductor substrate in which an N-type impurity is heavily doped (the semiconductor substrate of a first conductive type). That is, the N+ substrate 31 has a semiconductor region in which the N-type impurity is heavily doped (impurity for the first conductive type). Here, the phrase of "heavily doped" in this Specification means that the impurity is heavily doped to an extent that a degenerated semiconductor is formed. The N-type impurity has been doped in the N-type semiconductor region 32 to form an N-type semiconductor region (the semiconductor region of the first conductive type).

A back electrode 33 is formed on a back-side main surface of semiconductor substrate 30, i.e. the back-side main surface 31b of the N+ substrate 31, and this back electrode 33 is connected with the power supply terminal 12 to which the DC power supply voltage $V_{CC}$ is supplied. The N+ substrate 31 functions as a common drain of the output MOS transistor 21 and the sense MOS transistor 22 and the back electrode 33 functions as a common drain electrode electrically connected with the common drain.

The output MOS transistor 21 and the sense MOS transistor 22 are formed in the output device section 14. In detail, the semiconductor substrate 30 has P-type base regions (body regions) 34 and 35 which are formed in the N-type semiconductor region 32 in the output device section 14, and the N+ diffusion layers 36 and 37 are formed in the P-type base regions 34 and 35. The P-type base regions 34 and 35 are semiconductor regions into which the P-type impurity (a second conductive type of impurity) is doped (that is, the semiconductor regions of the second conductive type). Also, the N+ diffusion layers 36 and 37 are semiconductor regions in which the N-type of impurity is heavily doped. The P-type base region 34 is a region where a channel of the output MOS transistor 21 is formed and the P-type base region 35 is a region where a channel of the sense MOS transistor 22 is formed. Also, the N+ diffusion layer 36 functions as a source of the output MOS transistor 21 and the N+ diffusion layer 37 functions as a source of the sense MOS transistor 22. The N+ diffusion layers 36 and 37 are provided to be contact with the front-side main surface 30a of the semiconductor substrate 30.

Moreover, a source electrode 38 is formed to be joined with the N+ diffusion layer 36, and a source electrode 39 is formed to be joined with the N+ diffusion layer 37. That is, the source electrode 38 is electrically connected with the source of the output MOS transistor 21, and the source electrode 39 is electrically connected with the source of the sense MOS transistor 22. The source electrode 38 is connected with the load terminal 13 and the source electrode 39 is connected with the node n1. As mentioning above, note that the node n1 is connected with one of the input terminals of the comparator 28 (−input terminal) for a voltage detection.

For example, in the manufacturing process of the semiconductor chip of the present embodiment, the N-type semiconductor region 32, the P-type base regions 34 and 35 and the N+ diffusion layers 36 and 37 can be formed as follows. The N-type semiconductor layer is epitaxially grown on the front-side main surface 31a of the N+ substrate 31 as an N-type epitaxial layer. The P-type base regions 34 and 35 are formed by implanting P-type impurity into the surface section of the N-type epitaxial layer and the N+ diffusion layers 36 and 37 are formed by implanting the N-type impurity into the surface section of the P-type base regions 34 and 35. A region of the N-type epitaxial layer where the P-type base regions 34 and 35 and the N+ diffusion layers 36 and 37 are not formed is used as the N-type semiconductor region 32.

Moreover, trenches (ditches) are formed in the semiconductor substrate 30 to pass through regions between the P-type base regions 34 and 35 to the N-type semiconductor region 32, and a gate insulating film 40 is formed to cover the side surface and the base surface of each trench. Moreover, a gate electrode 41 is formed on the gate insulating film 40 to embed the trench.

The gate electrodes 41 is formed to oppose to the P-type base region 34 or 35 through the gate insulating film 40 in the side surface and to oppose to the N-type semiconductor region 32 through the gate insulating film 40 in the base surface. When a positive voltage which exceeds the threshold voltages of the output MOS transistor 21 and the sense MOS transistor 22 is applied to the gate electrode 41, an inversion layer is formed on the surface of the P-type base region 34 or 35 which opposes to the gate electrode 41, and an accumulation layer is formed on the surface of the N-type semiconductor region 32 which opposes to the gate electrode 41. The inversion layer which is formed on the surface of the P-type base region 34 opposing to the gate electrode 41 is used as a channel of the output MOS transistor 21. The inversion layer which is formed on the surface of the P-type base region 35 opposing to the gate electrode 41 is used as a channel of the sense MOS transistor 22.

In the configuration of FIG. 3, the plurality of gate electrodes 41 are formed and the plurality of gate electrodes 41 are electrically connected. The gate electrodes 41 are used as the common gate of the output MOS transistor 21 and the sense MOS transistor 22. The gate voltage $V_G$ is supplied to the gate electrode 41 from the charge pump 26. Note that the gate electrodes 41 may be physically formed as one conductor. For example, the gate electrodes 41 may be formed like meshes in case of plane layout.

On the other hand, in the control circuit section 15, circuit devices (specifically, devices such as an NMOS transistor, a PMOS transistor, and a capacitor) (not illustrated) are formed in the surface section (that is, a surface section of the N-type semiconductor region 32) of the semiconductor substrate 30. Each of the control circuit block 23 and the voltage detecting circuit 24 is formed by using those circuit devices.

In addition, a configuration to take out the voltage of the common drain electrode of the output MOS transistor 21 and the sense MOS transistor 22, i.e. the voltage of the back electrode 33 is provided for the control circuit section 15. In detail, an $N^+$ diffusion layer 42 is formed in the surface section of the N-type semiconductor region 32, and a voltage taking-out electrode 43 is formed on the $N^+$ diffusion layer 42. The N-type impurity is heavily doped into the $N^+$ diffusion layer 42. The voltage taking-out electrode 43 is connected with the node n2. As mentioned above, the node n2 is a node which is connected with the terminal on the higher voltage side of the set threshold voltage generating section 27.

Figure 4:
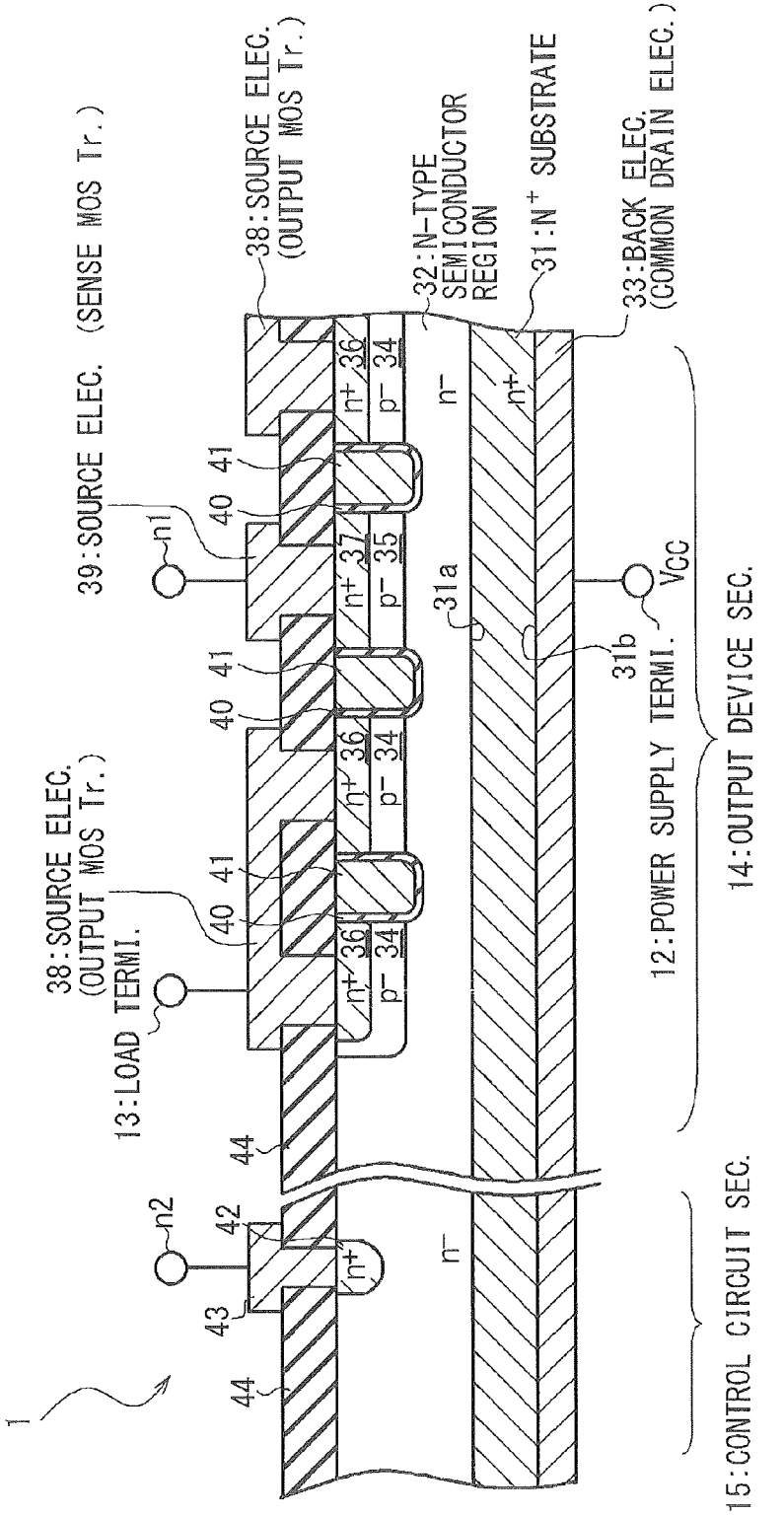
FIG. 4 is a sectional view showing the structure of the output device section and the control circuit section in the first embodiment.

Note that FIG. 3 shows the plurality of the source electrodes 38 which are formed and electrically connected to each other. However, the source electrode 38 may be physically formed as one unit. FIG. 4 is a sectional view showing the structure of the semiconductor chip 1 when the source electrode 38 is formed physically as one unit. An interlayer insulating film 44 is formed to cover the front-side main surface 30a of the semiconductor substrate 30, and openings are formed to pass through the interlayer insulating film 44 to the $N^+$ diffusion layer 36. The source electrode 38 is connected with the $N^+$ diffusion layer 36 through the opening. Also, an opening is formed to pass through the interlayer insulating film 44 to the $N^+$ diffusion layer 37, and the source electrode 39 is connected with the $N^+$ diffusion layer 37 through the opening. Moreover, an opening is formed to pass through the interlayer insulating film 44 to the $N^+$ diffusion layer 42, and the voltage taking-out electrode 43 is connected with the $N^+$ diffusion layer 42 through the opening. Note that the source electrodes 38 on the right side and the source electrode 38 on the left side are separated from each other in FIG. 4. However, actually, they are connected a position other than the section shown in FIG. 4 (hereinafter, refer to FIG. 5).

Figure 5:
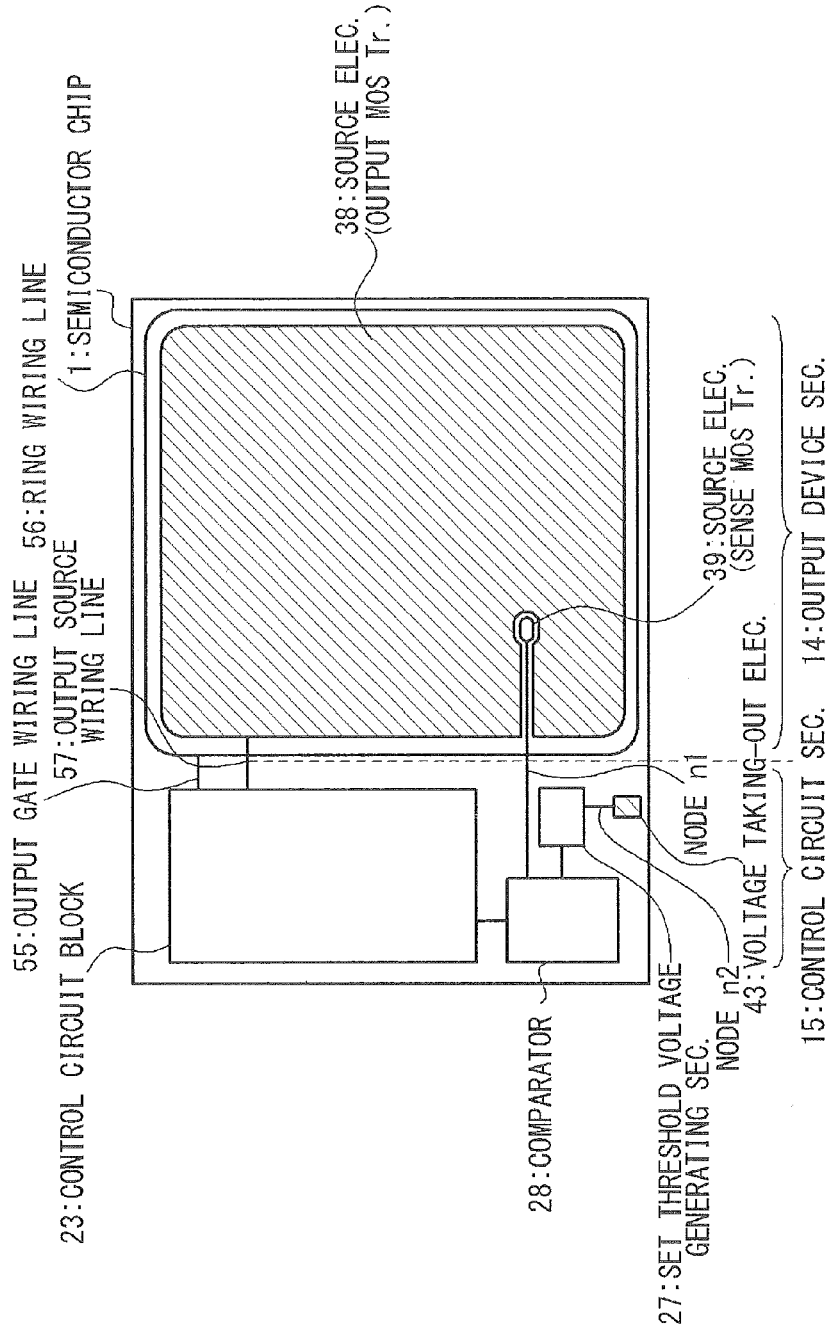
FIG. 5 is a plan view showing the structure of the semiconductor device in the first embodiment.

FIG. 5 is a diagram showing an example of the planar layout of the semiconductor chip 1. For the purpose of the increase of driving ability, an almost part of the output device section 14 is occupied by the output MOS transistor 21. In detail, the source electrode 38 of the output MOS transistor 21 is formed on the almost part of the output device section 14 and a minute notch section is provided in the source electrode 38. The source electrode 39 of the sense MOS transistor 22 is provided in the notch section. The source electrode 39 is connected with the −input terminal of the comparator 28 by the node n1. A ring wiring line 56 is provide-d in the peripheral section of the output device section 14 to surround the source electrode 38, and the gate electrode 41 of the output MOS transistor 21 is connected with the ring wiring line 56 (the gate electrode 41 is not shown in FIG. 5). The output of the charge pump 26 of the control circuit block 23 is connected with the ring wiring line 56 through an output gate wiring line 55. Also, the source electrode 38 is connected with the control circuit block 23 through an output source wiring line 57.

On the other hand, the above-mentioned voltage taking-out electrode 43 is provided for the control circuit section 15, and the voltage taking-out electrode 43 is connected with the terminal of the set threshold voltage generating section 27 on the higher voltage side by the node n2. The terminal of the set threshold voltage generating section 27 on the lower voltage side is connected with the +input terminal of the comparator 28.

Next, the operation of the semiconductor device in the present embodiment will be described.

Referring to FIG. 1, the external control signal IN is supposed to have been set to the low level in the initial state. In this case, the control signal $S_{CTRL}$ is set to the low level by the logic circuit 25, and the charge pump 26 does not drive the gate electrodes 41 of the output MOS transistor 21 and the sense MOS transistor 22. Therefore, the output MOS transistor 21 and the sense MOS transistor 22 are both turned off so that the load current $I_{OUT}$ does not flow.

When the external control signal IN is set to the high level, the logic circuit 25 sets the control signal $S_{CTRL}$ to the high level. When the control signal $S_{CTRL}$ is set to the high level, the charge pump 26 supplies the gate voltage $V_G$ which is higher than the DC power supply voltage $V_{CC}$ (for example, about twice of the DC power supply voltage $V_{CC}$) to the gate electrodes 41 of the output MOS transistor 21 and the sense MOS transistor 22 to set the output MOS transistor 21 and the sense MOS transistor 22 to an ON state.

Figure 6:
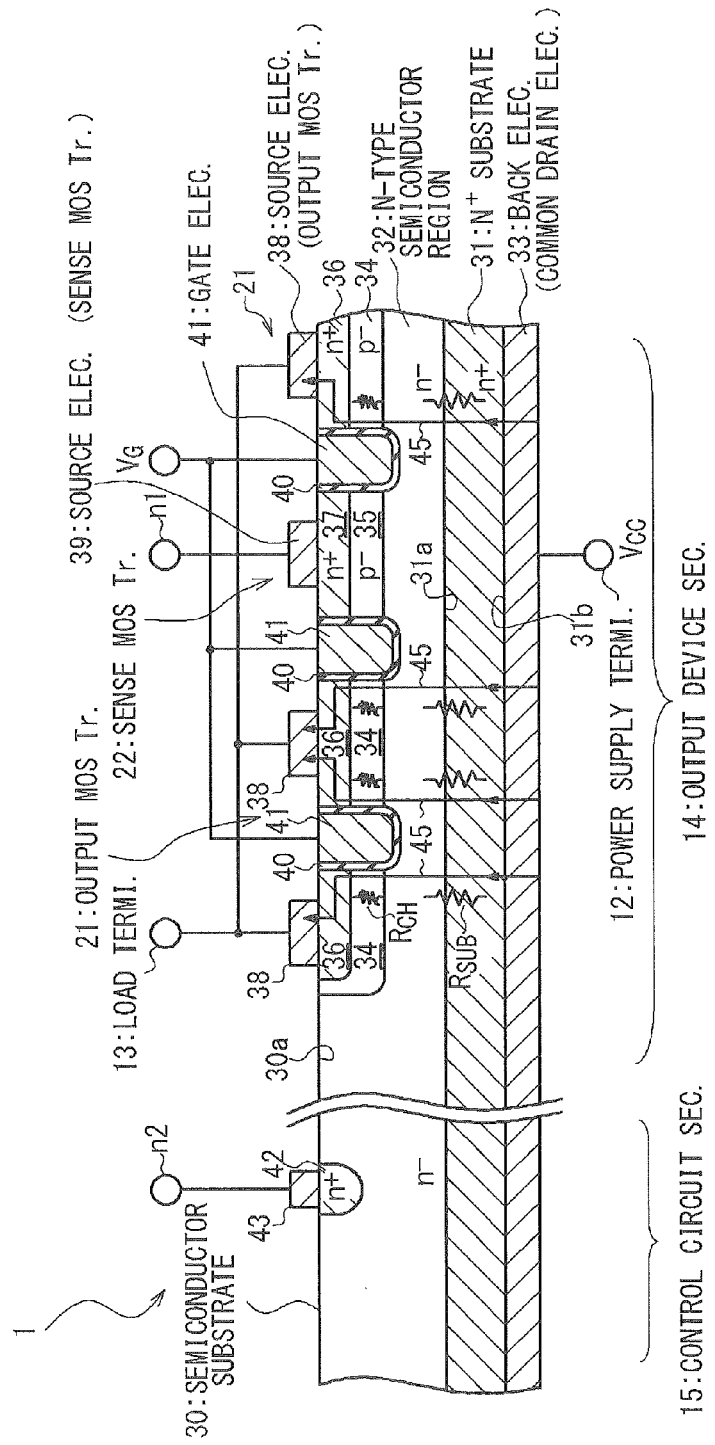
FIG. 6 is a conceptual diagram showing a current path when a load current flows through an output MOS transistor, in the first embodiment.

When the output MOS transistor 21 is set to the ON state, the load current $I_{OUT}$ is supplied to the load 3 connected with the load terminal 13 from the DC power supply 2 connected with the power supply terminal 12 through the output MOS transistor 21. FIG. 6 is a conceptual diagram showing the current path through which the load current $I_{OUT}$ flows in the output MOS transistor 21. In FIG. 6, the path through which the load current $I_{OUT}$ flows is shown by an arrow 45.

The load current $I_{OUT}$ flows in a perpendicular direction to the $N^+$ substrate 31 and the N-type semiconductor region 32 (a direction perpendicular to the front-side main surface 31a of the $N^+$ substrate 31), and moreover, flows into the $N^+$ diffusion layer 36 through the channel which is formed in the neighborhood of the surface opposing to the gate electrode 41 of the P-type base region 34. Moreover, the load current $I_{OUT}$ having flowed into the $N^+$ diffusion layer 36 flows into the load terminal 13 through the source electrode 38 from the $N^+$ diffusion layer 36, and is supplied to the load 3 connected with the load terminal 13.

When the load current $I_{OUT}$ flows through the output MOS transistor 21, a voltage drop due to a channel resistance $R_{CH}$ and the substrate resistance $R_{SUB}$ is generated. Here, the channel resistance $R_{CH}$ is a resistance of a channel which is formed in the P-type base region 34 and the substrate resistance $R_{SUB}$ is a resistance of the $N^+$ substrate 31 and the N-type semiconductor region 32 in the perpendicular direction to them. Because the resistances of the back electrode 33, the $N^+$ diffusion layer 36 and the source electrode 38 can be ignored to be small as compared with the channel resistance $R_{CH}$ and the substrate resistance $R_{SUB}$, they are not considered in case of the following consideration.

What the inventor paid attention to is the fact that the channel resistance $R_{CH}$ depends on the voltage between the source and the gate in the output MOS transistor 21, whereas, the substrate resistance $R_{SUB}$ is a known fixed value which depends only on the characteristics of the $N^+$ substrate 31 and the N-type semiconductor region 32. Based on these facts, the inventor reached the conclusion that the load current $I_{OUT}$ can be measured precisely, if the voltage drop due to the substrate resistance $R_{SUB}$ can be measured precisely when the load current $I_{OUT}$ flows. As an example, the substrate resistance $R_{SUB}$ can restrain a deviation (a manufacturing deviation) in a range of about ±3%. This means that a measurement error of the load current $I_{OUT}$ due to the deviation of the substrate resistance $R_{SUB}$ can be restrained in a range of about ±3% when the load current $I_{OUT}$ is calculated from the voltage drop $\Delta V_{SUB}$ due to the substrate resistance $R_{SUB}$.

Here, it could be considered that the voltage drop due to the substrate resistance $R_{SUB}$ is equal to a voltage difference between a voltage at the boundary between the N-type semiconductor region 32 and the P-type base region 34 and a voltage of the back electrode 33. However, because the boundary between the N-type semiconductor region 32 and the P-type base region 34 is inside the semiconductor chip 1, the voltage at the boundary between the N-type semiconductor region 32 and the P-type base region 34 cannot be measured directly. Therefore, it is required to measure the voltage at the boundary between the N-type semiconductor region 32 and the P-type base region 34 precisely through an indirect technique.

One utility of the structure of the semiconductor chip 1 in the present embodiment shown in FIG. 3 is in a point that the node n1 generates a voltage substantially identical with the voltage at the boundary between the N-type semiconductor region 32 and the P-type base region 34. This means that the voltage drop due to the substrate resistance $R_{SUB}$ can be measured precisely by measuring the voltage difference between the node n1 and the back electrode 33. Below, the utility of the node n1 will be considered. Note that in the present embodiment, the voltage of the node n2 corresponding to the voltage of the back electrode 33 is used instead of the voltage of the back electrode 33, to be described later in detail. However, this does not have any relation to consideration of the utility of the node n1.

Figure 7:
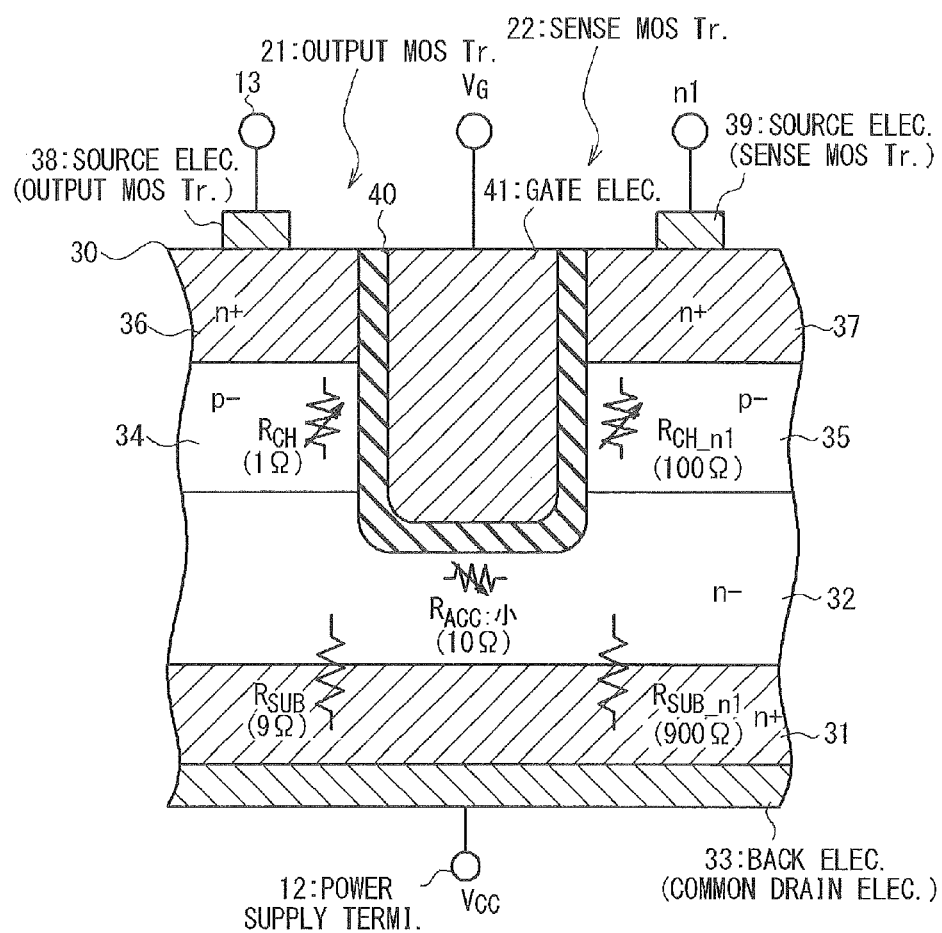
FIG. 7 is an expanded view showing a sectional structure of the output MOS transistor and a sense MOS transistor.

FIG. 7 is an expanded view showing the structure of the neighborhood of the gate electrode 41 of the output MOS transistor 21 and the sense MOS transistor 22. As mentioned above, in the structure of the semiconductor chip 1 in the present embodiment, the P-type base region 35 and the N⁺ diffusion layer 37 are provided to have a similar structure, as well as the P-type base region 34 and the N⁺ diffusion layer 36 which configure the output MOS transistor 21. The source electrode 39 of the sense MOS transistor 22 and the node n1 are connected with the N⁺ diffusion layer 37.

When the gate electrode 41 is driven with a high voltage (for example, a voltage of about twice of the DC power supply voltage $V_{CC}$), an inversion layer (that is, the channel of the output MOS transistor 21) is formed in a portion of the P-type base region 34 which opposes to the gate electrode 41 and a current flows from the back electrode 33 to the source electrode 38. In FIG. 7, the resistance of the inversion layer (i.e. the channel) formed in the P-type base region 34 is expressed as the channel resistance $R_{CH}$.

At this time, at the same time, an inversion layer (that is, a channel of the sense MOS transistor 22) is formed in a portion of the P-type base region 35 which opposes to the gate electrode 41. Moreover, an accumulation layer is formed in a portion of the N-type semiconductor region 32 which opposes to the gate electrode 41. In FIG. 7, the resistance of the inversion layer formed in the P-type base region 35 is expressed as a channel resistance $R_{CH\_n1}$, and the resistance due to an accumulation layer formed in the N-type semiconductor region 32 is expressed as an accumulation layer resistance $R_{ACC}$. The channel resistance $R_{CH\_n1}$ and the accumulation layer resistance $R_{ACC}$ are both variable resistances which depend on a gate voltage $V_G$, and the substrate resistance $R_{SUB}$ and $R_{SUB\_n1}$ are fixed resistances which do not depend on the gate voltage $V_G$.

Figure 8A:
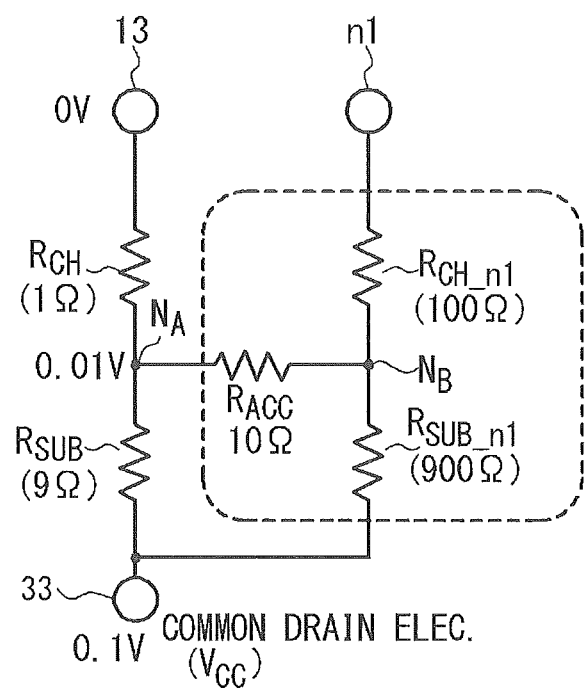
FIG. 8A is a diagram schematically showing an equivalent circuit of the electrical connection between a load terminal, a node n1 and a back electrode 33.

FIG. 8 is a circuit diagram schematically showing an equivalent circuit of electrical connection among the source electrodes 38 of the output MOS transistor 21, the back electrode 33 (common drain electrode) and the node n1, when the gate electrode 41 is driven with the high voltage. In the equivalent circuit, a series connection of the channel resistance $R_{CH}$ and the substrate resistance $R_{SUB}$ is connected between the back electrode 33 and the source electrode 38 and a series connection of the channel resistance $R_{CH\_n1}$ and the substrate resistance $R_{SUB\_n1}$ is connected between the back electrode 33 and the node n1. Moreover, the accumulation layer resistance $R_{ACC}$ is connected between a connection node $N_A$ between the channel resistance $R_{CH}$ and the substrate resistance $R_{SUB}$ and a connection node $N_B$ between the channel resistance $R_{CH\_n1}$ and the substrate resistance $R_{SUB\_n1}$.

Here, in FIG. 8, the voltage in the connection node $N_A$ is equivalent to the voltage at the boundary between the N-type semiconductor region 32 and the P-type base region 34. The fact that the voltage difference between connection node $N_A$ and the node n1 is small will be considered.

Here, the attention should be paid to the fact that a region of the sense MOS transistor 22 is considerably small, as compared with a region of the output MOS transistor 21. Therefore, it is assumed in the following consideration that the channel resistance $R_{CH\_n1}$ of the sense MOS transistor 22 is considerably greater than the channel resistance $R_{CH}$ of the output MOS transistor 21 and the substrate resistance $R_{SUB\_n1}$ of the sense MOS transistor 22 is considerably greater than the substrate resistance $R_{SUB}$ of the output MOS transistor 21. Specifically, in the following consideration, assuming that an area ratio of the output MOS transistor 21 and the sense MOS transistor 22 is 100:1, the voltage of the connection node $N_A$ and the voltage of the node n1 are calculated by using the following numerical value example:

the channel resistance $R_{CH}$ of the output MOS transistor 21: 1 •;

the substrate resistance $R_{SUB}$ of the output MOS transistor 21: 9 •;

the channel resistance $R_{CH\_n1}$ of the sense MOS transistor 22: 100 •;

the substrate resistance $R_{SUB\_n1}$ of the sense MOS transistor 22: 900 •; and the accumulation layer resistance $R_{ACC}$: 10 •.

Also, it is supposed that the voltage between the back electrode 33 (the common drain electrode) and the source electrode 38 is 0.1V (100 mV), when the voltage of the source electrode 38 of the output MOS transistor 21 is a reference voltage (0V). This is a proper value as the voltage between the source and the drain when the MOS transistor of a UMOS structure is in an ON state.

Considering a case where the current flowing through the node n1 is zero, the voltage of connection node $N_A$ is calculated as 0.010 V (10 mV) from the equivalent circuit of FIG. 8. On the other hand, the voltage of the node n1 is coincident with the voltage of the connection node $N_B$ and is calculated to be 0.0111 V. In other words, the voltage difference between the connection node $N_A$ and the node n1 is suppressed to about 1.1 mV. It should be noted that if a comparator with the configuration of the input current of substantively zero is used, the current flowing through the node n1 can be substantively made zero, as shown in FIG. 2A.

On the other hand, in case where the current flows through the node n1, because the input current of the comparator 28 can be suppressed to several •A when the comparator with general configuration is adopted to the comparator 28 (e.g.

the configuration shown in FIG. 2B-FIG. 2C is adopted), the voltage drop due to the channel resistance $R_{CH\_n1}$ of the sense MOS transistor 22 is less than 1 mV and the voltage difference between the connection node NA and the node n1 is still very small.

As understood from the above consideration, the voltage difference between the connection node $N_A$ and the node n1, i.e. the voltage difference between the boundary between the N-type semiconductor region 32 and the P-type base region 34 and the node n1 is very small. Accordingly, the voltage drop due to the substrate resistance $R_{SUB}$ can be precisely measured by using the voltage of the node n1.

Another utility of the structure of the semiconductor chip 1 in the present embodiment shown in FIG. 3 is in that the voltage corresponding to the voltage of the back electrode 33 (that is, the common drain electrode of the output MOS transistor 21 and the sense MOS transistor 22) can be taken out to the node n2. As understood from the above-mentioned consideration, the voltage drop due to the substrate resistance $R_{SUB}$ of the output MOS transistor 21 is substantially coincident with the voltage difference between the node n1 and the back electrode 33. However, because circuits of the control circuit section 15, especially the set threshold voltage generating section 27 and the comparator 28 of the voltage detecting circuit 24 are formed on the front-side main surface 30a of the semiconductor substrate 30, it is very difficult to directly connect the back electrode 33 with the voltage detecting circuit 24 in mounting.

To cope with such a problem, in the present embodiment, the N$^+$ diffusion layer 42 is provided for the N-type semiconductor region 32, and a voltage taking-out electrode 43 is connected to the N$^+$ diffusion layer 42. The voltage taking-out electrode 43 is connected with the above-mentioned node n2. According to such a configuration, the voltage of the voltage taking-out electrode 43 is almost coincident with the voltage of the back electrode 33 (that is, the voltage of the power supply terminal 12). Strictly speaking, when the current flows between the voltage taking-out electrode 43 and the back electrode 33, the voltage of the voltage taking-out electrode 43 is different from the voltage of the back electrode 33. However, it is possible to suppress the current flowing between the voltage taking-out electrode 43 and the back electrode 33 to a small value by sufficiently increasing the input resistance of the set threshold voltage generating section 27 viewed from the node n2, and the voltage of the node n2 can be brought close to the voltage of the back electrode 33.

In the present embodiment, the voltage of the node n1 and the voltage of the node n2 which have the nature as mentioned above are used as the inputs of the voltage detecting circuit 24. In other words, the voltage which is equivalent to the voltage drop due to the substrate resistance $R_{SUB}$ is supplied to the voltage detecting circuit 24 as the voltage between the node n1 and the node n2. Because the voltage drop due to the substrate resistance $R_{SUB}$ is shown by a product $I_{OUT} \cdot R_{SUB}$ of the load current $I_{OUT}$ and the substrate resistance $R_{SUB}$, it is possible to precisely detect the load current $I_{OUT}$ by detecting the voltage between the node n1 and the node n2 by the voltage detecting circuit 24.

The voltage detecting circuit 24 outputs a detection signal $S_{DET}$ according to the voltage between the node n1 and the node n2 (that is, according to the load current $I_{OUT}$), as described below. When the load current $I_{OUT}$ is small (in a normal range), and the voltage difference $\Delta V21$ (=Vn2−Vn1 • $I_{OUT} \cdot R_{SUB}$) between the voltage Vn1 at the node n1 and the voltage Vn2 at the node n2 is lower than the set threshold voltage $V_{TH}$, the voltage of the −input terminal becomes higher than the voltage of the +input terminal in the comparator 28 so that the detection signal $S_{DET}$ outputted from the comparator 28 becomes a low level. On the other hand, when the load current $I_{OUT}$ is great and the voltage difference $\Delta V21$ between the node n1 and the node n2 is higher than the set threshold voltage $V_{TH}$, the voltage of the −input terminal becomes lower than the voltage of the +input terminal in the comparator 28 so that the detection signal $S_{DET}$ outputted from the comparator 28 becomes a high level. According to such an operation, by setting the set threshold voltage $V_{TH}$ to meet the following equation (1)

$$V_{TH} = I_{OUT}^* \cdot R_{SUB} \qquad (1)$$

according to the set value $I_{OUT}^*$ of the load current $I_{OUT}$ to be detected, it is possible to detect that the load current $I_{OUT}$ is greater than the specific set value $I_{OUT}^*$ or is smaller than it.

The detection signal $S_{DET}$ outputted from the comparator 28 is supplied to the logic circuit 25, and the logic circuit 25 can realize a function of monitoring the load current $I_{OUT}$ by referring to the detection signal $S_{DET}$. For example, it is possible to provide for the logic circuit 25, a function of detecting over-current, i.e. a function of detecting the load current $I_{OUT}$ exceeding the set value $I_{OUT}^*$ and turning off the output MOS transistor 21. In detail, in order to realize the function of detecting the over-current, when the detection signal $S_{DET}$ outputted from the comparator 28 is in the high level, a logic is incorporated into the logic circuit 25 such that the control signal $S_{CTRL}$ which controls the turning-on or -off of the output MOS transistor 21 is set to the low level regardless of the external control signal IN.

On the other hand, a function of detecting a light load (for example, part of the plurality of loads is broken) and no load (for example, an open circuit failure of the load terminal 13), i.e. a function of detecting that the load current $I_{OUT}$ is smaller than the set value $I_{OUT}^*$ may be provided for the logic circuit 25. In this case, in the embodiment, the logic circuit 25 may be incorporated with the logic of determining that the load current $I_{OUT}$ fell below the set value $I_{OUT}^*$, in response to the detection signal $S_{DET}$ in the low level outputted from the comparator 28 and outputting an error signal to a specific external terminal (e.g. a diagnosis terminal).

Figure 9:
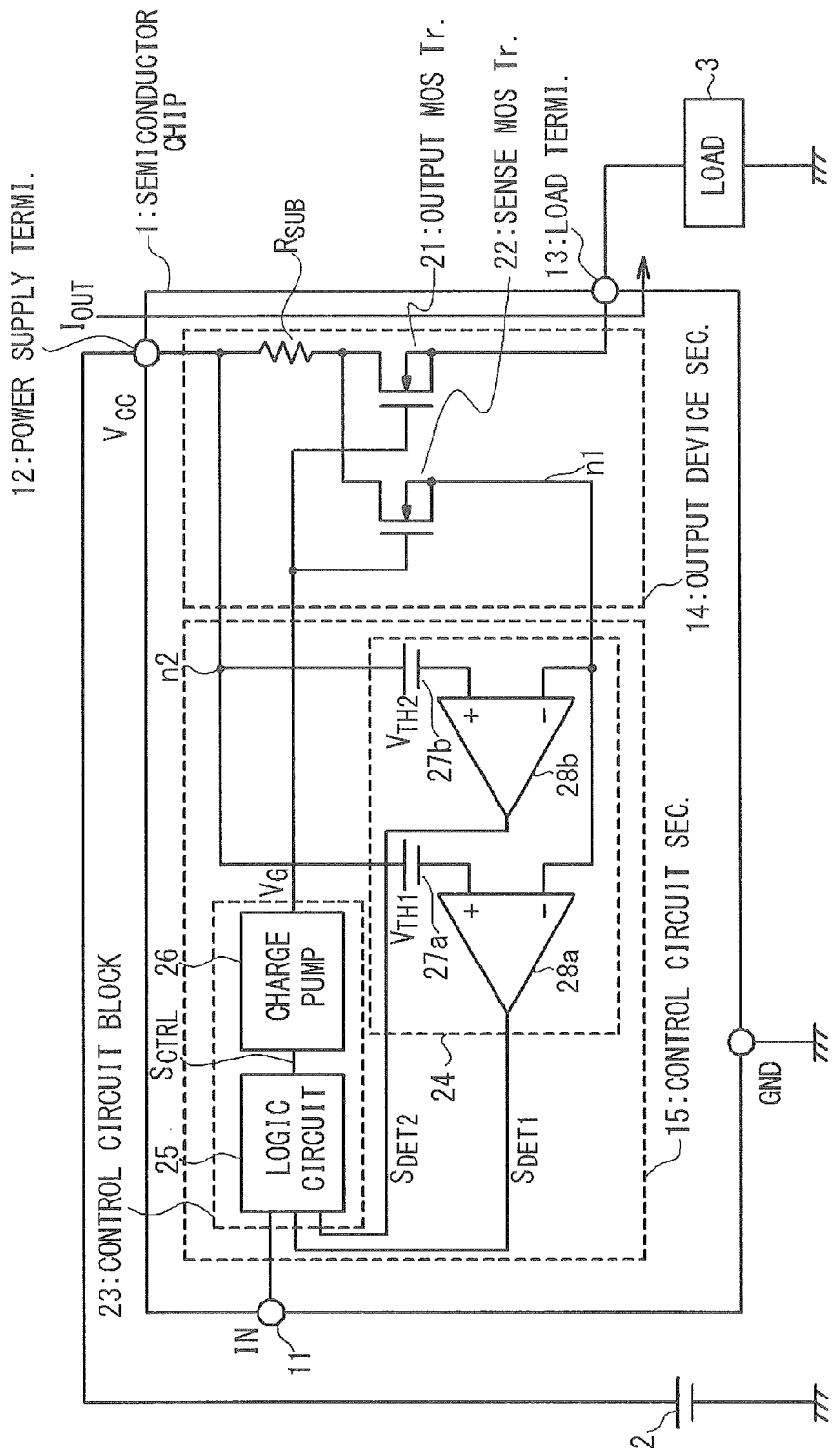
FIG. 9 is a diagram schematically showing a modification example of the configuration of the semiconductor device in the first embodiment.

When incorporating two of the function of detecting the over-current, the function of detecting the light load, and the function of detecting of no load into the semiconductor chip 1, it is sufficient to provide two sets of the set threshold voltage generating section 27 and two the comparators 28. A configuration example of the semiconductor chip 1 in this case is shown in FIG. 9. In the semiconductor chip 1 of FIG. 9, the voltage detecting circuit 24 has two comparators 28a and 28b, and two set threshold voltage generating sections 27a and 27b. The set threshold voltage generating sections 27a and 27b have respective voltage sources which generate desired set threshold voltages $V_{TH1}$ and $V_{TH2}$. The terminals of the set threshold voltage generating sections 27a and 27b on the higher voltage side are connected to the node n2 in common, and the terminals thereof on the lower voltage side are respectively connected with the +input terminals (non-inversion inputs) of the comparators 28a and 28b. That is, the +input terminals of the comparators 28a and 28b are respectively set to the voltages lower by the voltages $V_{TH1}$ and $V_{TH2}$ than the voltage at the node n2.

The comparator 28a compares the voltage of the +input terminal and the voltage of the −input terminal (inversion input) and generates a detection signal $S_{DET1}$ corresponding to the comparison result. In the same way, the comparator 28b compares the voltage of the +input terminal and the voltage of the −input terminal (inversion input) and generates a detection signal $S_{DET2}$ corresponding to the comparison result. The detection signals $S_{DET1}$ and $S_{DET2}$ generated by the comparators 28a and 28b are supplied to the logic circuit 25 and are used for realization of two of the functions of the detection of the over-current, the detection of the light load and the detection of no load.

In the same way, when three functions of the detection of the over-current, the detection of the light load and the detection of no the load are incorporated into the semiconductor chip 1, it is sufficient to provide three sets of the set threshold voltage generating section 27 and the comparator 28 (not shown).

As described above, the semiconductor device of the present embodiment can detect the load current $I_{OUT}$ in a high precision. There are two factors of the improvement of the detection precision of the load current $I_{OUT}$.

A first factor of the improvement of the detection precision of the load current $I_{OUT}$ is in that the load current $I_{OUT}$ is detected based on the voltage drop due to the substrate resistance $R_{SUB}$. A deviation of the substrate resistance $R_{SUB}$ can be restrained to about ±3% in absolute precision, as an example. Therefore, the detection precision of the load current $I_{OUT}$ can be improved to a high precision by detecting the load current $I_{OUT}$ from the voltage drop due to the substrate resistance $R_{SUB}$. Indicating a more specific calculation example, when the set threshold voltage $V_{TH}$ is 100 mV and the deviation of ±3 mV exists in the input offset voltage of the comparator 28, the detection error of ±3% in the substrate resistance $R_{SUB}$ and the detection error of the deviation of ±3% in the input offset voltage are generated. That is, the detection error of about ±6% in the load current can be obtained in this calculation example in the worst case.

In the Patent Literature 2, a sense current which is proportional to a load current is generated by a sense MOS transistor, and a detection voltage is generated by the sense current flowing through a sense resistance which is formed from a metal wiring line. Because the absolute value of a resistance value is very small in the metal wiring although a deviation of the resistance value is suppressed to a small value, the absolute value of the detection voltage is very small. In other words, the set threshold voltage $V_{TH}$ of the comparator needs to be made very small and the influence of a deviation of the input offset voltage of the comparator is relatively strong.

On the other hand, in the Patent Literature 3, a sense current which is proportional to a load current is generated by a sense MOS transistor, and is received by a current mirror circuit of bipolar transistors so as to generate a mirror current of the sense current. Then, the mirror current of a current set by a constant current source is generated as a reference current and is compared with the mirror current of the sense current so as to detect a current of a power MOS transistor. Moreover, in the Patent Literature 3, a voltage between a base and an emitter in a bipolar transistor connected with the sense MOS transistor in series reduces the precision of the sense current. For this reason, a constant current source is inserted to cancel the reduction so that the detection precision is improved. However, in the Patent Literature 3, it could be thought that the precision of the sense current is improved. However, the precision of the reference current, i.e. the precision of the constant current source influences the detection precision directly. In a general semiconductor manufacture line, a deviation (manufacture deviation) of the constant current source formed on the semiconductor substrate is expected as about ±30%. Thus, it is considerably difficult to suppress the manufacture deviation to about ±3% which is almost same as the deviation of the substrate resistance $R_{SUB}$.

A second factor is in that the voltage which is substantially coincident with a voltage at the boundary between the N-type semiconductor region 32 and the P-type base region 34 is generated at the node n1. As considered above, in order to precisely measure the voltage drop due to the substrate resistance $R_{SUB}$, it is necessary to precisely measure the voltage difference between the voltage at the boundary between the N-type semiconductor region 32 and the P-type base region 34 and the voltage at the back electrode 33. Here, in the semiconductor device of the present embodiment, the boundary between the N-type semiconductor region 32 and the P-type base region 34 is electrically connected with the node n1 in a low resistance through an accumulation layer formed in the N-type semiconductor region 32 and an inversion layer formed in the P-type base region 35. Therefore, the voltage which is substantially coincident with the voltage at the boundary between the N-type semiconductor region 32 and the P-type base region 34 is generated at the node n1. The voltage at the node n1 is supplied to the voltage detecting circuit 24 as an input. Therefore, the semiconductor device of the present embodiment can precisely measure the voltage drop due to the substrate resistance $R_{SUB}$.

On the other hand, referring to FIG. 1 and FIG. 2 in the Patent Literature 1, a current detection electrode 9 for the detection of a voltage drop of the silicon substrate is formed in the substrate surface apart from a position where a collector current flows most strongly (a position of the boundary between an base diffusion layer 3 and an epitaxial silicon layer 2 under an emitter electrode 7). In other words, the Patent Literature 1 can acquire only a detection precision which contains the voltage drop due to the epitaxial silicon layer 2 from the position of the boundary between the epitaxial silicon layer 2 and the base diffusion layer 3 under the emitter electrode 7 to the current detection electrode 9.

Figure 10:
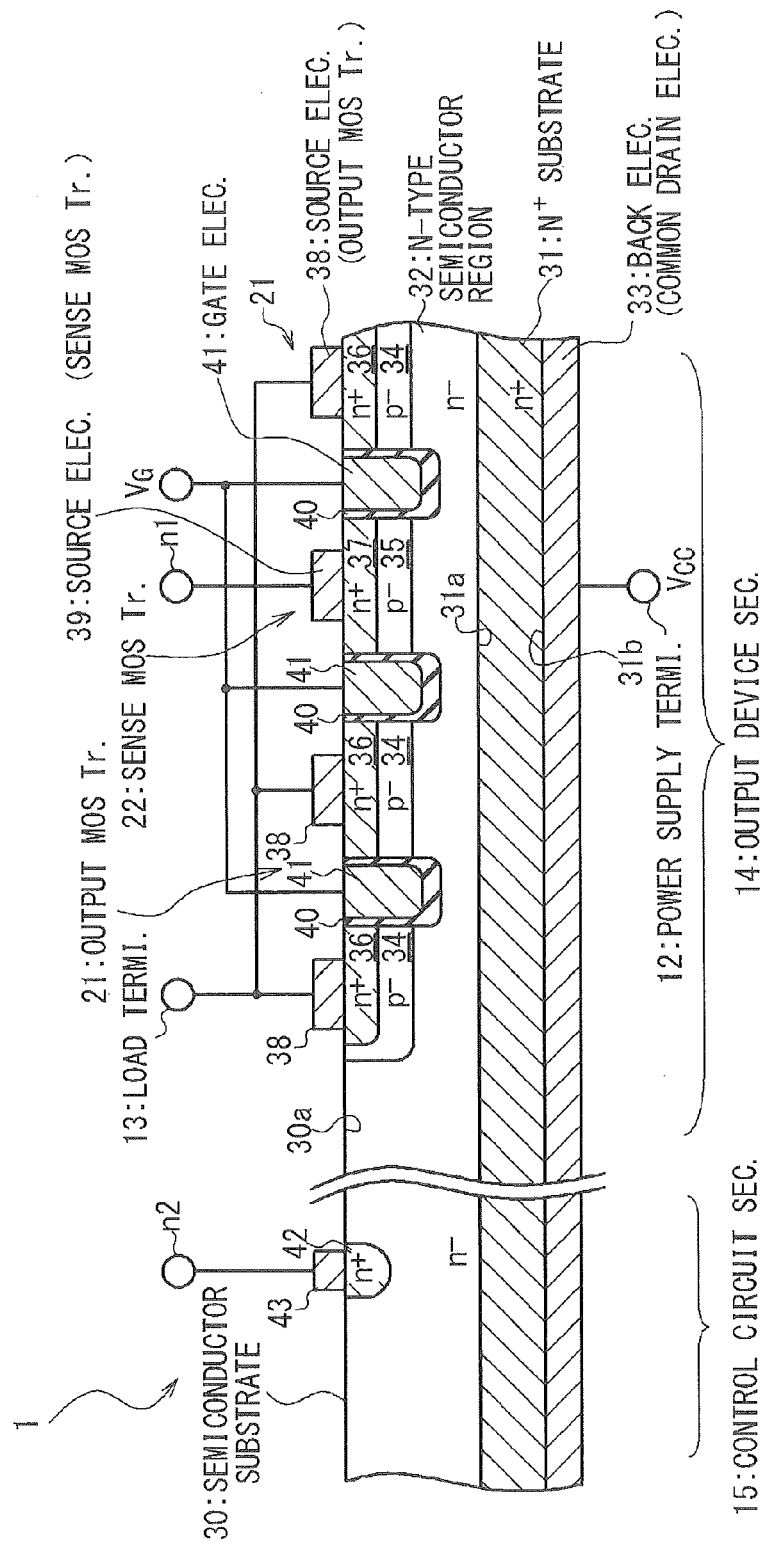
FIG. 10 is a sectional view showing another example of the structure of the output MOS transistor and the sense MOS transistor.

It should be noted that in the semiconductor device of the present embodiment, the structure of the output MOS transistor 21 and the sense MOS transistor 22 is not limited to the structure shown in FIG. 3, and it is possible to change variously. For example, in FIG. 3, the UMOS structure that the film thickness of the gate insulating film 40 is uniform is shown but the structure may be adopted in which the film thickness of the gate insulating film 40 is thick in the bottom of the trench which reaches the N-type semiconductor region 32 as shown in FIG. 10. In this case, there is a possibility that the resistance of the accumulation layer formed in the surface opposing to the gate electrode 41 in the N-type semiconductor region 32 increases, so that the voltage difference between the voltage at the boundary between the N-type semiconductor region 32 and the P-type base region 34 and the voltage at the node n1 increases. However, in such a structure, because the output MOS transistor 21 and the sense MOS transistor 22 are in just near positions, it is possible to enjoy the advantage of the semiconductor device according to the above-mentioned embodiment for an extent.

Figure 11:
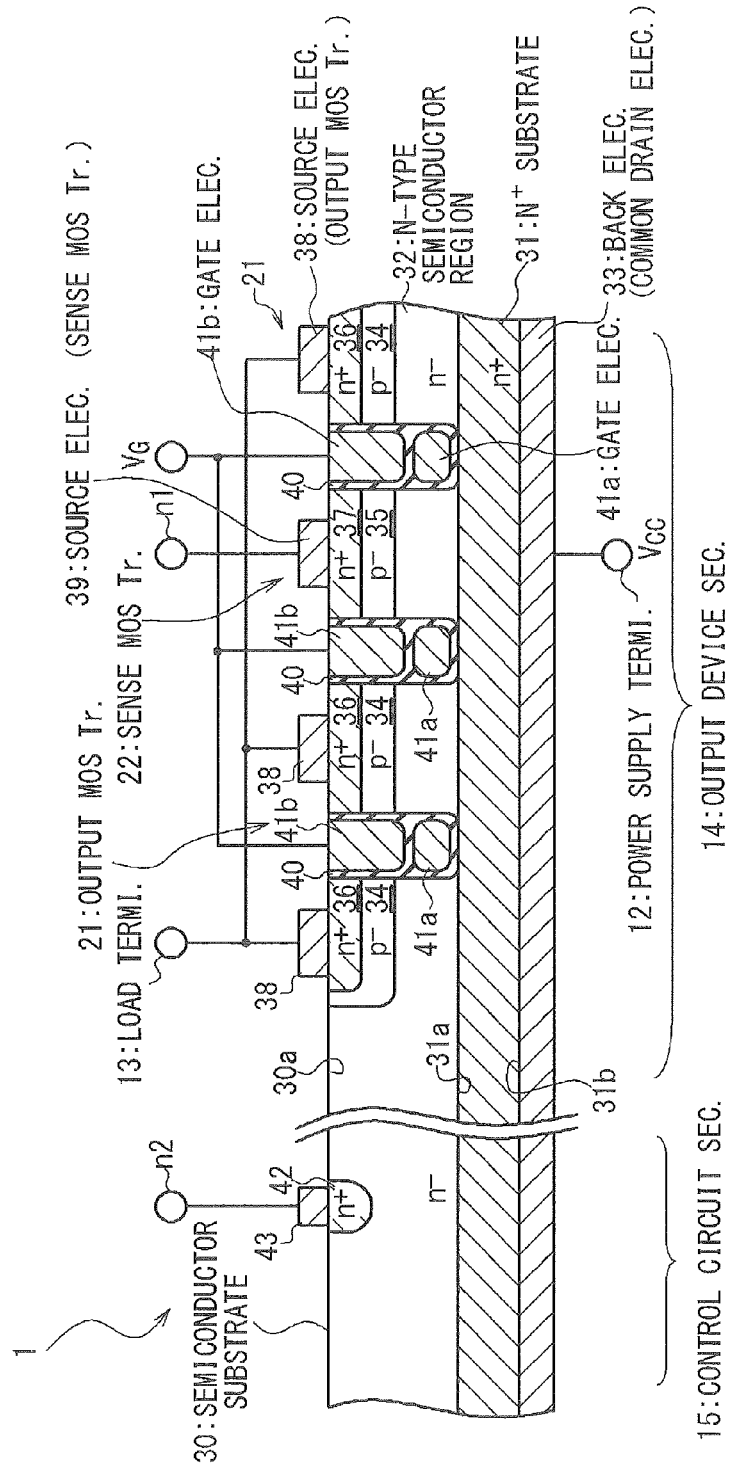
FIG. 11 is a sectional view of another example of the structure of the output MOS transistor and the sense MOS transistor.

Also, a double gate structure may be adopted in which the trenches are formed to reach the $N^+$ substrate 31 as shown in FIG. 11 and two gate electrodes 41a and 41b are embedded in each trench. In FIG. 11, the gate electrode on the underside is shown by 41a and the gate electrode on the topside is shown by 41b. The gate electrodes 41a and 41b are electrically connected to each other. That is, the gate electrodes 41a and 41b are driven with an identical voltage. In this case, the accumulation layers are formed in the surface section opposing to the gate electrode 41a in the N-type semiconductor region 32 and the surface section opposing to the gate electrode 41a of the $N^+$ substrate 31 when the gate electrodes 41a and 41b are driven. Therefore, the voltage which is approximately coincident with the voltage at the boundary between the N-type semiconductor region 32 and the P-type base region 34 can be generated in the node n1.

Figure 12:
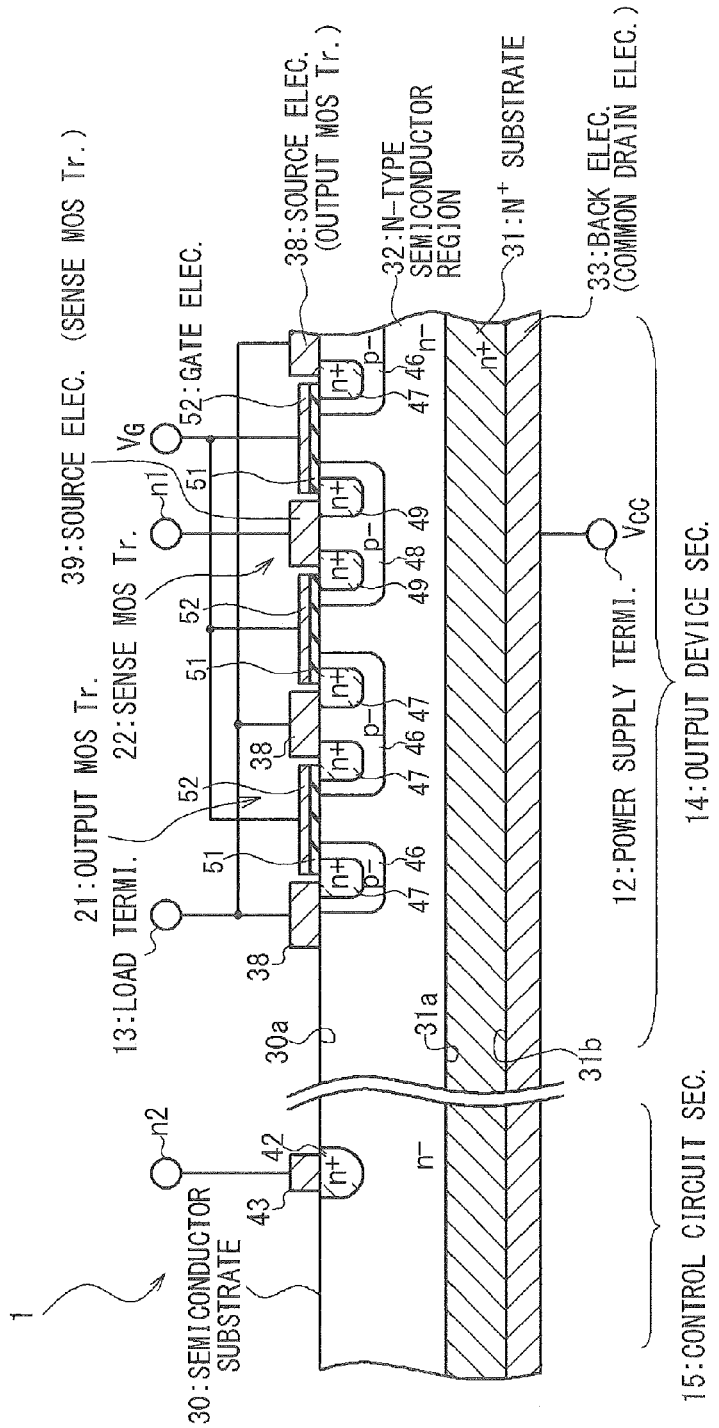
FIG. 12 is a sectional view of another example of the structure of the output MOS transistor and the sense MOS transistor.

Also, as shown in FIG. 12, a DMOS (double-diffused MOS) structure may be used for the output MOS transistor 21 and the sense MOS transistor 22. In detail, the semiconductor substrate 30 has the P-type base regions (the body region) 46 and 48 formed on the N-type semiconductor region 32, and the N$^+$ diffusion layers 47 and 49 are formed in the P-type base regions 46 and 48. The P-type base regions 46 and 48 are the semiconductor regions where a P-type impurity is doped, and also, the N$^+$ diffusion layers 47 and 49 are the semiconductor regions where an N-type impurity is heavily doped. The P-type base region 46 is a region where the channel of the output MOS transistor 21 is formed and the P-type base region 48 is a region where the channel of the sense MOS transistor 22 is formed. In the present embodiment, a part of the N-type semiconductor region 32 exists between the P-type base region 46 and the P-type base region 48. The N-type semiconductor region 32 reaches the front-side main surface 30a of the semiconductor substrate 30 by passing between the P-type base region 46 and the P-type base region 48. Also, the N$^+$ diffusion layer 47 functions as a source of the output MOS transistor 21 and the N$^+$ diffusion layer 49 functions as a source of the sense MOS transistor 22.

Moreover, the source electrode 38 is formed to be joined with the N$^+$ diffusion layer 47, and the source electrode 39 is formed to be joined with the N$^+$ diffusion layer 49. That is, the source electrode 38 is electrically connected with the source of the output MOS transistor 21 and the source electrode 39 is electrically connected with the source of the sense MOS transistor 22. The source electrode 38 is connected with the load terminal 13 and the source electrode 39 is connected with the node n1.

Moreover, the gate insulating film 51 is formed to partially cover a surface of the P-type base regions 46 and 48 and the N-type semiconductor region 32, and the gate electrode 52 is formed on the gate insulating film 51. Note that the gate electrode 52 is provided to oppose to a part of the surface of the P-type base regions 46 and 48 and to oppose to a part of the surface of the N-type semiconductor region 32.

Figure 13:
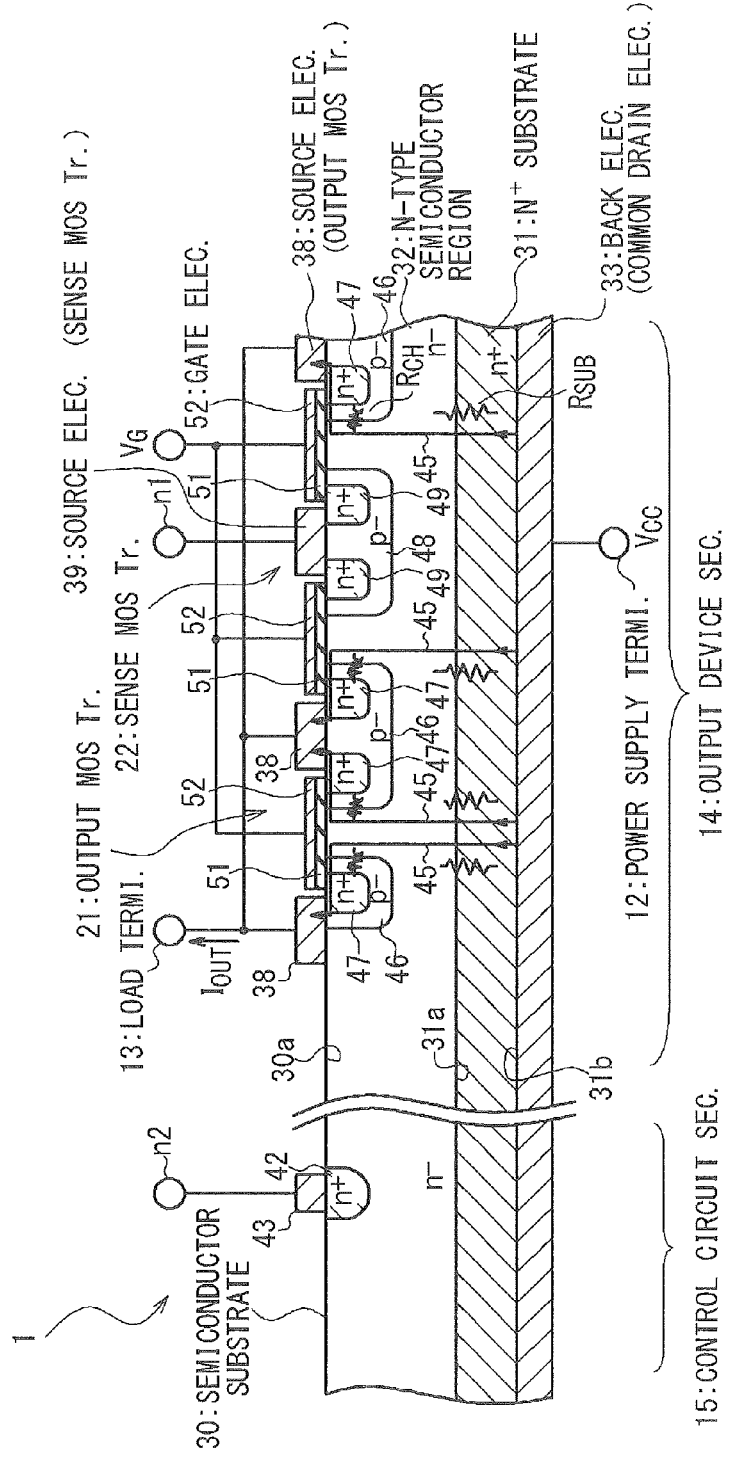
FIG. 13 is a sectional view showing a path through which the load current flows in the output MOS transistor of the structure of FIG. 12.

In case where the DMOS structure shown in FIG. 12 is adopted, when a positive voltage which exceeds the threshold voltages of the output MOS transistor 21 and the sense MOS transistor 22 is applied to the gate electrode 52, the voltage which is approximately identical with the voltage at the boundary between the P-type base region 46 and the N-type semiconductor region 32 can be taken out from the node n1. FIG. 13 is a diagram showing the route through which the load current $I_{OUT}$ flows when the positive voltage which exceeds the threshold voltage is applied to the gate electrode 52 in the semiconductor device having the structure of FIG. 12 (that is, when the output MOS transistor 21 is turned on). The route through which the load current $I_{OUT}$ flows is shown by an arrow 45 in FIG. 13.

When the gate electrode 52 is driven with a high voltage (for example, about twice of the DC power supply voltage $V_{CC}$), an inversion layer is formed in the surface of the P-type base region 46 opposing to the gate electrode 52. The inversion layer is used as the channel of the output MOS transistor 21. The load current $I_{OUT}$ flows in the perpendicular direction from the N$^+$ substrate 31 and flows into the N$^+$ diffusion layer 47 through the channel formed in the P-type base region 46. Moreover, the load current $I_{OUT}$ which flows into the N$^+$ diffusion layer 47 is supplied to the load 3 connected with the load terminal 13, flowing into the load terminal 13 through the source electrode 38 from the N$^+$ diffusion layer 47.

At this time, the inversion layer (that is, the channel of the sense MOS transistor 22) is formed in the surface of the P-type base region 48 opposing to the gate electrode 52, and an accumulation layer is formed in the surface of the N-type semiconductor region 32 opposing to the gate electrode 52. Therefore, the boundary between the P-type base region 46 and the N-type semiconductor region 32 is electrically connected with the node n1 in a lower resistance and the voltage which is approximately identical with the voltage at the boundary between the P-type base region 46 and the N-type semiconductor region 32 can be taken out from the node n1. It is useful to precisely measure the voltage drop due to the substrate resistance $R_{SUB}$, i.e. to precisely measure the load current $I_{OUT}$ that the voltage which is approximately identical with the voltage at the boundary between the P-type base region 46 and the N-type semiconductor region 32 is taken out from the node n1.

Figure 14:
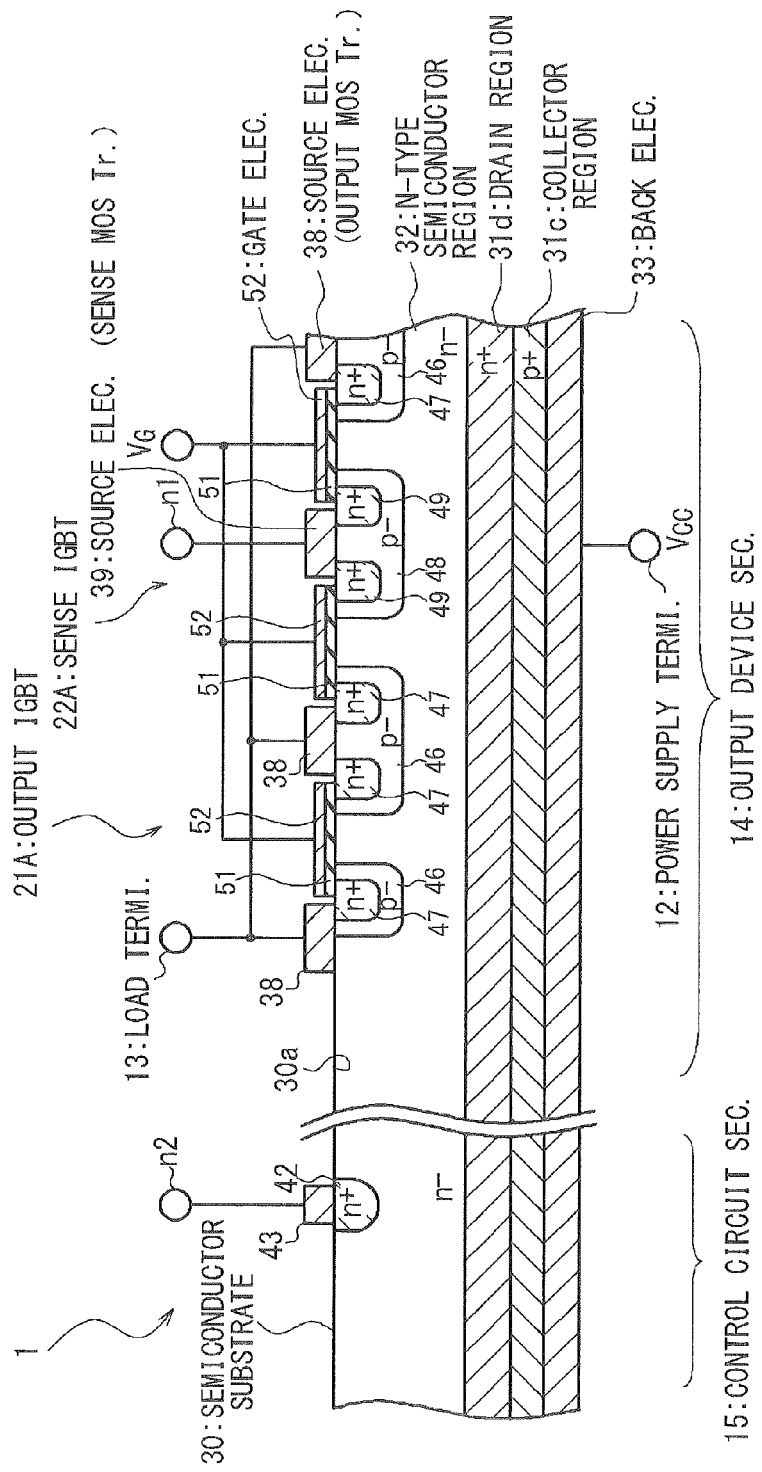
FIG. 14 is a sectional view showing the structure when an output IGBT and a sense IGBT are used instead of the output MOS transistor and the sense MOS transistor in the semiconductor device of the first embodiment.

Also, as shown in FIG. 14, IGBT (insulated gate bipolar transistor) may be used as a power transistor, instead of the output MOS transistor 21 and the sense MOS transistor 22. In FIG. 14, the IGBT which is used instead of the output MOS transistor 21 is shown as an output IGET 21A and an IGBT which is used instead of the sense MOS transistor 22 is shown as a sense IGBT 22A. In the configuration of FIG. 14, a collector region 31c into which the P-type impurity is heavily doped and a drain region 31d into which the N-type impurity is heavily doped are used instead of the N$^+$ substrate 31. Here, the back electrode 33 is joined with the collector region 31c and the drain region 31d is joined with the collector region 31c. Moreover, the N-type semiconductor region 32 is joined with the drain region 31d. As well-known, the IGBT is a device in which both of electrons and holes can be used as carriers by adopting the structure that a collector region is additionally provided for the MOS transistor. Therefore, the structure of the semiconductor device in which the output IGBT 21A and the sense IGBT 22A are provided as the power transistors as shown in FIG. 14 does not have an essential difference from the structure that the output MOS transistor 21 and the sense MOS transistor 22 are provided as shown in FIG. 3.

Figure 15:
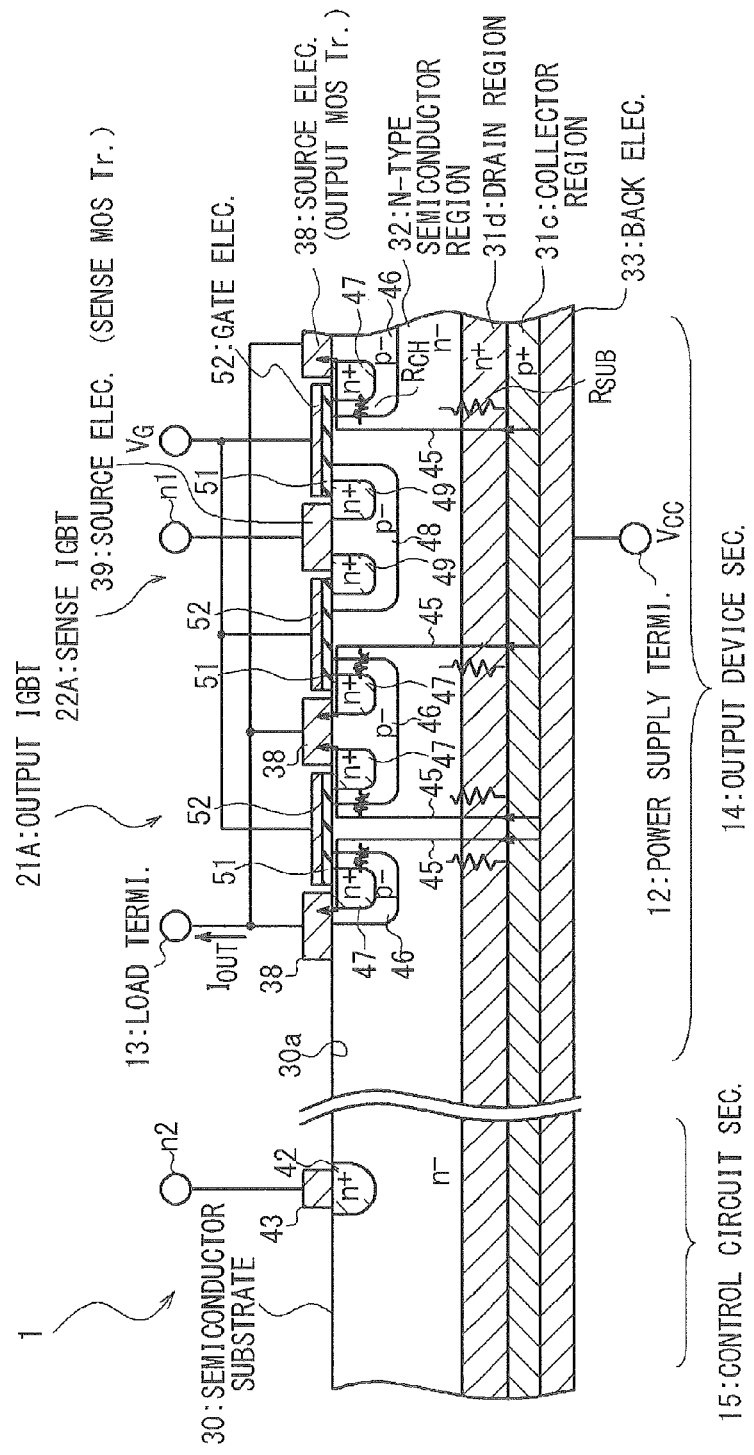
FIG. 15 is a sectional view showing a path through which the load current flows in the output IGBT of the structure of FIG. 14.

That is, when the gate electrode 52 is driven in the high voltage (for example, about twice of the DC power supply voltage $V_{CC}$) as shown in FIG. 15, the inversion layer is formed in the surface of the P-type base region 46 opposing to the gate electrode 52. This inversion layer is used as the channel of the output MOS transistor 21. The load current $I_{OUT}$ flows in the perpendicular direction from the collector region 31c and flows into the N$^+$ diffusion layer 47 through the channel formed in the P-type base region 46. Moreover, the load current $I_{OUT}$ which flows into the N$^+$ diffusion layer 47 is supplied to the load 3 connected with the load terminal 13, flowing into the load terminal 13 through the source electrode 38 from the N$^+$ diffusion layer 47.

At this time, the inversion layer (that is, the channel of the sense MOS transistor 22) is formed in the surface of the P-type base region 48 opposing to the gate electrode 52, and the accumulation layer is formed in the surface of the N-type semiconductor region 32 opposing to the gate electrode 52. Therefore, the boundary between the P-type base region 46 and the N-type semiconductor region 32 is electrically connected with the node n1 in a low resistance and the voltage which is approximately identical with the voltage at the boundary between the P-type base region 46 and the N-type semiconductor region 32 can be taken out from the node n1. As considered above, it is useful to precisely measure the voltage drop due to the substrate resistance $R_{SUB}$, i.e. to precisely measure the load current $I_{OUT}$ that the voltage which is approximately identical with the voltage at the boundary between the P-type base region 46 and the N-type semiconductor region 32 is taken out from the node n1.

It should be noted that in the present embodiment, the substrate resistance in the collector region 31c is not used. The drain region 31d is common, the drain region 31d and the N-type semiconductor region 32 are used as the substrate resistance $R_{SUB}$ and the voltage which is approximately identical with the drain region 31d is taken out from the node n2.

Figure 16:
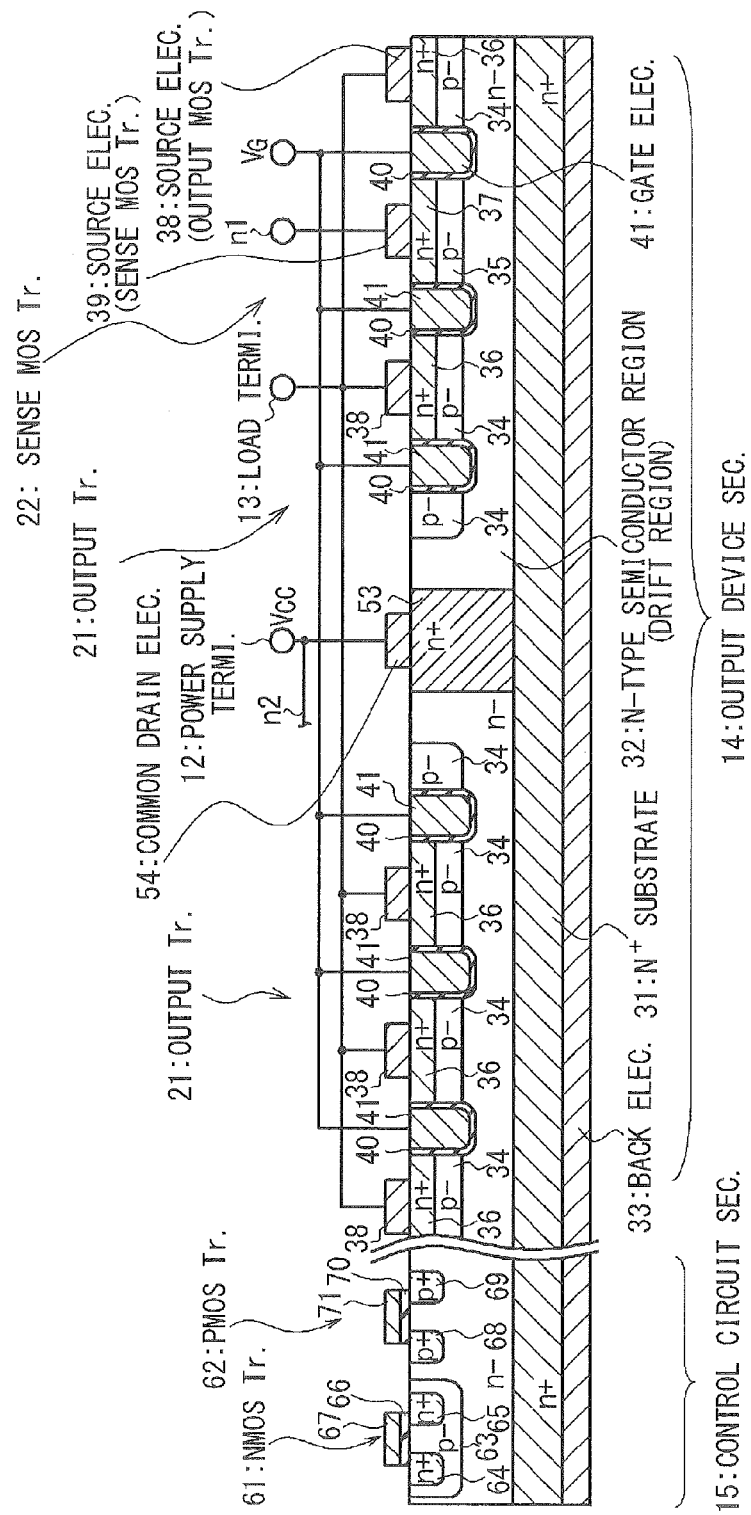
FIG. 16 is a sectional view showing another structure of the output device section in the first embodiment.

FIG. 16 is a sectional view showing a further modification example of the semiconductor device of the present embodiment. Moreover, in the structure of FIG. 16, an $N^+$ region 53 is formed to reach the $N^+$ substrate 31 through the N-type semiconductor region 32 from the front-side main surface 30a of the semiconductor substrate 30, and a common drain electrode 54 is connected with the $N^+$ region 53. The $N^+$ region 53 is a semiconductor region where the N-type impurity is heavily doped. In the structure of FIG. 16, the power supply terminal 12 is connected to the common drain electrode 54, and also, the node n2 is connected with the common drain electrode 54. That is, when the structure of FIG. 16 is adopted, the voltage at the node n2 is substantially coincident with the voltage of the common drain electrode 54.

In a configuration as shown in FIG. 16, because the common drain electrode 54 is formed on the front-side main surface 30a of the semiconductor substrate 30, the connection between the circuits of the control circuit section 15 (which are formed on the front-side main surface 30a of the semiconductor substrate 30) and the common drain electrode 54 is easy, and is favorable in case of implementing of the semiconductor device of the present embodiment. In other words, because all of the external terminals can be formed on the front-side main surface of the semiconductor chip, the so-called flip-chip implementing becomes possible.

Figure 17:
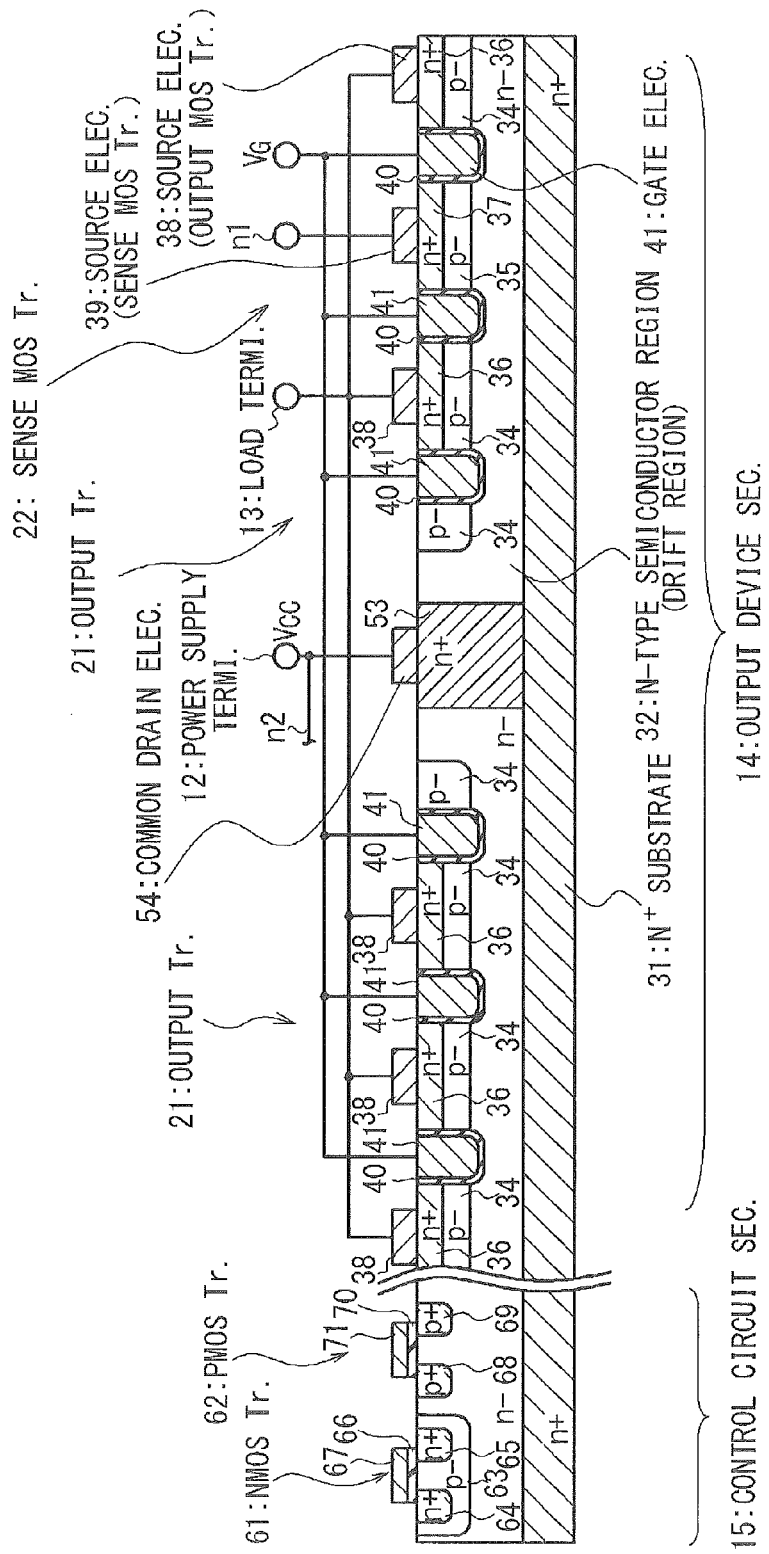
FIG. 17 is a sectional view showing another structure of the output device section in the first embodiment.

It should be noted that in the configuration of FIG. 16, the back electrode 33 is used to reduce a resistance of the N substrate in the surface in the direction in the surface, not connection terminals with the external unit. The semiconductor device of the structure of FIG. 16 carries out the same operation as the semiconductor device of the structure of FIG. 3, excluding that the load current $I_{OUT}$ flows into the $N^+$ substrate 31 through the common drain electrode 54 and the $N^+$ region 53 from the power supply terminal 12. Also, when the resistance in the direction to the surface of the $N^+$ substrate 31 is sufficiently small, the back electrode 33 may be removed, as shown in FIG. 17.

Second Embodiment

Figure 18:
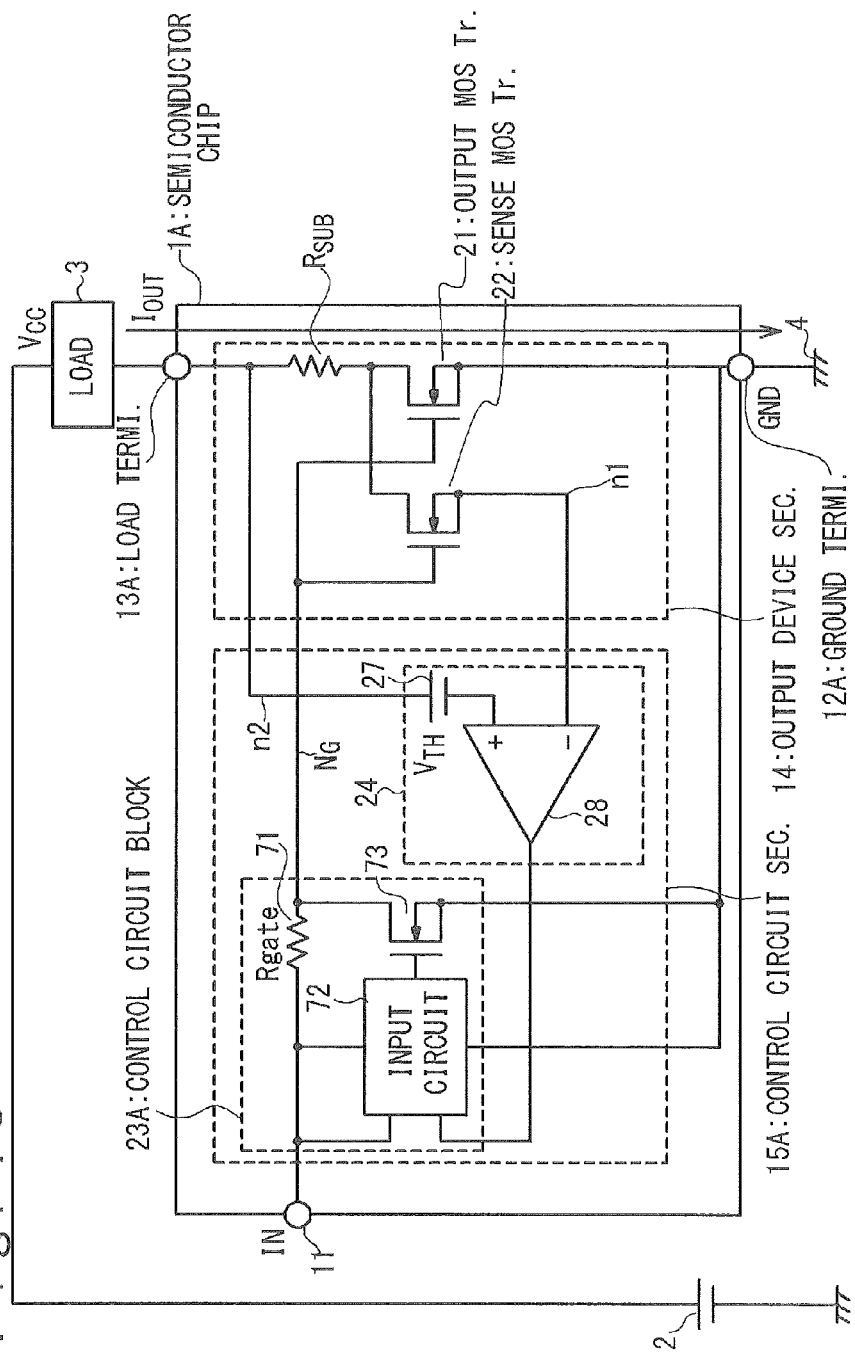
FIG. 18 is a diagram schematically showing the configuration of the semiconductor device in a second embodiment.

FIG. 18 is a block diagram showing a configuration of the semiconductor device according to a second embodiment. In the present embodiment, the semiconductor chip 1A is not a high side driver IC as shown in FIG. 1, and is configured as a so-called low side driver IC which is provided between the load 3 and the ground terminal 4. Hereinafter, the configuration of the semiconductor chip 1A will be described in detail.

The semiconductor chip 1A has a load terminal 13A connected with the load 3 and a ground terminal 12A connected with a ground terminal 4 (i.e. ground) and is configured to switch the electrical connection between the load 3 and the ground terminal 4. In detail, an output device section 14 and a control circuit section 15A are integrated in a monolithic manner on the semiconductor chip 1A. The configuration of the output device section 14 of the semiconductor chip 1A is identical with the output device section 14 of the semiconductor chip 1 of the first embodiment. On the other hand, the control circuit section 15A is configured to make the semiconductor chip 1A operate as the low side driver IC.

The control circuit section 15A is configured from a control circuit block 23A and a voltage detecting circuit 24. The configuration of the voltage detecting circuit 24 is identical with that of the voltage detecting circuit 24 of the semiconductor chip 1 in the first embodiment, and has the set threshold voltage generating section 27 and the comparator 28. As considered in the first embodiment in detail, the voltage detecting circuit 24 generates the detection signal $S_{DET}$ according to a voltage difference $\Delta V21$ (=Vn2−Vn1) between the voltage Vn1 of the node n1 and the voltage Vn2 of the node n2.

The control circuit block 23A is configured from a gate resistance 71, an input circuit 72 and an NMOS transistor 73. The gate resistance 71 is connected between a gate connection node NG connected with the gate of the output MOS transistor 21 and the sense MOS transistor 22 (i.e. the gate electrode 41) and the control input terminal 11. The input circuit 72 turns on or off the NMOS transistor 73 in response to the external control signal IN which is supplied to the control input terminal 11 and the detection signal $S_{DET}$ outputted from the voltage detecting circuit 24. Note that the voltage of the external control signal IN which is supplied to the control input terminal 11 is used as the DC power supply voltage of an input circuit 72. The NMOS transistor 73 is used as a short-circuiting switch which connects the gate connection node NG and the ground terminal 12A under the control of the input circuit 72. A drain of the NMOS transistor 73 is connected with the gate of the output MOS transistor 21 and the sense MOS transistor 22, and a source thereof is connected with the ground terminal 12A.

Figure 19:
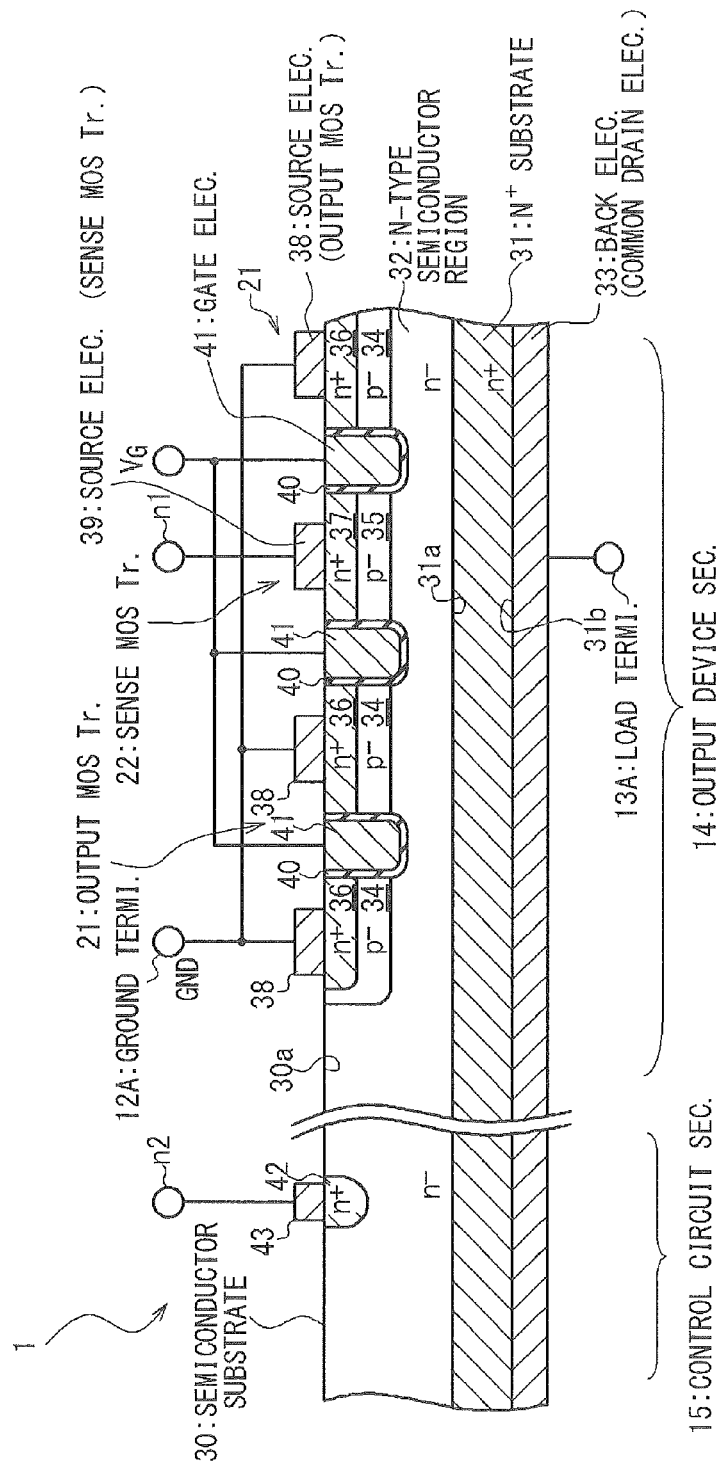
FIG. 19 is a sectional view showing the structure of the output device section and the control circuit section in the second embodiment.

FIG. 19 is a sectional view showing a structure of the output MOS transistor 21 and the sense MOS transistor 22 in the semiconductor device of the second embodiment. As shown in FIG. 19, the structure of the output MOS transistor 21 and the sense MOS transistor 22 in the second embodiment is the same as that of the first embodiment shown in FIG. 3, excluding that the back electrode 33 is connected with a load terminal 13A instead of the load terminal 13 and the source electrode 38 is connected with the ground terminal 12A instead of the power supply terminal 12.

Next, the operation of the semiconductor device in the second embodiment will be described. Referring to FIG. 18 again, it is supposed that the external control signal IN is set to the low level in an initial state. In this case, the output MOS transistor 21 and the sense MOS transistor 22 are both turned off so that the load current $I_{OUT}$ does not flow.

When the external control signal IN is set to the high level (a voltage level which is higher than the threshold voltages of the output MOS transistor 21 and the sense MOS transistor 22), the output MOS transistor 21 is turned on. At this time, the input circuit 72 sets the gate of the NMOS transistor 73 to the low level, to turn off the NMOS transistor 73. When the output MOS transistor 21 is turned on, a current path from the load 3 to the ground terminal 4 is formed so that the load current $I_{OUT}$ flows from the load 3 to the ground terminal 12A.

The operation of detecting the load current $I_{OUT}$ when the output MOS transistor 21 is set to the ON state, is the same as that of the first embodiment. When the load current $I_{OUT}$ flows through the output MOS transistor 21, like the first embodiment, the voltage drop due to the channel resistance $R_{CJ}$ and the substrate resistance $R_{SUB}$ occurs. The voltage drop due to the substrate resistance $R_{SUB}$ is detected as a voltage difference between the node n1 and the voltage of the node n2 by the voltage detecting circuit 24.

Here, in the embodiment, the input circuit 72 operates according to the detection signal $S_{DET}$ outputted from the voltage detecting circuit 24. When a function of detecting over-current is incorporated in the input circuit 72, the input circuit 72 determines that the load current $I_{OUT}$ exceeds a set value $I_{OUT}*$ when the detection signal $S_{DET}$ is in the high level, and turns on the NMOS transistor 73 regardless of the external control signal IN. Thus, the source and the gate in the output MOS transistor 21 are connected so that the output MOS transistor 21 is compulsorily set to the OFF state regardless of the external control signal IN. Also, when a function of detecting light load (or no load) implemented in the input circuit 72, the input circuit 72 determines that the load current $I_{OUT}$ falls below the set value $I_{OUT}*$ when the detection signal $S_{DET}$ is in the low level, and outputs an error signal to a specific external terminal (e.g. a diagnosis terminal which is not shown).

Third Embodiment

Figure 20:
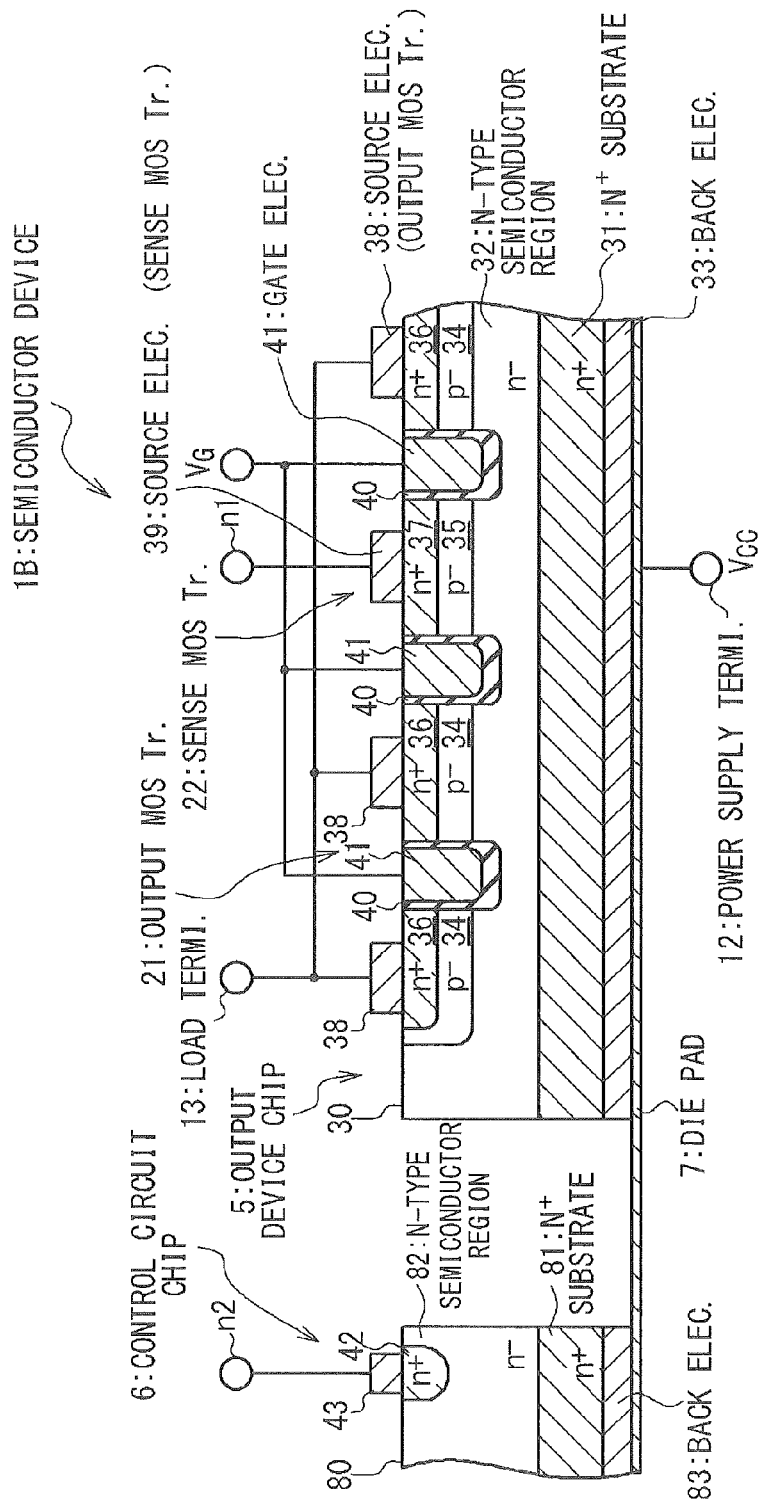
FIG. 20 is a sectional view showing the configuration of the semiconductor device in a third embodiment.
Figure 21:
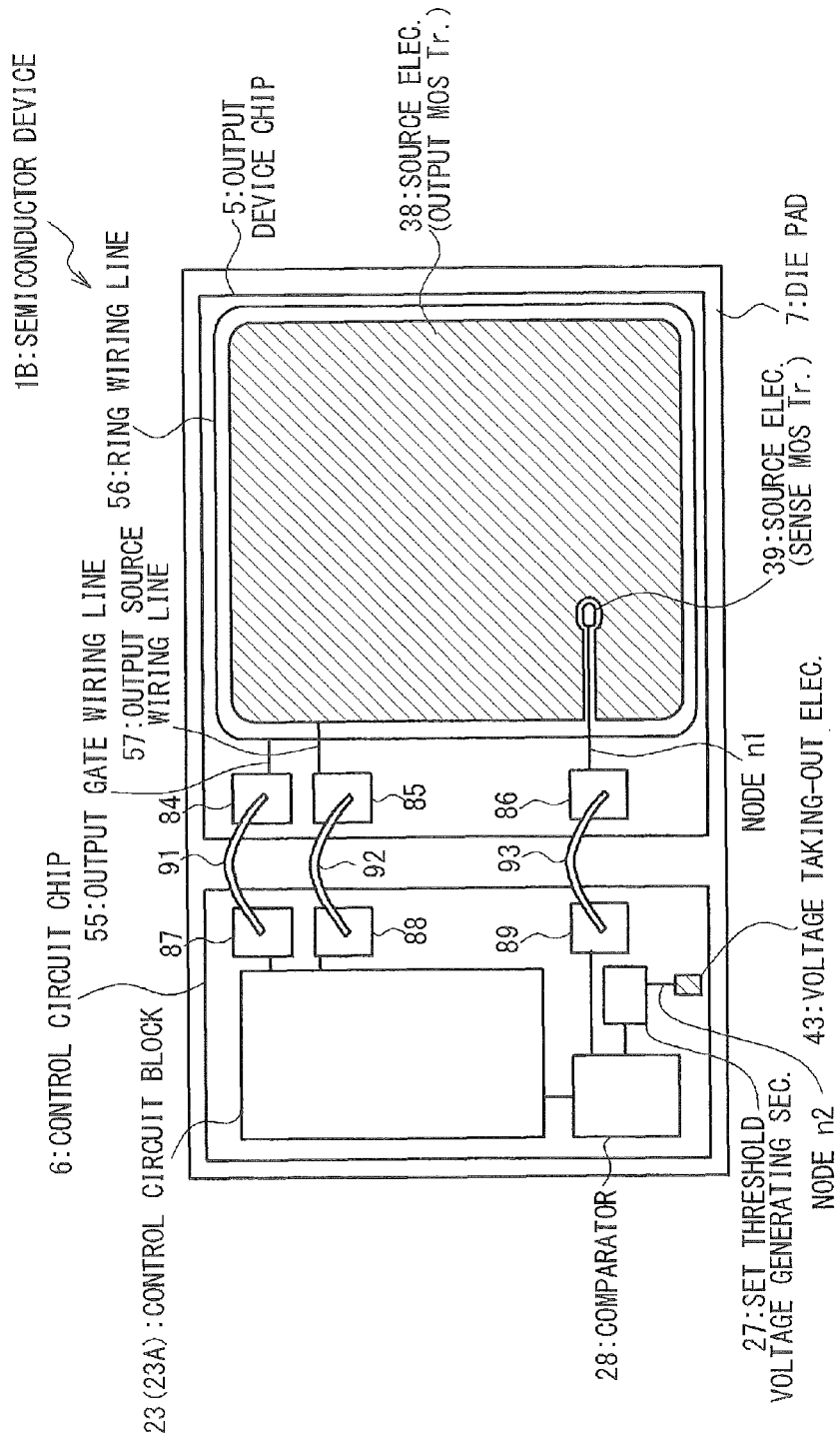
FIG. 21 is a plan view showing the configuration of the semiconductor device in the third embodiment.

FIG. 20 is a sectional view showing a configuration of a semiconductor device 1D in a third embodiment, and FIG. 21 is a plan view showing a configuration of the semiconductor device 1B. As shown in FIG. 20 and FIG. 21, the semiconductor device 1B of the present embodiment includes two chips: an output device chip 5 and a control circuit chip 6. The output device chip 5 is a semiconductor chip which has the same configuration and functions as those of the output device section 14 in the first and second embodiments and the control circuit chip 6 is a semiconductor chip which has the same configuration and functions as those of the control circuit section (15 or 15 A) in the first or second embodiment.

As shown in FIG. 20, the output MOS transistor 21 and the sense MOS transistor 22 which have the same structure as the output device section 14 in the first and second embodiments are integrated on the output device chip 5. In detail, the output device chip 5 includes the semiconductor substrate 30 having the N+ substrate 31 and the N-type semiconductor region 32 formed on the front-side main surface 31a of the N+ substrate 31. The back electrode 33 is formed on the back-side main surface of the semiconductor substrate 30, i.e. the back-side main surface 31b of the N+ substrate 31, and this back electrode 33 is connected with the power supply terminal 12 to which the DC power supply voltage $V_{CC}$ is supplied. The P-type base regions 34 and 35 (body regions) are formed on the N-type semiconductor region 32, and the N+ diffusion layers 36 and 37 are formed on the P-type base regions 34 and 35. The N+ diffusion layers 36 and 37 are provided to be in contact with the front-side main surface 30a of the semiconductor substrate 30. Moreover, the source electrode 38 is formed to be joined to the N+ diffusion layer 36, and the source electrode 39 is formed to be joined to the N+ diffusion layer 37. The source electrode 38 is connected with the load terminal 13 and the source electrode 39 is connected with the node n1. Note that the node n1 is connected with one of the input terminals of the comparator 28 which carries out the voltage detection (−input terminal), as mentioning above. Moreover, a trench is formed in the semiconductor substrate 30 to pass through the P-type base regions 34 and 35 (where the N+ diffusion layers 36 and 37 are formed) to the N-type semiconductor region 32, and the gate insulating film 40 is formed to cover the side surface and base surface of the trench. Moreover, the gate electrode 41 is formed on the gate insulating film 40 to fill the trench.

Also, circuits which are the same as those of the control circuit section (15 or 15 A) in the first or second embodiment are integrated on the control circuit chip 6 and a structure for taking out the voltage of the power supply terminal 12 (the voltage of the common drain electrode) is provided for the node n2. In detail, the control circuit chip 6 has a semiconductor substrate 80 and the semiconductor substrate 80 has an N+ substrate 81 and an N-type semiconductor region 82 formed on the front-side main surface of the N+ substrate 81. The N-type impurity is heavily doped into the N+ substrate 81. The back electrode 83 is joined with the back-side main surface of the N+ substrate 81. Also, the N-type impurity is doped into the N-type semiconductor region 82. Circuits which are the same as those of the control circuit section (15 or 15A) in the first and second embodiments are integrated on the surface section of the N-type semiconductor region 82 and the N+ diffusion layer 42 is formed. The voltage taking-out electrode 43 is connected with the N+ diffusion layer 42 and the voltage taking-out electrode 43 is connected with the node n2.

The back electrode 33 of the output device chip 5 and the back electrode 83 of the control circuit chip 6 are joined to a die pad 7 formed of a conductive material, and the power supply terminal 12 is connected to the die pad 7. The back electrode 33 of the output device chip 5 and the back electrode 83 of the control circuit chip 6 are electrically connected by the die pad 7 and have substantially the same voltage. Therefore, the voltage which is the same voltage (the voltage of the common drain electrode) as that of the back electrode 33 of the output device chip 5 or a corresponding voltage is taken out to the node n2.

FIG. 21 is a diagram showing the implementing of the output device chip 5 and the control circuit chip 6 in the semiconductor device 1B of a third embodiment. Pads 84, 85 and 86 are integrated on the output device chip 5, in addition to the output MOS transistor 21 (only the source electrode 38 is shown in FIG. 21), the sense MOS transistor 22 (only the source electrode 39 is shown in FIG. 21), an output gate wiring line 55, a ring wiring line 56 and an output source wiring line 57. The output gate wiring line 55 is connected with the pad 84, the output source wiring line 57 is connected with the pad 85 and the node n1 is connected with the pad 86.

On the other hand, pads 87, 88 and 89 are integrated on the control circuit chip 6, in addition to the control circuit block 23 (or 23 A), the set threshold voltage generating section 27, the comparator 28 and the voltage taking-out electrode 43.

An electrical connection between the output device chip 5 and the control circuit chip 6 is attained by the die pad 7 and bonding wires 91, 92 and 93. As mentioned above, the back electrode 33 of the output device chip 5 and the back electrode 83 of the control circuit chip 6 are electrically connected by the die pad 7. Also, the pads 84, 85 and 86 of the output device chip 5 are connected with the pads 87, 88 and 89 of the control circuit chip 6 by bonding wires 91, 92 and 93, respectively. The control circuit block 23 (or 23A) is connected with the output gate wiring line 55 through the pad 87, the bonding wire 91 and the pad 84, and is connected with the output source wiring line 57 through the pad 88, the bonding wire 92 and the pad 85. Moreover, the node n1 (the source electrode 39 of the sense MOS transistor 22) is connected with the −input terminal of the comparator 28 through the pad 86, the bonding wire 93 and the pad 89.

The configuration of the semiconductor device 1B in the above-mentioned embodiment is advantageous when the output device chip 5 and the control circuit chip 6 are formed in separate semiconductor processes. The output device chip 5 must be manufactured in the semiconductor process which fits with the semiconductor process of a power transistor, whereas it is possible to manufacture the control circuit chip 6 in the general semiconductor process. It is sometimes advantageous depending on the structure of the circuits to be integrated that the output device chip 5 and the control circuit chip 6 are formed in the separate semiconductor processes.

In the structure of FIG. 20 and FIG. 21, an electrical connection between the die pad 7 and the node n2 is attained by the structure integrated on the control circuit chip 6 (specifically, the back electrode 83, the N+ substrate 81, the N-type semiconductor region 82, the N+ diffusion layer 42 and the voltage taking-out electrode 43). However, the die pad 7 and the node n2 may be electrically connected with a different structure.

Figure 22:
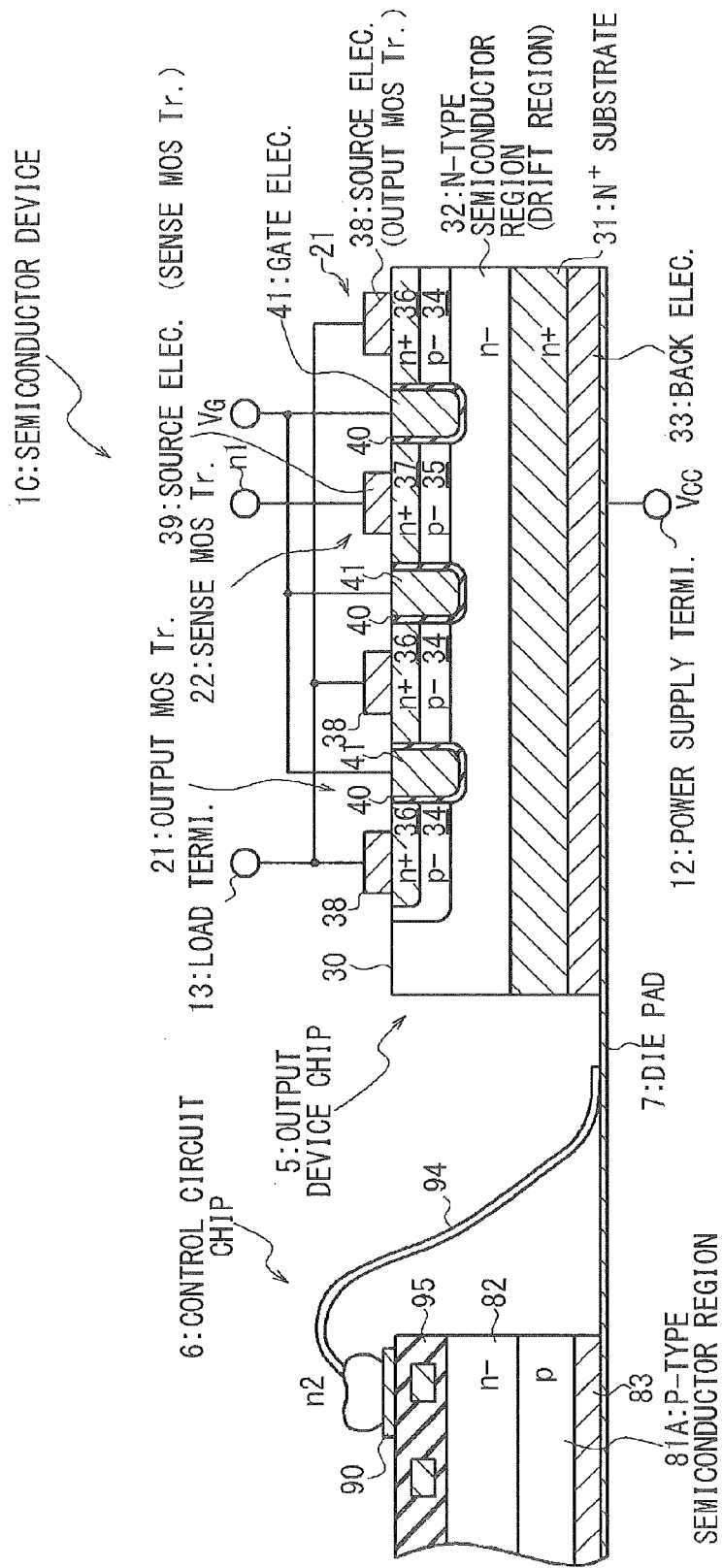
FIG. 22 is a sectional view showing a modification example of the configuration of the semiconductor device in the third embodiment.
Figure 23:
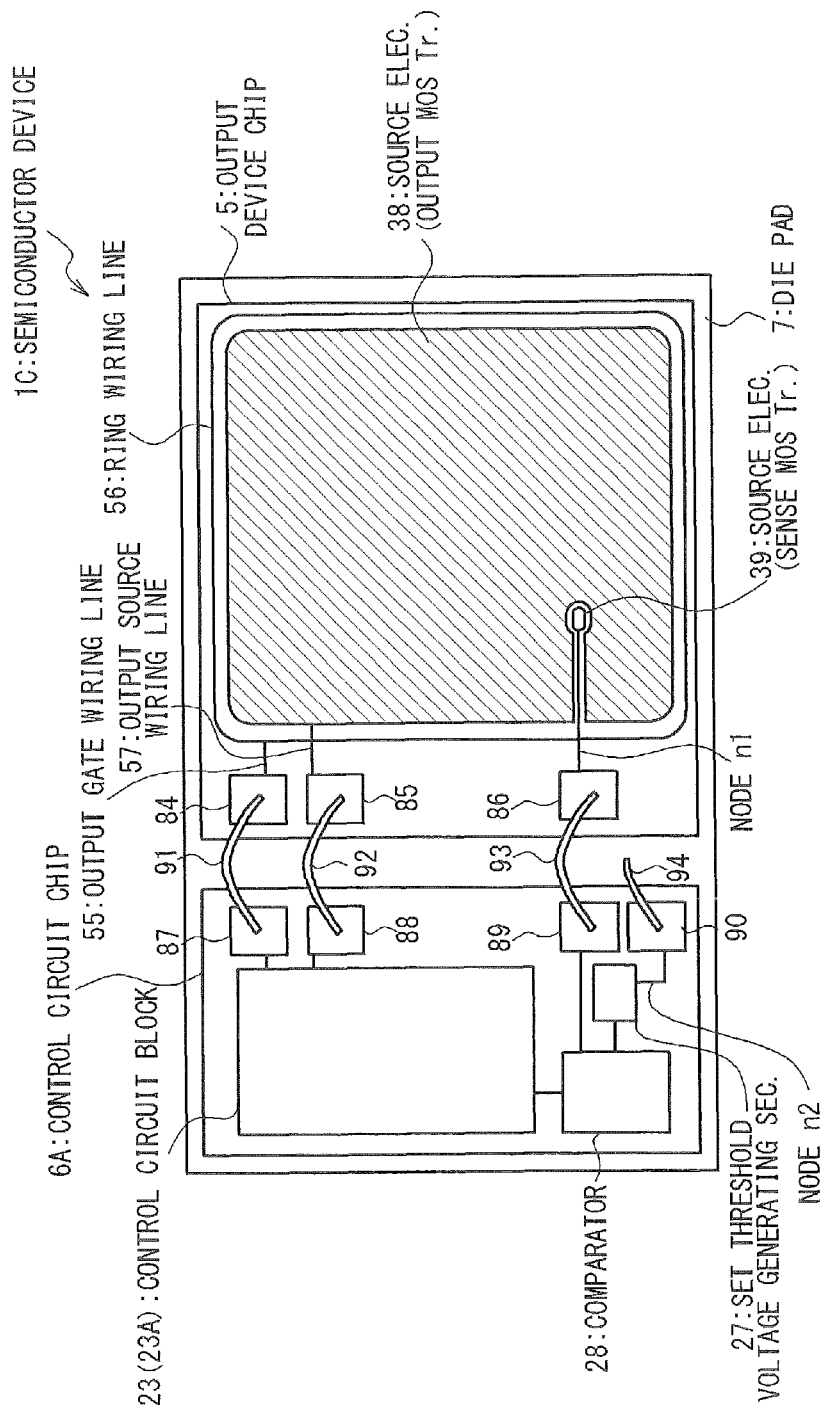
FIG. 23 is a plan view showing the configuration of the semiconductor device of FIG. 22.

FIG. 22 is a sectional view showing a modification example of the structure of the semiconductor device in the present embodiment, and FIG. 23 is a plan view. In the semiconductor device 1C shown in FIG. 22 and FIG. 23, the die pad 7 and the node n2 are electrically connected by using a pad 90 and a bonding wire 94. The use of the bonding wire 94 is effective when the semiconductor substrate having the structure is used in which it is difficult to take out the voltage of the back-side main surface to the front-side main surface.

In detail, the semiconductor device 1C shown in FIG. 22 and FIG. 23 includes a control circuit chip 6A instead of the control circuit chip 6. The control circuit chip 6A has a semiconductor substrate 80A, and the semiconductor substrate 80A has a P-type substrate 81A and an N-type semiconductor region 82. A P-type impurity has been doped into the P-type substrate 81A. The N-type semiconductor region 82 is formed on the front-side main surface of the P-type substrate 81A, and the back electrode 83 is joined to the back-side main surface of the N+ substrate 81. The same circuits as the circuits contained in the control circuit section (15 or 15 A) of the first or second embodiment are integrated in the surface section of the N-type semiconductor region 82. The wiring line structure 95 having a metal wiring line layer and an interlayer insulating layer on the N-type semiconductor region 82 is formed, and the pad 90 is provided for the wiring line structure 95. The wiring line structure 95 contains a wiring line used as the node n2, and the pad 90 is connected with the wiring line, i.e. the node n2 as shown in FIG. 23. The die pad 7 is connected with the pad 90 by a bonding wire 94. By such a configuration, the back electrode 33 of the output device chip 5 (i.e. a common drain electrode) is electrically connected with the node n2 by the die pad 7, the bonding wire 94 and the pad 90. That is, the pad 90 is used as the voltage taking-out electrode which takes out the voltage of the back electrode 33 (the common drain electrode) through the die pad 7 and the bonding wire 94. The same voltage as the voltage of the back electrode 33 of the output device chip 5 (the voltage of the common drain electrode) or a corresponding voltage is taken out from the node n2.

Fourth Embodiment

Figure 24:
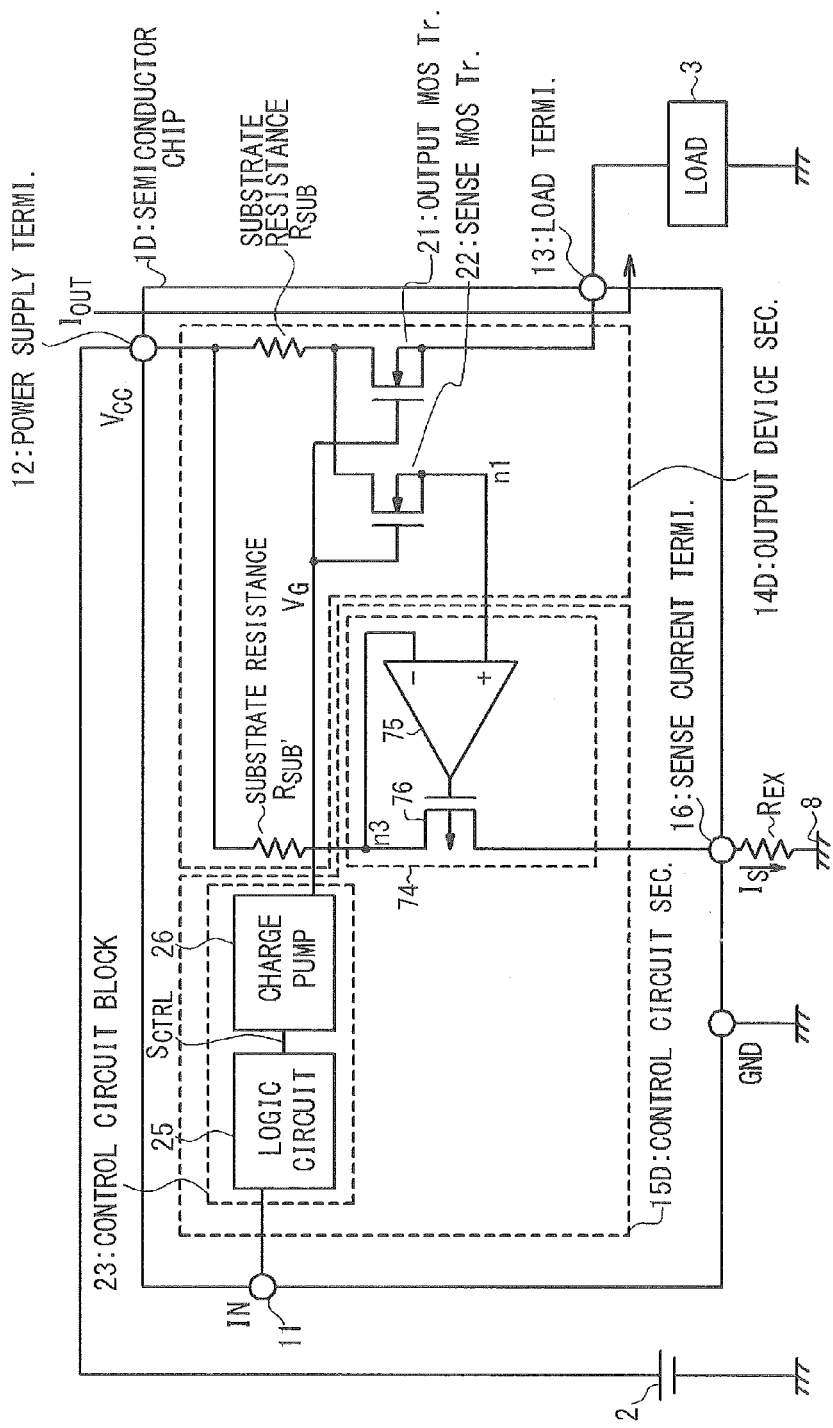
FIG. 24 is a diagram schematically showing the configuration of the semiconductor device in a fourth embodiment.

FIG. 24 is a diagram schematically showing the configuration of the semiconductor device in a fourth embodiment. As shown in FIG. 1, the semiconductor device of the fourth embodiment is a modification of the semiconductor device in the first embodiment and is similar in the point that the load current $I_{OUT}$ is detected in a high precision by taking out the voltage drop due to the substrate resistance $R_{SUB}$ in a high precision by using the sense MOS transistor 22. However, the semiconductor device in the fourth embodiment differs from the semiconductor device of the first embodiment in the point that the taken-out voltage to the node n1 is used for the realization of a current sense output function in a high precision, i.e. the generation of the sense current $I_S$ which is proportional to the load current $I_{OUT}$. Hereinafter, the semiconductor device of the fourth embodiment will be described in detail.

The semiconductor device of the fourth embodiment has a semiconductor chip 1D in which the output device section 14D and the control circuit section 15D are integrated. The output device section 14D has substantially the same configuration as that of the output device section 14 of the first embodiment, but differs from the output device section 14 in the configuration for taking an electrical connection with a node n3. Here, the node n3 is a node connected with the power supply terminal 12 (or the common drain electrode) through the substrate resistance $R_{SUB}'$ as an equivalent circuit. The structure for the electrical connection with the node n3 will be described later. That is, the node n3 also has a voltage which depends on the voltage of the power supply terminal 12 (or the common drain electrode) (or, the voltage corresponding to the voltage of the power supply terminal 12).

The control circuit section 15D includes a control circuit block 23 which has the same configuration as the first embodiment, and the sense amplifier circuit 74. In detail, the control circuit block 23 has the logic circuit 25 and the charge pump 26. The logic circuit 25 generates the control signal $S_{CTRL}$ in response to the external control signal IN, to control the charge pump 26. The charge pump 26 operates as a drive circuit to drive the gates of the output MOS transistor 21 and the sense MOS transistor 22 in response to the control signal $S_{CTRL}$ supplied from the logic circuit 25 and generates the gate voltage $V_G$ to be supplied to the gates of the output MOS transistor 21 and the sense MOS transistor 22.

The sense amplifier circuit 74 has a sense amplifier 75 and a PMOS transistor 76 and operates as a sense current control circuit to control a sense current $I_S$ according to a voltage difference between the node n1 and the node n3 in the voltage. The +input terminal (non-inversion input) of the sense amplifier 75 is connected with the node n1 and the −input terminal (inversion input) thereof is connected with the node n3. The output terminal of the sense amplifier 75 is connected with the gate of the PMOS transistor 76. The sense amplifier 75 operates as the voltage detecting circuit to output the voltage corresponding to the voltage difference between the voltage of the +input terminal (that is, the voltage of the node n1) and the voltage of the −input terminal (that is, the voltage of the node n3). The PMOS transistor 76 has a source connected with the node n3, a drain connected with the sense current terminal 16. The sense current terminal 16 is a terminal from which the sense current $I_S$ flows, and when an external resistance $R_{EX}$ is connected between the sense current terminal 16 and the ground terminal 8, the sense current $I_S$ flows through the external resistance $R_{EX}$. As mentioned later, the sense amplifier circuit 74 has a function of carrying out a negative feedback operation by using the voltage drop due to the substrate resistance $R_{SUB}'$ such that the voltage of the node n1 and the voltage of the node n3 are coincident with each other, and the sense current $I_S$ which is proportional to the load current $I_{OUT}$ is drawn out from the node n3 through this negative feedback operation.

Figure 25:
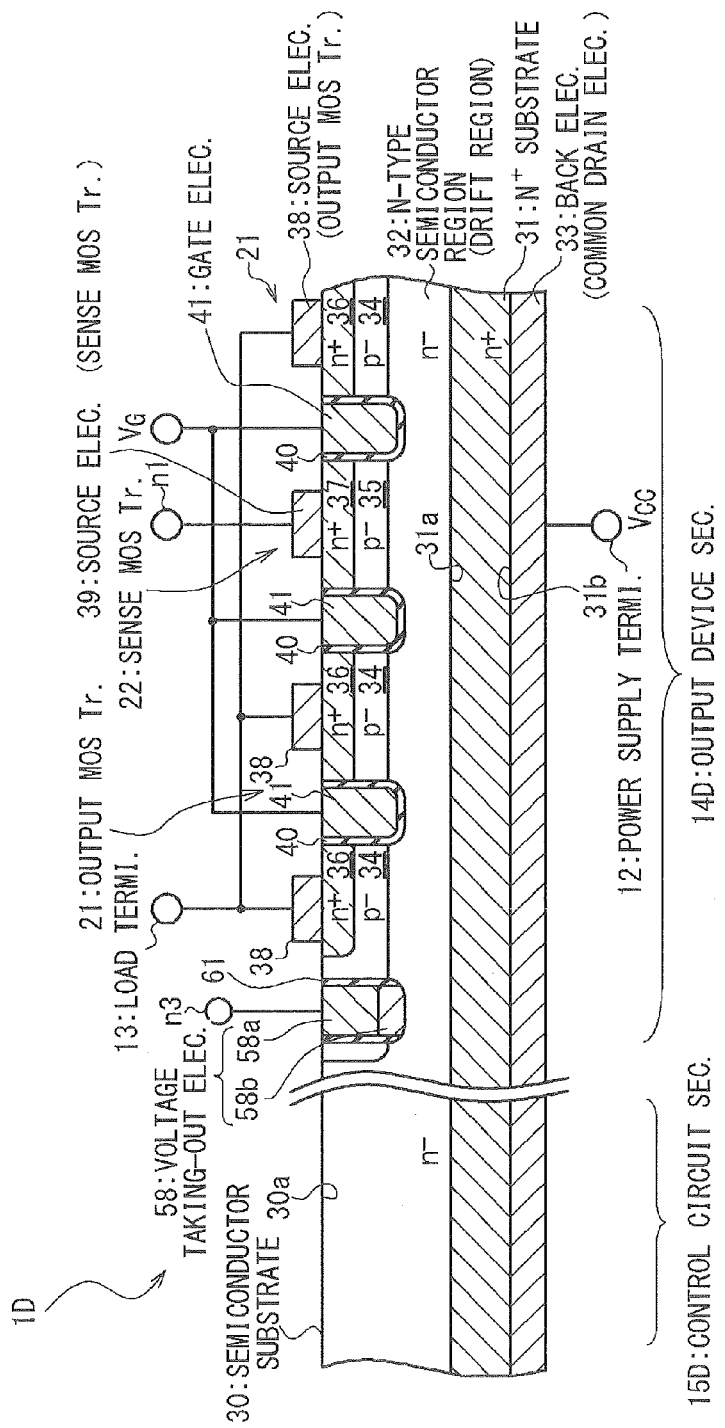
FIG. 25 is a sectional view showing the structure of the output device section and the control circuit section in the fourth embodiment.

FIG. 25 is a sectional view showing the structure of the semiconductor chip 1D in the fourth embodiment, especially the structure of the output device section 14D. The structure of the semiconductor chip 1D in the fourth embodiment is similar to the structure of the semiconductor chip 1 in the first embodiment, but different from the first embodiment in that the structure for electrical connection with the node n3 is provided whereas the structure for electrical connection with the node n2 is not provided.

In detail, a trench is formed in the semiconductor substrate 30 to pass through the P-type base region 34 from the front-side main surface to the N-type semiconductor region 32. An insulating film 61 is formed on the side of the trench and a remaining part of the trench is filled with the voltage taking-out electrode 58. The voltage taking-out electrode 58 has a metal section 58a and a polysilicon portion 58b. The polysilicon portion 58b is joined with the N-type semiconductor region 32 in the bottom of the trench and the metal portion 58a is joined with the polysilicon portion 58b. That is, the voltage taking-out electrode 58 is joined with the N-type semiconductor region 32 in the bottom of the trench. It is ideal that a position, in the depth direction, of the plane at which the voltage taking-out electrode 58 is connected with the N-type semiconductor region 32 is identical with the junction plane between the P-type base region 34 and the N-type semiconductor region 32. In such a structure, it is possible to directly take out the voltage of the surface plane of the N-type semiconductor region 32 in the bottom of the trench to the node n3. Note that the voltage taking-out electrode 58 is provided in the neighborhood of the output MOS transistor 21. As mentioned later, it is useful in improvement of the precision of the sense current $I_S$ that the voltage taking-out electrode 58 is provided in the neighborhood of the output MOS transistor 21.

In the embodiment, the voltage taking-out electrode 58 is formed in the following process. The trench to be filled or embedded with the voltage taking-out electrode 58 is formed simultaneously with the trench which is filled or embedded with the gate insulating film 40 and the gate electrode 41 (in the identical process). After the trench is formed, the gate insulating film 40 is formed over the whole of the surface of trench. Moreover, the gate insulating film 40 is removed only from the bottom of the trench to be filled with the voltage taking-out electrode 58. Thus, the trench becomes slightly deeper than the junction plane of the P-type base region 34 and the N-type semiconductor region 32, but an insulating film 61 is formed on the side of the trench to the position which is deeper than the junction plane so that the insulation between the voltage taking-out electrode 58 and the P-type base region 34 is secured. Thereafter, a polysilicon layer with impurity heavily doped is embedded in the inside of the trench to form the gate electrode 41. The polysilicon layer with the impurity heavily doped is embedded inside the trench in which the voltage taking-out electrode 58 should be embedded. However, almost part of the polysilicon layer is removed by etching, remaining the polysilicon layer of the thickness necessary to secure ohmic contact with the N-type semiconductor region 32. The remaining part is used as the polysilicon part 58b. Next, the remaining part of the trench is embedded with a metal part 58a. It is desirable that the voltage taking-out electrode 58 is a low resistance and it may be desirable to form the whole of electrode with metal in this viewpoint. However, because there is a fear that a contact resistance between the metal and the N-type semiconductor region 32 becomes high when the whole of voltage taking-out electrode 58 is formed of metal, the structure of the voltage taking-out electrode 58 of the metal part 58a and the polysilicon part 58b is used in the present embodiment. Note that the forming process of the voltage taking-out electrode 58 does not use the forming process of the gate electrode 41 and may be executed as another process.

Figure 26:
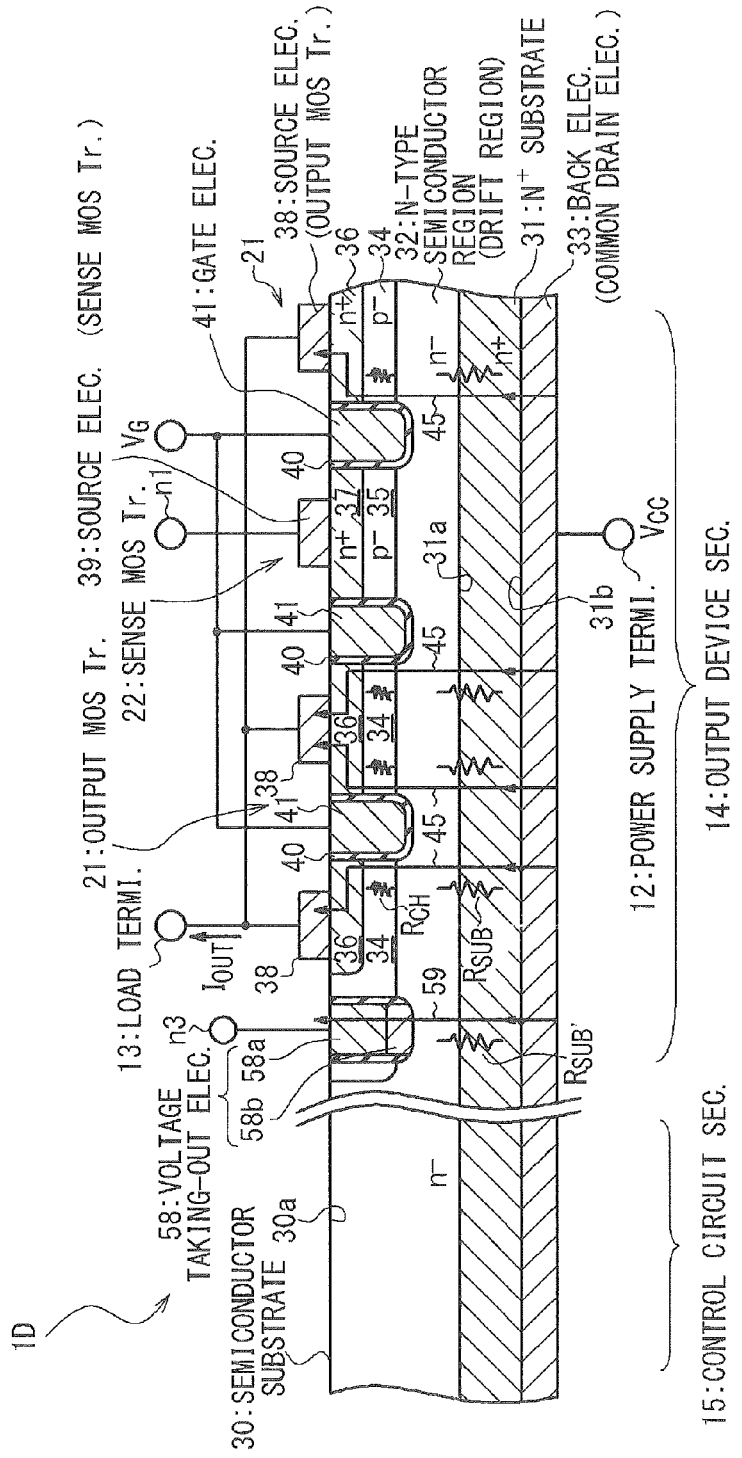
FIG. 26 is a sectional view showing a path through which the load current and the sense current flow in the output device section of the fourth embodiment.

FIG. 26 is a diagram showing a path through which the current flows, in the output device section 14D of the semiconductor chip 1D in the fourth embodiment. The path through which the load current $I_{OUT}$ flows in FIG. 26 is shown by an arrow 45 and the path through which the sense current $I_S$ flows is shown by an arrow 59.

The load current $I_{OUT}$ flows almost through the N$^+$ substrate 31 and the N-type semiconductor region 32 in a vertical direction (a direction which is orthogonal to the front-side main surface 31a of the N$^+$ substrate 31), and then flows into the N$_+$ diffusion layer 36 through a channel which is formed in the neighborhood of the surface of the P-type base region 34 opposing to the gate electrode 41. The load current $I_{OUT}$ which has flowed into the N$^+$ diffusion layer 36 flows into the load terminal 13 through the source electrode 38 from the N$^+$ diffusion layer 36, and is supplied to the load 3 connected with the load terminal 13.

On the other hand, the sense current $I_S$ almost flows into the voltage taking-out electrode 58 through the N$^+$ substrate 31 and the N-type semiconductor region 32 in a vertical direction and then flows into the node n3 from the voltage taking-out electrode 58. Therefore, the node n3 is electrically connected with the back electrode 33 through the substrate resistance $R_{SUB}'$. Here, when the trench filled with the voltage taking-out electrode 58 is formed simultaneously with the trench filled with the gate insulating film 40 and the gate electrode 41 (in the identical process), the depths of both trenches are substantially identical. In this case, the resistance per unit area in the vertical direction to the back surface of the semiconductor substrate 30 (back-side main surface 31b of the N$^+$ substrate 31) is substantially the same between the substrate resistance $R_{SUB}'$ and the substrate resistance $R_{SUB}$.

Next, the operation of the semiconductor device in the fourth embodiment will be described.

Referring to FIG. 24, it is supposed that the external control signal IN is set to the low level in the initial state. In this case, the control signal $S_{CTRL}$ is set to the low level by the logic circuit 25 and the charge pump 26 does not drive the gate electrode 41 of the output MOS transistor 21 and the sense MOS transistor 22. Therefore, the output MOS transistor 21 and the sense MOS transistor 22 are turned off and the load current $I_{OUT}$ does not flow.

When the external control signal IN is set to the high level, the output MOS transistor 21 and the sense MOS transistor 22 are turned on and the load current $I_{OUT}$ flows, like the semiconductor device of the first embodiment. At this time, a voltage which is substantially identical with the voltage at the boundary in the P-type base region 34 and the N-type semiconductor region 32 is taken out to the node n1.

On the other hand, the sense amplifier circuit 74 controls the sense current $I_S$ by carrying out a negative feedback operation in which the voltage of the node n1 and the voltage of the node n3 are made identical with each other by using a voltage drop due to the substrate resistance with the sense current $I_S$. Through this negative feedback operation, the voltage of the surface of the N-type semiconductor region 32 in the bottom of the trench filled with the voltage taking-out electrode 58 is controlled to be identical with the voltage of the node n1.

In this case, the magnitude of the sense current $I_S$ which is drawn out from the node n3 is shown with the following equation (2):

$$I_S = I_{OUT} \cdot R_{SUB}/R_{SUB}' \qquad (2)$$

where $R_{SUB}$ is a substrate resistance on the path of the load current $I_{OUT}$ which flows through the output MOS transistor 21, and $R_{SUB}'$ is a substrate resistance on the path of the sense current $I_S$ flows. The equation (2) means that the sense current $I_S$ which is proportional to the load current $I_{OUT}$ can be generated. Here, either of the substrate resistances $R_{SUB}$ and $R_{SUB}'$ has a fixed value determined based on the physical properties of the N$^+$ substrate 31 and the N-type semiconductor region 32, and the precision of a ratio of $R_{SUB}/R_{SUB}'$ is high. Therefore, according to the semiconductor device of the present embodiment, the sense current $I_S$ which is proportional to the load current $I_{OUT}$ can be generated in a high precision.

For example, a case will be considered where a ratio of the number of trenches filled with the gate insulating film 40 and the gate electrode 41 in the output MOS transistor 21 and the number of trenches filled with the voltage taking-out electrode 58 is 1000:1. In this case, the ratio of the substrate resistance $R_{SUB}'$ to the substrate resistance $R_{SUB}$ can be shown by the following equation (3):

$$R_{SUB}'/R_{SUB} = 1000 \qquad (3)$$

For example, when the substrate resistance $R_{SUB}$, is 5 m•, the substrate resistance $R_{SUB}'$ is 5 •.

When the load current $I_{OUT}$ which flows through the output MOS transistor is 10 A, the voltage drop due to the substrate resistance $R_{SUB}$ becomes 50 mV and the voltage of the node n1 becomes the voltage lower by 50 mV than the voltage of the back electrode 33 (the common drain electrode). As described above, the voltage of the node n3 through the negative feedback operation by the sense amplifier circuit 74 becomes lower by 50 mV than the voltage of the back electrode (the common drain electrode) in the same way. Because the substrate resistance $R_{SUB}'$ (that is, the resistance between the back electrode 33 and the node n3) is 5 •, the sense current $I_S$ which flows out from the sense current terminal 16 becomes 10 mA (=50 mV/5 •). In this way, according to the configuration of the semiconductor device of the present embodiment, the sense current $I_S$ which is proportional to the load current $I_{OUT}$ can be obtained in a high precision.

When the trench in which the voltage taking-out electrode 58 is embedded is formed simultaneously (in the identical process) with the trench filled with the gate insulating film 40 and the gate electrode 41, the depths of both of the trenches becomes substantially identical, and accordingly the structure having a high similarity can be formed. This contributes to the improvement of the precision of the proportional coefficient $R_{SUB}/R_{SUB}'$ of the sense current $I_S$ to the load current $I_{OUT}$. In addition, the temperature difference between the substrate resistances $R_{SUB}$ and $R_{SUB}'$ becomes small by arranging the voltage taking-out electrode 58 in a position in the neighborhood of the output MOS transistor 21 which is a main exothermic source and an influence of the temperature change can be restrained. This contributes to improvement of the precision by allowing the proportional coefficient $R_{SUB}/R_{SUB}'$ to be kept constant.

Figure 27:
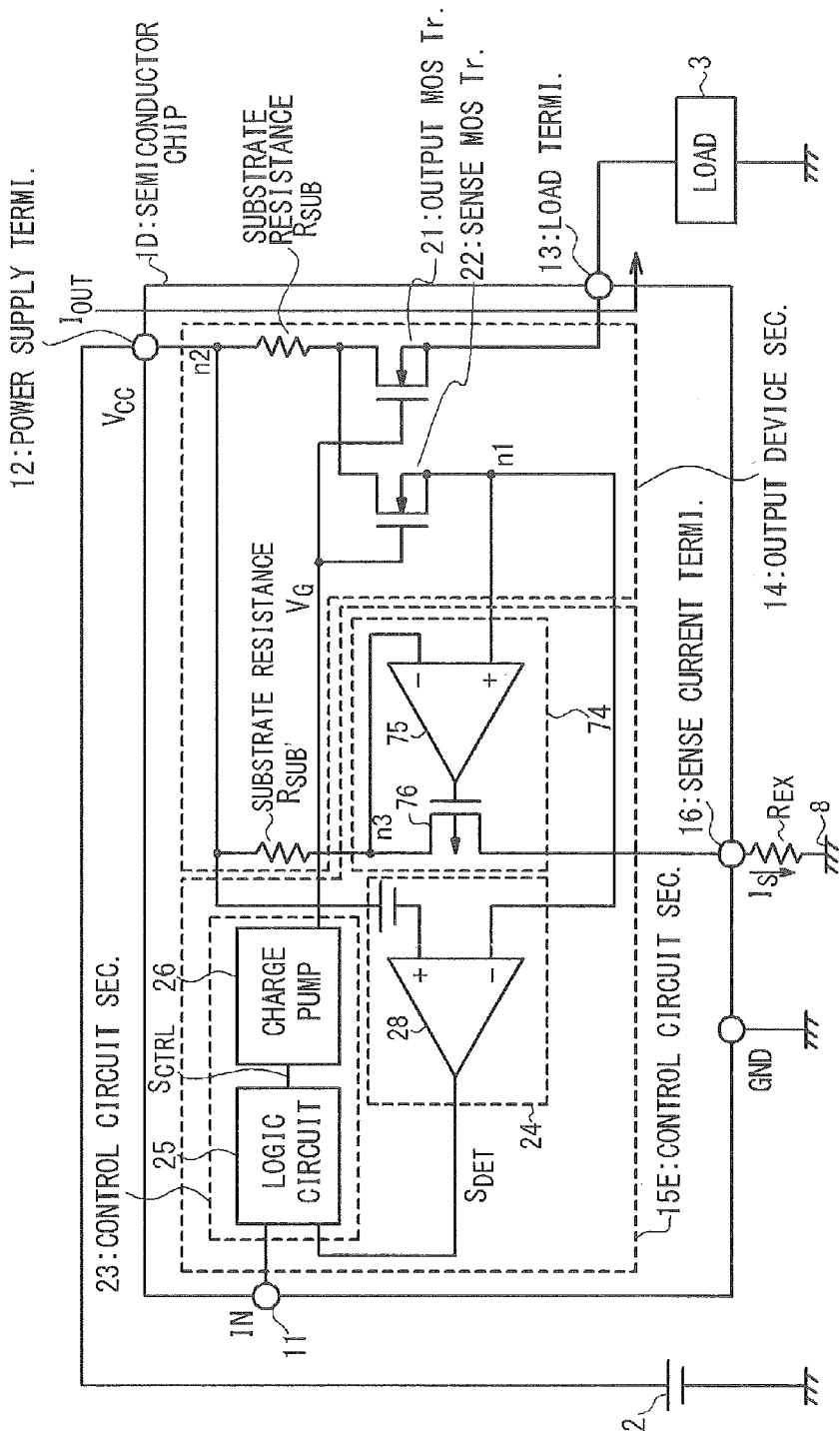
FIG. 27 is a diagram schematically showing a modification example of the configuration of the semiconductor device of the fourth embodiment.

Note that the first embodiment and the fourth embodiment can be combined. FIG. 27 is a circuit block diagram showing a configuration of the semiconductor device in which the first embodiment and the fourth embodiment are combined. The output device section 14D and the control circuit section 15E are integrated on the semiconductor chip 1E. The output device section 14D has the output MOS transistor 21 and the sense MOS transistor 22, and has the structure for the electrical connection with the node n3, as mentioned above. The control circuit section 15E has the control circuit block 23, the voltage detecting circuit 24 and the sense amplifier circuit 74. The configurations of the control circuit block 23 and the voltage detecting circuit 24 are as described in the first embodiment. Also, the configuration of sense amplifier circuit 74 is as described in the fourth embodiment.

Figure 28:
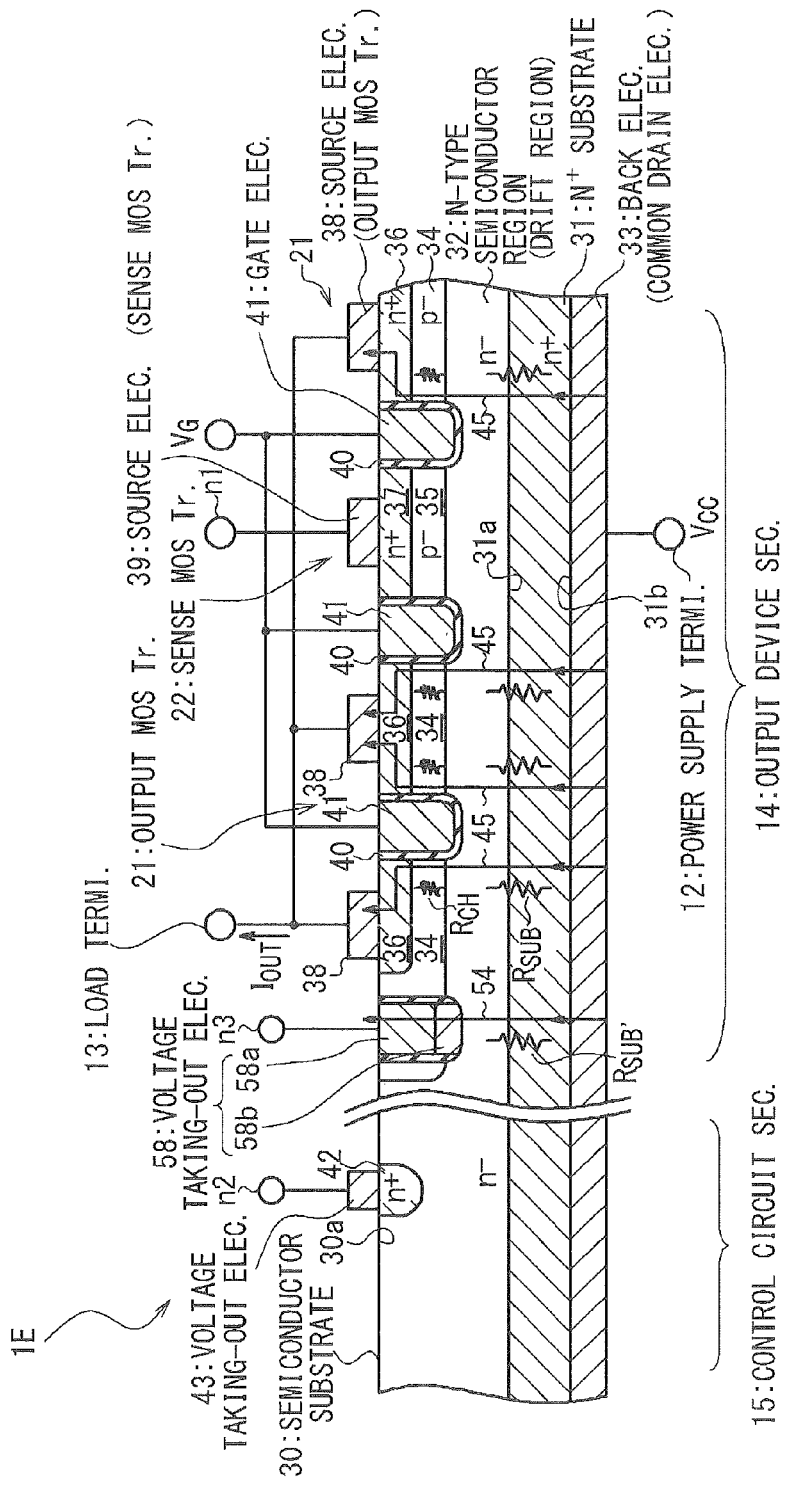
FIG. 28 is a sectional view showing the structure of the output device section and the control circuit section in the semiconductor device of FIG. 27.

FIG. 28 is a sectional view showing the configuration of the semiconductor chip 1E. In the semiconductor chip 1E, the configuration for the electrical connection with the node n3 is added to the configuration of the semiconductor chip 1 in the first embodiment. That is, in the output device section 14D, the trench is formed to pass through the P-type base region 34 to the N-type semiconductor region 32 from the front-side main surface of the semiconductor substrate 30 and the trench is filled with the voltage taking-out electrode 58. The voltage taking-out electrode 58 is connected with the node n3. In addition, in the control circuit section 15E, the $N^+$ diffusion layer 42 is formed on the surface of the N-type semiconductor region 32 and the voltage taking-out electrode 43 is joined with the $N^+$ diffusion layer 42. The voltage taking-out electrode 43 is connected with the node n2.

The semiconductor device having the configuration of FIG. 27 and FIG. 28 has the functions of both of the semiconductor device of the first embodiment and the semiconductor device of the fourth embodiment. The detection signal $S_{DET}$ is outputted to the logic circuit 25 according to the voltage between the node n1 and the node n2 (i.e. the load current $I_{OUT}$) and the operation of monitoring the load current $I_{OUT}$ is carried out by the logic circuit 25. For example, the operation to detect over-current and the operation to detect the light load or no load are carried out by the logic circuit 25. In addition, the sense current $I_S$ which is proportional to the load current $I_{OUT}$ is generated in a high precision by carrying out the negative feedback operation by the sense amplifier circuit 74 to equalize the voltage of the node n1 and the voltage of the node n3.

Note that the above-mentioned embodiments and modification examples may be combined in a range of no contradiction. For example, the output MOS transistor 21 and the sense MOS transistor 22 which have the structures shown in FIG. 10, FIG. 11, and FIG. 12 in the second to fourth embodiments may be used, and also the output IGBT 21A and the sense IGBT 22A which have the structure shown in FIG. 14 may be used. The output MOS transistor 21 and the sense MOS transistor 22 which have the structure shown in FIG. 10, FIG. 11, and FIG. 12 may be used. Also, the output IGBT 21A and the sense IGBT 22A which have the structure shown in FIG. 14 may be used. Also, the output device section 14 with the structure shown in FIG. 16 and FIG. 17 in the second to fourth embodiments may be used.

<Application to In-Vehicle Electronic System>

In the in-vehicle electronic system (an electronic system installed in a vehicle such as a car) in recent years, a request of the function safety is rising and it is required to detect the state of the load in a higher precision. Therefore, it is useful to apply the above-mentioned semiconductor device which can detect the state of the load in the higher precision, to the in-vehicle electronic system. For example, in this case, as the load to be driven, a lamp for the vehicle, a fan motor, and a sheet heater are exemplified.

A case where an extraordinary event is caused in the load in the in-vehicle electronic system to which the above-mentioned semiconductor device is applied, for example, when the light load state is caused due to a broken conductive wire or an over-load state is caused due to the formation of short-circuit, the extraordinary event of the load is detected by the above-mentioned semiconductor device. The occurrence of the extraordinary event of the load is notified to the controller, more specifically, the MCU (micro controller unit). The MCU controls the above-mentioned semiconductor device in response to the notice of the occurrence of the extraordinary event of the load to turn off the output MOS transistor 21, and thereby to secure the safety. Also, the MCU notifies the occurrence of the extraordinary event to an instrument cluster (instrument panel) provided for a driver seat so that a driver can recognize the extraordinary event. Also, the MCU may notify the occurrence of the extraordinary event to the in-vehicle failure diagnosis unit so that the in-vehicle failure diagnosis unit may store the occurrence of the extraordinary event and the situation of the extraordinary event.

Figure 29:
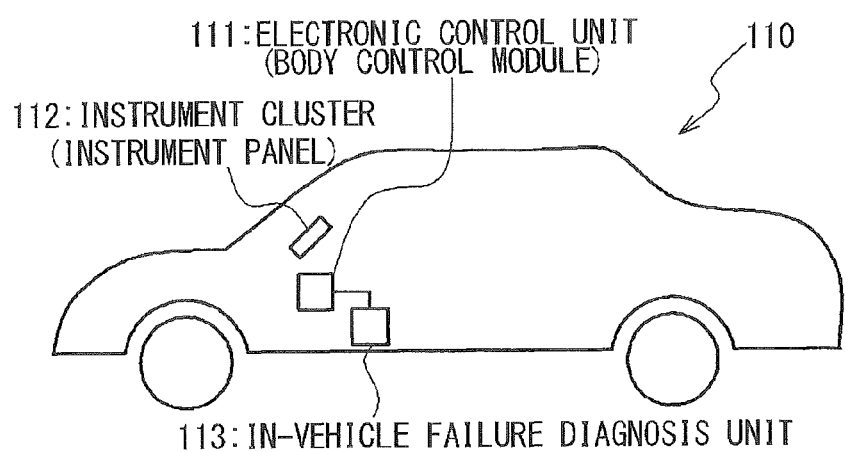
FIG. 29 is a conceptual diagram showing an example of an in-vehicle electronic system installed in a vehicle and applied with the semiconductor device of the first to fourth embodiment.

FIG. 29 shows the electronic control unit (ECU) 111 installed in a vehicle 110 as an example of the in-vehicle electronic system to which the semiconductor device in the above-mentioned embodiment is applied. The vehicle 110 is provided with various units actually but only the instrument cluster (the instrument panel) 112 and the in-vehicle failure diagnosis unit 113 are shown in FIG. 29.

Figure 30:
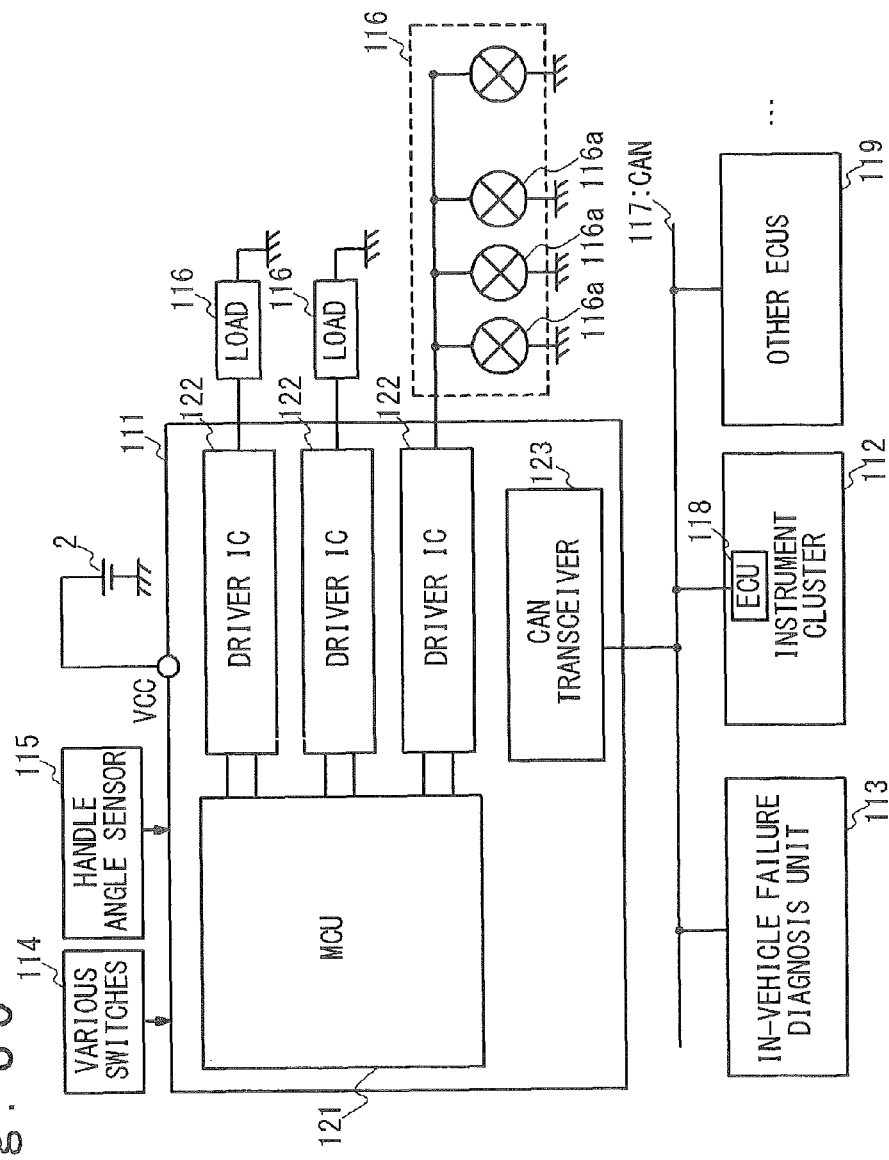
FIG. 30 is a block diagram showing an example of the configuration of an electronic control unit to which the semiconductor device of the first to fourth embodiments is applied.

FIG. 30 is a block diagram showing an example of the configuration of electronic control unit 111. The electronic control unit 111 of FIG. 30 is configured as a body control module. The electronic control unit 111 drives various types of loads 116 according to the operation of various types of switches 114 and the angle of a handle (a steering ring) detected by a handle angle sensor 115.

In the configuration of FIG. 30, the electronic control unit 111 includes a MCU 121, a driver IC 122 and a CAN (controller area network) transceiver 123. The MCU 121 controls the driver IC 122 to drive the load 116. The driver IC 122 drives the load 116 under the control by the MCU 121. The CAN transceiver 123 is used to carry out data communication with another equipment through a CAN 117. In the configuration of FIG. 30, the instrument cluster 112 and the in-vehicle failure diagnosis unit 113 are connected with the CAN 117. The MCU 121 of the electronic control unit 111 is possible to communicate with the instrument cluster 112 and the in-vehicle failure diagnosis unit 113. Another ECU may be connected with the CAN 117. In FIG. 30, the other ECU is referred to by reference numeral 119. The instrument cluster 112 is an equipment group used to tell the driver of the vehicle 110. The in-vehicle failure diagnosis unit 113 is a unit which is used to diagnose the failure of vehicle 110. The in-vehicle failure diagnosis unit 113 holds a log file, and when the occurrence of the extraordinary event in the vehicle 110 is notified from another equipment, the in-vehicle failure diagnosis unit 113 stores the extraordinary event log (for example, the date and time when the extraordinary event has occurred and the extraordinary contents) to the log file.

In the present embodiment, the semiconductor device (i.e. semiconductor chip 1, 1A to 1E) of the above-mentioned embodiments is used as the driver IC 122. The above-mentioned semiconductor device has a high detection precision of the load state, more specifically, the high detection precision of load current and it is desirable to use the semiconductor device as the driver IC 122 of the electronic control unit 111. For example, in case where the load 116 includes a plurality of lamps 116a connected in parallel, a failure can be detected by detecting the load current in the high detection precision when one of the plurality of lamps 116a is failed to an open state.

Figure 31:
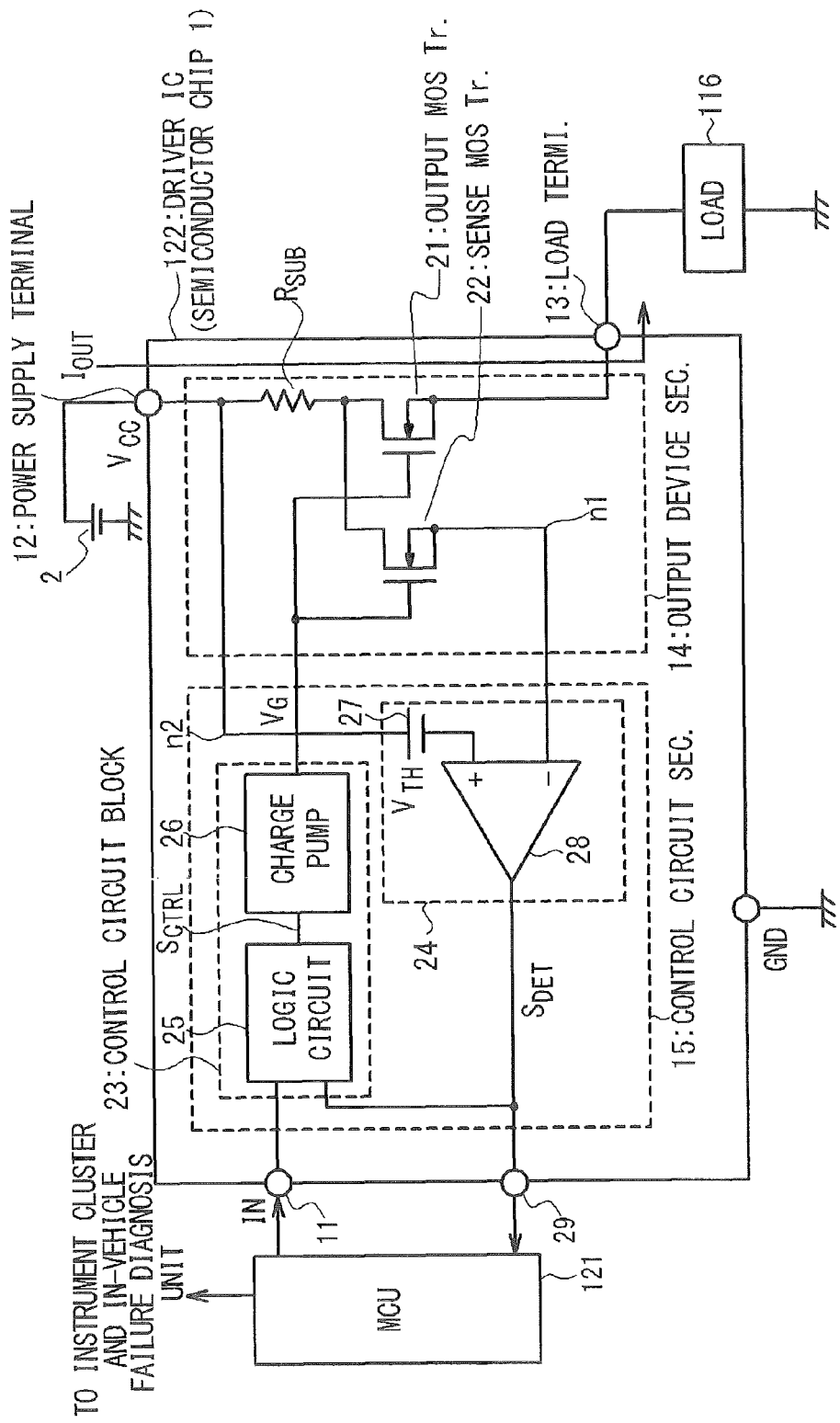
FIG. 31 is a block diagram showing a connection between a MCU and a driver IC when the semiconductor chip shown in FIG. 1 is used as the driver IC of the electronic control unit.

FIG. 31 is a diagram showing a connection between the MCU 121 and the driver IC 122 when the semiconductor chip 1 shown in FIG. 1 is used as the driver IC 122. The MCU 121 supplies an external control signal IN to the driver IC 122 (semiconductor chip 1) to control the ON/OFF state of the output MOS transistor 21 of the driver IC 122. On the other hand, a diagnosis terminal 29 is provided in the driver IC 122 to output the detection signal $S_{DET}$ to the MCU 121. The MCU 121 monitors the detection signal $S_{DET}$ and detects the extraordinary event of the load 116.

Figure 32:
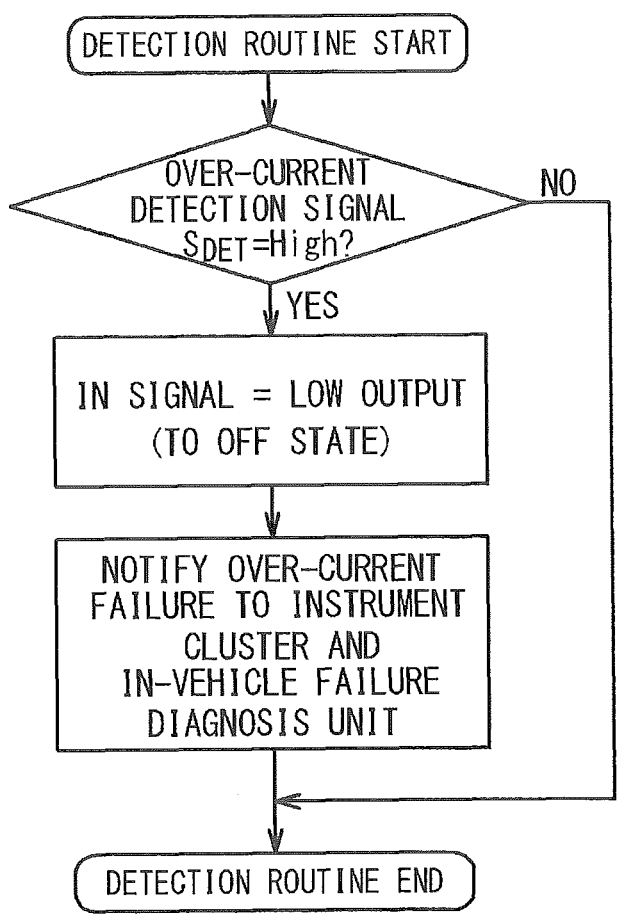
FIG. 32 is a flow chart showing an example of the operation of the MCU when the configuration of FIG. 31 is adopted.

In one embodiment, the MCU 121 may carry out an operation of detecting the generation of the over-current by using detection signal $S_{DET}$. In this case, the set threshold voltage VTH is set according to the equation (1) based on the set value $I_{OUT}$* which is used in case of the detection of the over-current. FIG. 32 is a flow chart showing the operation of the MCU 121 when detecting the generation of the over-current by using the detection signal $S_{DET}$. It is supposed that in the initial state, the external control signal IN is in the high level and the output MOS transistor 21 is in the ON state. In this state, the load current $I_{OUT}$ is supplied to the load 116.

The MCU 121 executes a detection routine at appropriate timing to detect the generation of the over-current. When the detection routine is started, the MCU 121 detects the signal level of the detection signal $S_{DET}$ outputted from the driver IC 122 (Step S01). When the detection signal $S_{DET}$ is in the low level, the detection routine ends just as it is.

When the detection signal $S_{DET}$ is in the high level, i.e. the load current $I_{OUT}$ is larger than the set value $I_{OUT}$*, the MCU 121 sets the external control signal IN to the low level and to turn off the output MOS transistor 21 (Step S02). Thus, the supply of the load current $I_{OUT}$ to the load 116 is stopped.

Moreover, the MCU 121 notifies the generation of the over-current to the instrument cluster 112 and the in-vehicle failure diagnosis unit 113 (Step S03). The ECU 118 of the instrument cluster 112 displays the generation of the over-current by using a predetermined equipment (e.g. a pilot lamp) which is contained in the instrument cluster 112. Also, the in-vehicle failure diagnosis unit 113 records the generation of the over-current in a log file. When the above operation completes, the execution of the detection routine ends. A service engineer who carries out the repair and check of the vehicle 110 can know that the extraordinary event such as the generation of the over-current is generated in the load 116 by checking the log file of the in-vehicle failure diagnosis unit 113.

Figure 33:
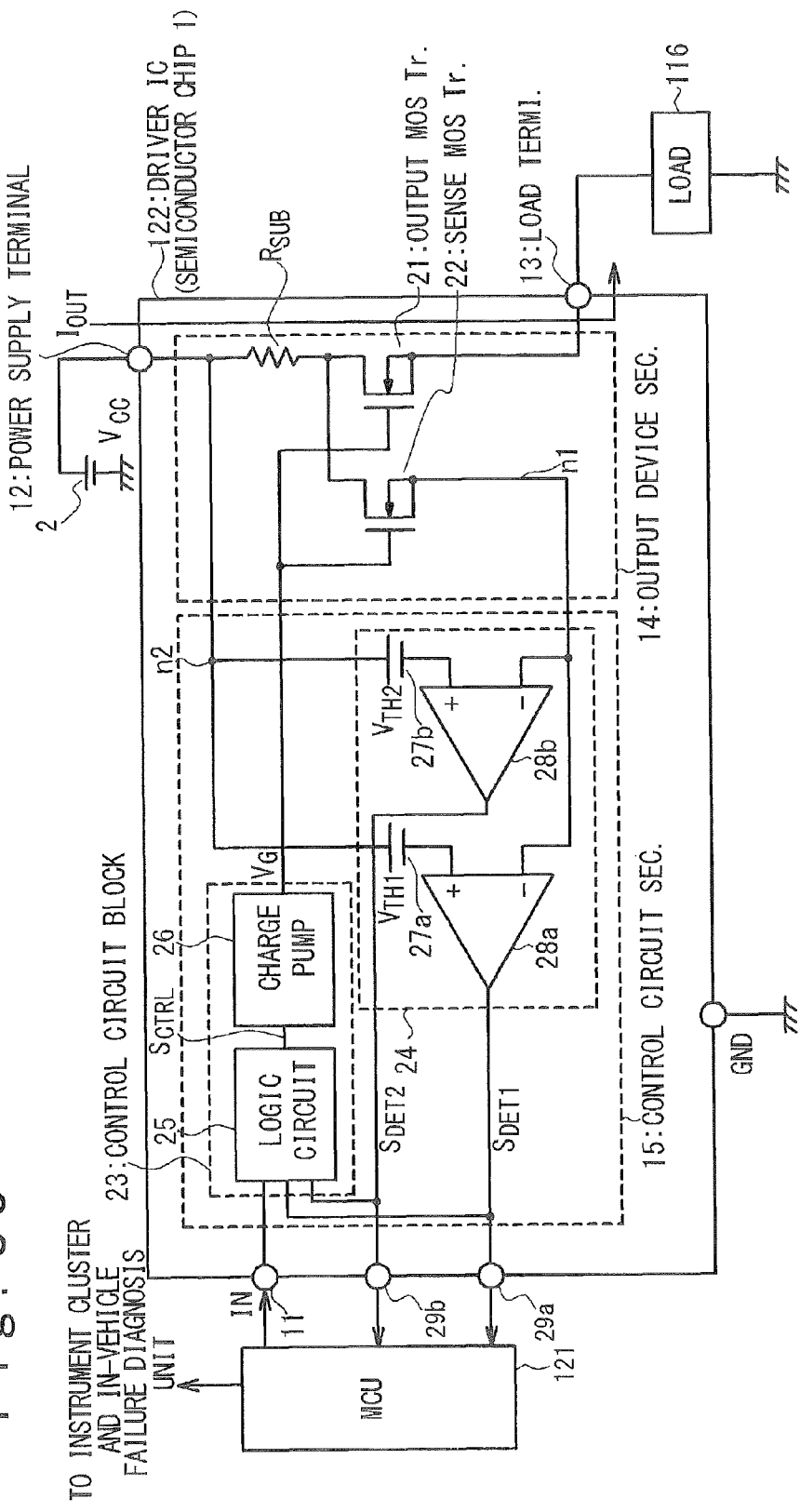
FIG. 33 is a block diagram showing a connection between the MCU and the driver IC when the semiconductor chip shown in FIG. 9 is used as the driver IC of the electronic control unit.

FIG. 33 is a diagram showing a connection between the MCU 121 and the driver IC 122 when the semiconductor chip 1 shown in FIG. 9 is used as the driver IC 122. The MCU 121 supplies the external control signal IN to the driver IC 122 (semiconductor chip 1) to control the ON/OFF state of the output MOS transistor 21 of the driver IC 122. On the other hand, a diagnosis terminal 29a to output the detection signal $S_{DET1}$ to the MCU 121 and a diagnosis terminal 29b to output the detection signal $S_{DET2}$ to the MCU 121 are provided for the semiconductor chip 1. The MCU 121 monitors the detection signals $S_{DET1}$ and $S_{DET2}$ and detects the extraordinary event of the load 116.

In one embodiment, the MCU 121 may carry out an operation of detecting the generation of the over-current using the detection signal $S_{DET1}$ and detecting the generation of a light load state by using the detection signal $S_{DET2}$. In this case, the set threshold voltage $V_{TH1}$ is set according to the equation (1) based on the set value $I_{OUT1}$* which is used in case of the detection of the over-current and the set threshold voltage $V_{TH2}$ is set according to the equation (1) based on the set value $I_{OUT2}$* which is used in case of the detection of the light load state. Here, the following relations are established in the set values $$I_{OUT1}^*, I_{OUT2}^*: I_{OUT2}^* < I_{OUT1}^* \qquad (4)$$

In this case, $$V_{TH2} < V_{TH1} \qquad (5)$$

is met.

Figure 34:
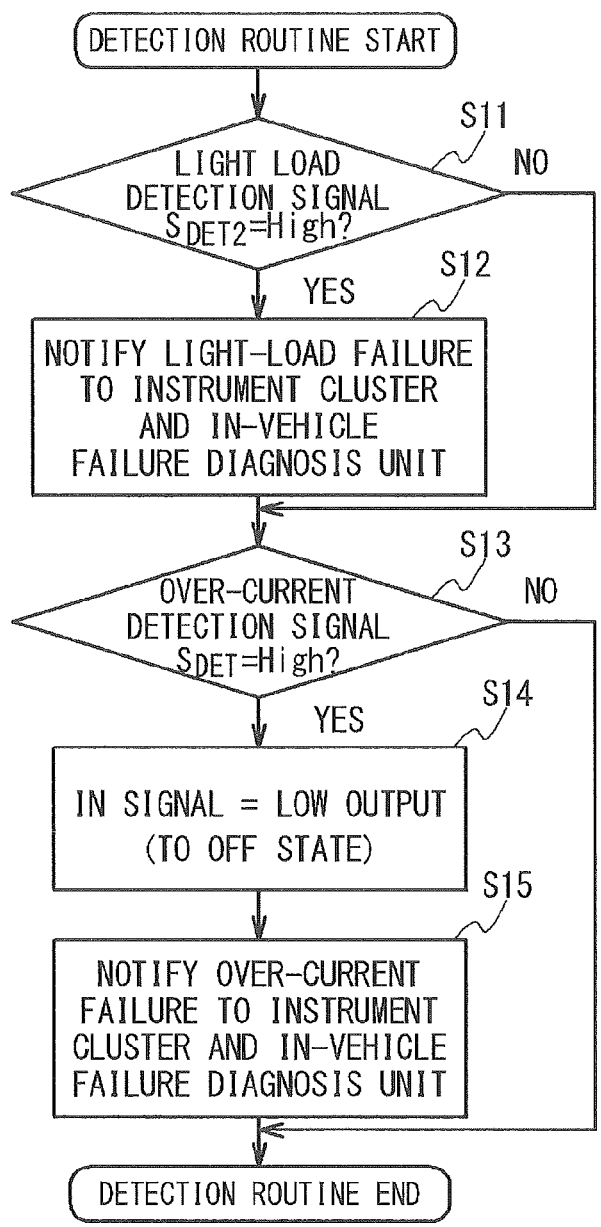
FIG. 34 is a flow chart showing an example of the operation of the MCU when the configuration of FIG. 33 is adopted.

FIG. 34 is a flow chart showing the operation of the MCU 121 when detecting the generation of the over-current by using the detection signal $S_{DET1}$ and detecting the generation of the light load state by using the detection signal $S_{DET2}$. It is supposed that in the initial state, the external control signal IN is in the high level and the output MOS transistor 21 is in the ON state. In this state, the load current $I_{OUT}$ is supplied to the load 116.

The MCU 121 executes a detection routine at appropriate timing. When the detection routine is started, the MCU 121 detects the signal level of the detection signal $S_{DET2}$ outputted from the driver IC 122 (Step S11). When the detection signal $S_{DET2}$ is in the low level, i.e. the load current $I_{OUT}$ is smaller than the set value $I_{OUT2}*$, the MCU 121 notifies the generation of the light load state to the instrument cluster 112 and the in-vehicle failure diagnosis unit 113 (Step S12). The ECU 118 of the instrument cluster 112 displays the generation of the light load state by using a predetermined equipment (e.g. a pilot lamp) which is contained in the instrument cluster 112. Also, the in-vehicle failure diagnosis unit 113 records the generation of the light load state in the log file. After that, the detection routine advances to a step S13. Note that the detection signal $S_{DET2}$ is in the high level, the detection routine advances to the step S13 without executing a step S12.

Moreover, the MCU 121 detects the signal level of the detection signal $S_{DET1}$ outputted from the driver IC 122 (Step S13). The detection routine ends just as it is when the detection signal $S_{DET1}$ is in the low level, i.e. the load current $I_{OUT}$ is smaller than the set value $I_{OUT1}*$.

When the detection signal $S_{DET1}$ is in the high level, i.e. the load current $I_{OUT}$ is larger than the set value $I_{OUT1}*$, the MCU 121 sets the external control signal IN to the low level to turn off the output MOS transistor 21 (Step S14). Thus, the supply of the load current $I_{OUT}$ to the load 116 is stopped.

Moreover, the MCU 121 notifies the generation of the over-current to the instrument cluster 112 and the in-vehicle failure diagnosis unit 113 (Step S15). The ECU 118 of the instrument cluster 112 displays the generation of the over-current by using a predetermined equipment (e.g. a pilot lamp) which is contained in the instrument cluster 112. Also, the in-vehicle failure diagnosis unit 113 records the generation of the over-current in the log file. When the above operation completes, the execution of the detection routine ends.

A service engineer who carries out the repair and check of the vehicle 110 can know the generation of the light load state and the generation of the over-current by checking the log file of the in-vehicle failure diagnosis unit 113.

Figure 35:
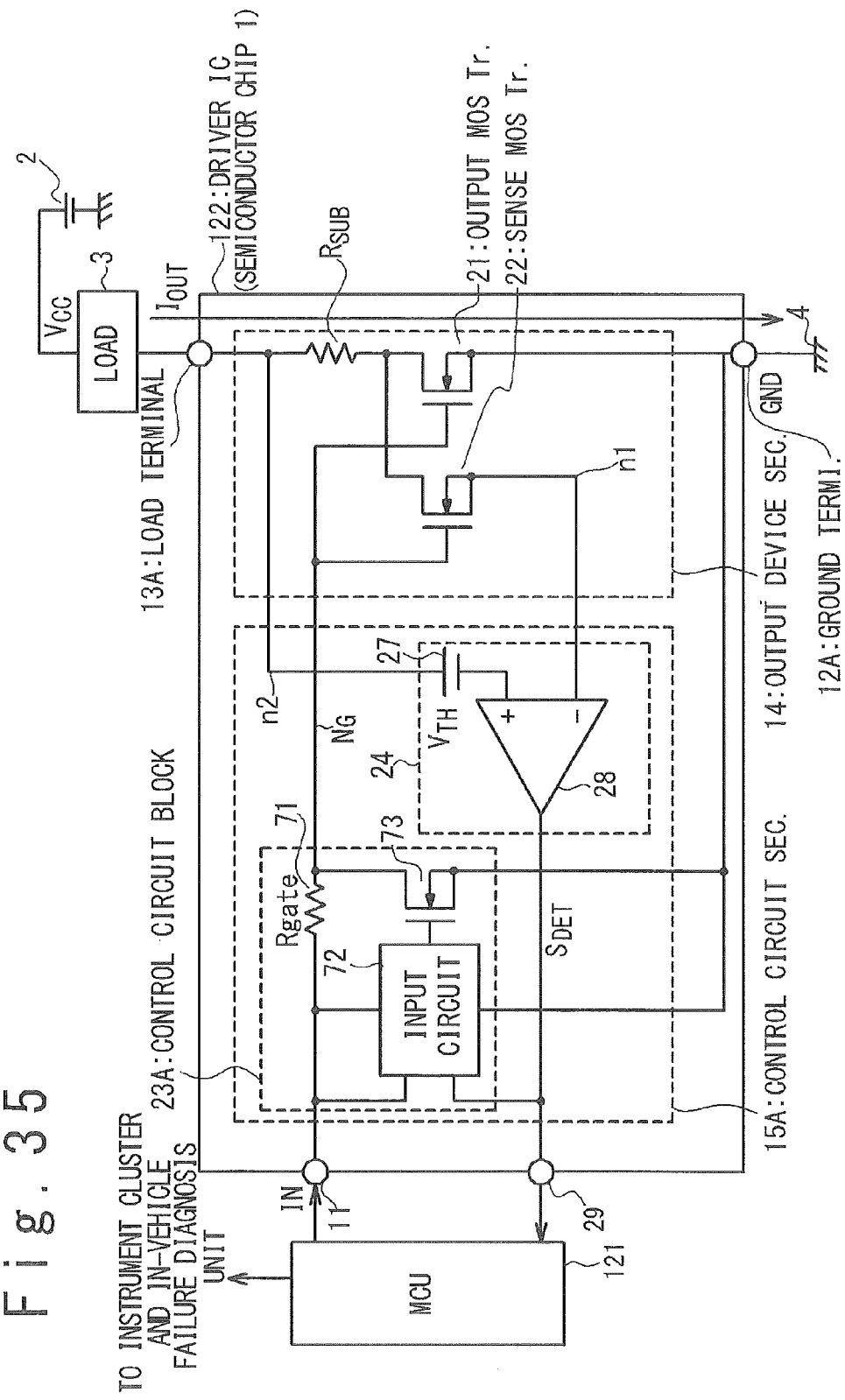
FIG. 35 is a block diagram showing a connection between the MCU and the driver IC when the semiconductor chip shown in FIG. 18 is used as the driver IC of the electronic control unit.

FIG. 35 is a diagram showing a connection between the MCU 121 and the driver IC 122 when the semiconductor chip 1A shown in FIG. 18 is used as the driver IC 122. The MCU 121 supplies the external control signal IN to the driver IC 122 (semiconductor chip 1A) to control the ON/OFF of the output MOS transistor 21 of the driver IC 122. On the other hand, the diagnosis terminal 29 is provided for the semiconductor chip 1A to output the detection signal $S_{DET}$ to the MCU 121. The MCU 121 monitors the detection signal $S_{DET}$ to detect an extraordinary event of the load 116.

In the configuration of FIG. 35, the generation of over-current may be detected based on the detection signal $S_{DET}$. In this case, the set threshold voltage VTH is set according to the equation (1) based on the set value $I_{OUT}*$ which is used in case of the detection of the over-current. Also, the generation of the light load state may be detected based on the detection signal $S_{DET}$. In this case, the set threshold voltage VTH is set according to the equation (1) based on the set value $I_{OUT}*$ which is used in case of detection of the light load state.

Figure 36:
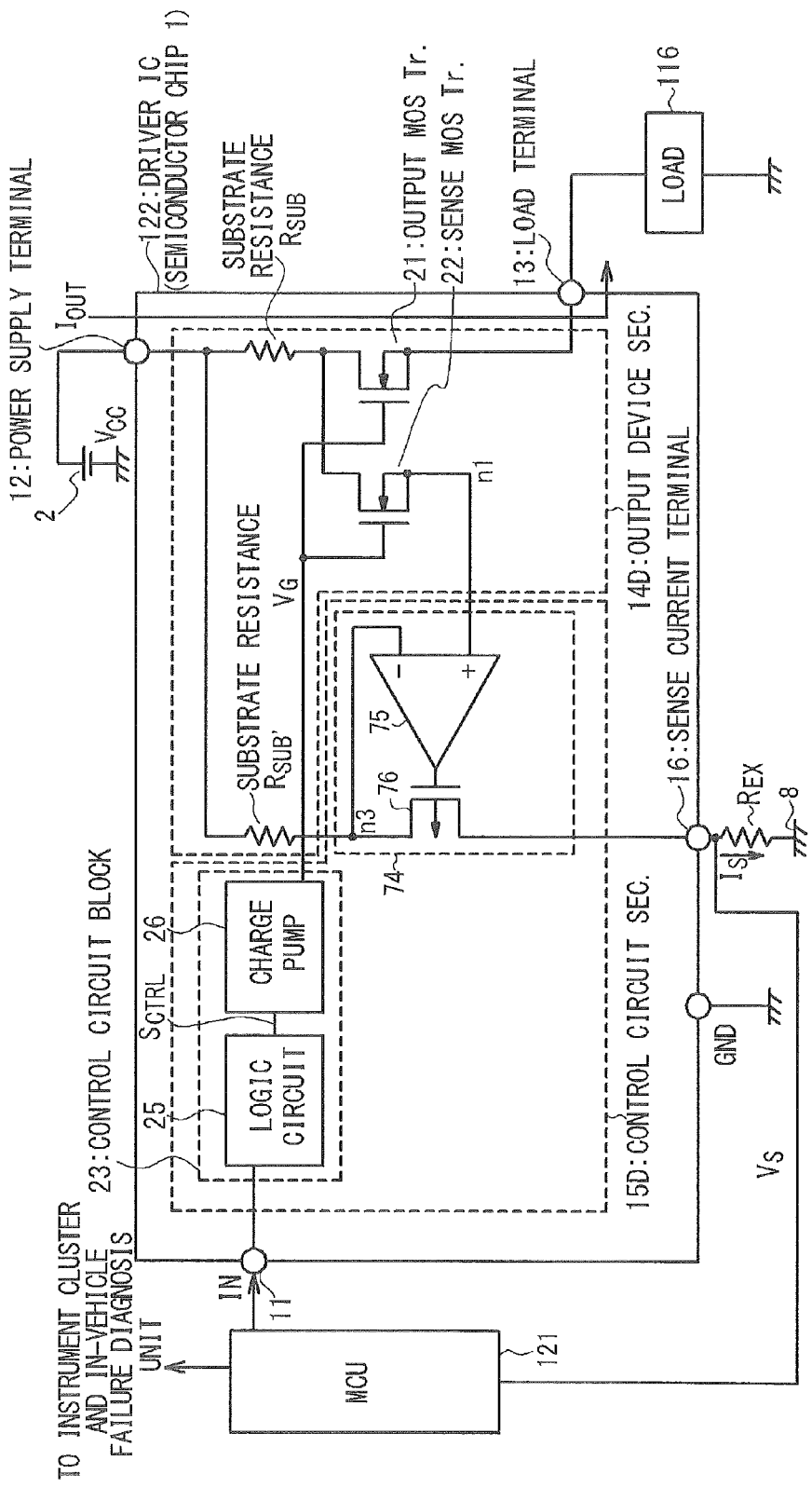
FIG. 36 is a block diagram showing a connection between the MCU and the driver IC when the semiconductor chip shown in FIG. 24 is used as the driver IC of the electronic control unit.

FIG. 36 is a diagram showing a connection between the MCU 121 and the driver IC 122 when the semiconductor chip 1D shown in FIG. 24 is used as the driver IC 122. The MCU 121 supplies the external control signal IN to the driver IC 122 (semiconductor chip 1D) to control the ON/OFF state of the output MOS transistor 21 of the driver IC 122. On the other hand, the MCU 121 monitors the sense current IS which is outputted from the sense current terminal 16 of the driver IC 122. In detail, in the configuration of FIG. 36, an external resistance REX is connected between the sense current terminal 16 and the ground terminal 8, and the MCU 121 monitors the sense current $I_S$ by monitoring the sense voltage $V_S$ generated when the sense current $I_S$ flows through the external resistance REX. The sense voltage $V_S$ is a voltage corresponding to the sense current $I_S$. The MCU 121 detects an extraordinary event of the load 116 from the voltage level of the sense voltage $V_S$, i.e. the current level of the sense current $I_S$.

In one embodiment, the MCU 121 may carry out an operation of detecting the generation of the over-current and the generation of the light load state based on the sense voltage $V_S$ (i.e. the sense current $I_S$). In this case, an over-current threshold (a threshold of the sense voltage $V_S$ to detect the over-current) and a light load threshold (a threshold of the sense voltage $V_S$ to detect the light load) are set to the MCU 121.

Figure 37:
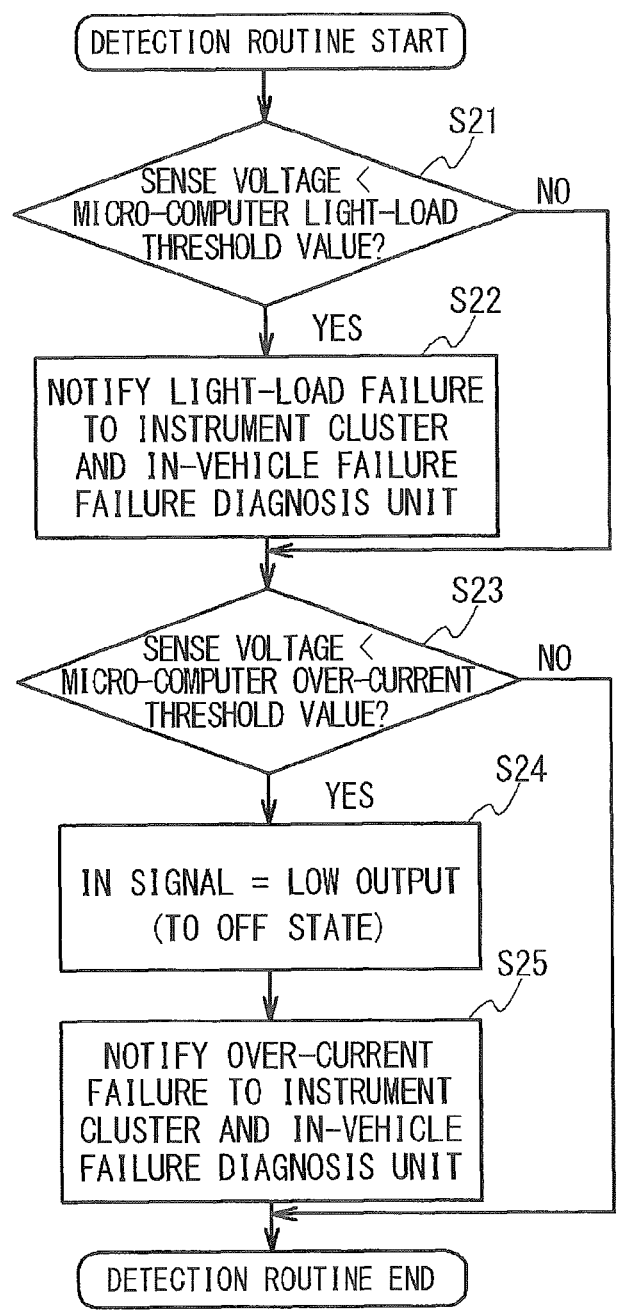
FIG. 37 is a flow chart showing an example of the operation of the MCU when the configuration of FIG. 36 is adopted.

FIG. 37 is a flow chart showing the operation of the MCU 121 when detecting the generation of the over-current and the generation of the light load state based on the sense voltage $V_S$ (i.e. the sense current $I_S$). It is supposed that the external control signal IN is in the high level and the output MOS transistor 21 is in the ON state. In this state, the load current $I_{OUT}$ is supplied to the load 116.

The MCU 121 executes a detection routine in appropriate timing. When the detection routine is started, the MCU 121 detects the voltage level of the sense voltage $V_S$ and compares the detected sense voltage $V_S$ with the light load threshold (Step S21).

When the sense voltage $V_S$ is lower than the light load threshold, that is, when the load current $I_{OUT}$ is smaller than the set value (a first set value) as a reference for determining the light load, the MCU 121 notifies the generation of the light load state to the instrument cluster 112 and the in-vehicle failure diagnosis unit 113 (Step S22). The ECU 118 of the instrument cluster 112 displays the generation of the light load state by using a predetermined equipment (e.g. a pilot lamp) which is contained in the instrument cluster 112. Also, the in-vehicle failure diagnosis unit 113 records the generation of the light load state in the log file. After that, the detection routine advances to a step S23. Note that when the sense voltage $V_S$ is higher than the light load threshold, the detection routine advances to the step S23 without executing a step S22.

Moreover, the MCU 121 compares the sense voltage $V_S$ with the over-current threshold (Step S23). In case where the sense voltage $V_S$ is lower than the over-current threshold, i.e. the load current $I_{OUT}$ is smaller than the set value (a second set value) as a reference for determining the over-current, the detection routine ends just as it is. Note that the set value (the second set value) as the reference for determining the over-current is greater than the set value (the first set value) as the reference for determining the light load.

In case where the sense voltage $V_S$ is higher than the over-current threshold, i.e. the load current $I_{OUT}$ is greater than the set value (the second set value) as the reference for determining the over-current, the MCU 121 sets the external control signal IN to the low level to turn off the output MOS transistor 21 (Step S24). Thus, the supply of the load current $I_{OUT}$ to the load 116 is stopped.

Moreover, the MCU 121 notifies the generation of the over-current to the instrument cluster 112 and the in-vehicle failure diagnosis unit 113 (Step S25). The ECU 118 of the instrument cluster 112 displays the generation of the over-current by using a predetermined equipment (e.g. a pilot lamp) which is contained in the instrument cluster 112. Also, the in-vehicle failure diagnosis unit 113 records the generation of the over-current and the value of the sense voltage $V_S$ in such a case (that is, a value of the sense current $I_S$) in the log file. When the above operation completes, the execution of the detection routine ends.

The service engineer who carries out the repair and check of the vehicle 110 can know the generation of the light load state and the generation of the over-current by checking the log file of the in-vehicle failure diagnosis unit 113.

Figure 38:
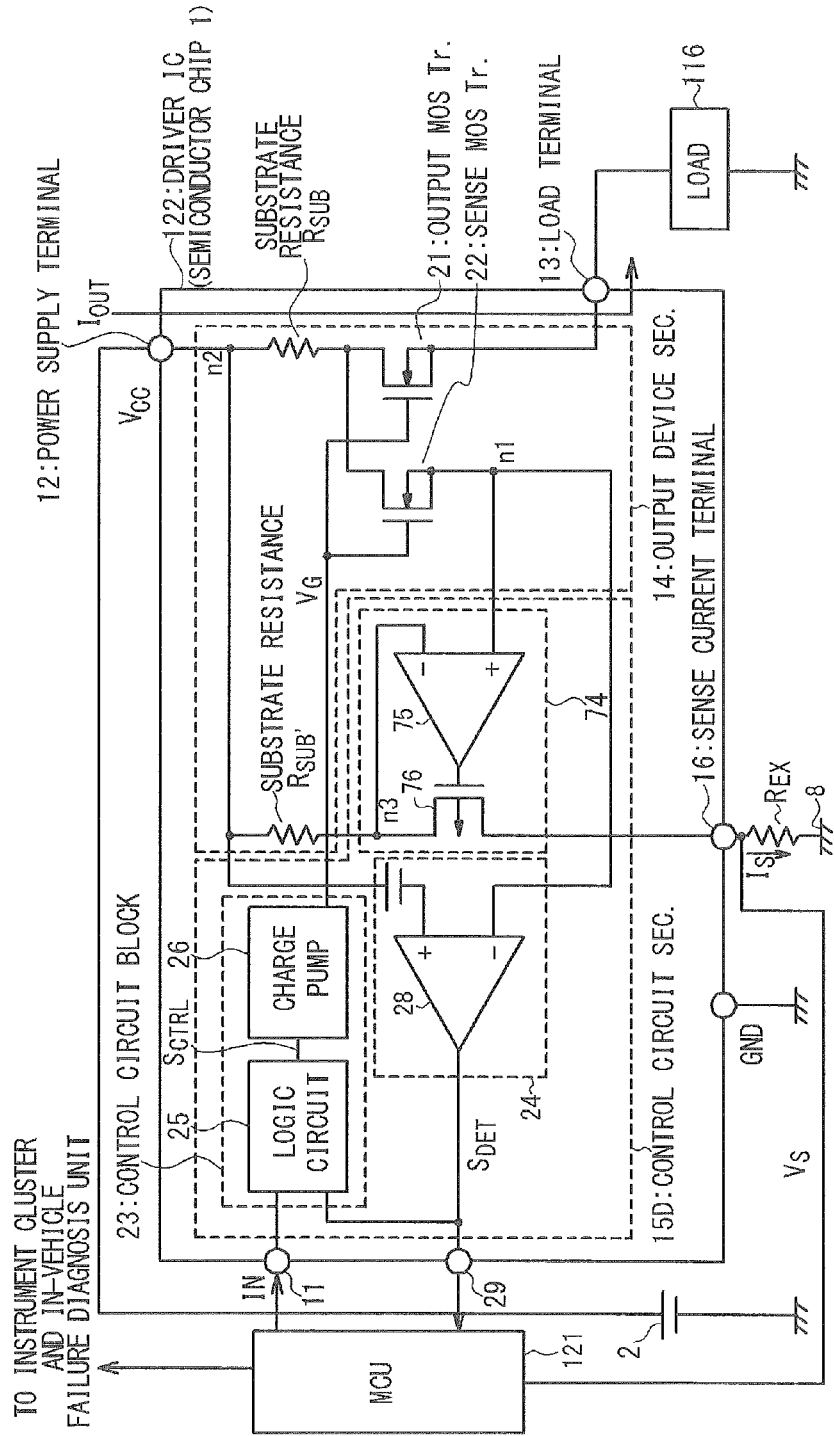
FIG. 38 is a block diagram showing a connection between the MCU and the driver IC when the semiconductor chip shown in FIG. 27 is used as the driver IC of the electronic control unit.

FIG. 38 is a diagram showing a connection between the MCU 121 and the driver IC 122 when the semiconductor chip 1D shown in FIG. 27 is used as the driver IC 122. The MCU 121 supplies the external control signal IN to the driver IC 122 (semiconductor chip 1D) to control the ON/OFF state of the output MOS transistor 21 of the driver IC 122. The diagnosis terminal 29 to output the detection signal $S_{DET}$ to the MCU 121 is provided in the driver IC 122 in addition to the sense current terminal 16 which outputs the sense current $I_S$. The MCU 121 monitors the sense current $I_S$ and the detection signal $S_{DET}$ to detect an extraordinary event of the load 116. Here, in the configuration of FIG. 38, the external resistance REX is connected between the sense current terminal 16 and the ground terminal 8. The MCU 121 monitors the sense current $I_S$ by monitoring the sense voltage $V_S$ generated when the sense current $I_S$ flows through the external resistance REX.

In one embodiment, the MCU 121 may carry out an operation of detecting the generation of the over-current based on the detection signal $S_{DET}$ and detecting the generation of the light load state based on the sense voltage $V_S$ (i.e. the sense current $I_S$). In this case, a light load threshold (a threshold of the sense voltage $V_S$ to detect the light load state) is set to the MCU 121. Also, the MCU 121 may carry out the operation of detecting the generation of the over-current based on the sense voltage $V_S$ (i.e. the sense current $I_S$) and detecting the generation of the light load state based on the detection signal $S_{DET}$. In this case, the over-current threshold (a threshold of the sense voltage $V_S$ to detect the over-current) is set to the MCU 121.

In the above, application examples of the semiconductor device of the present invention have been specifically described but it could be easily understood to the skilled person in the art that the semiconductor device of the present invention can be applied to various application fields.

The present invention has been specifically described based on the above embodiments. However, the present invention is not limited to the embodiments and various modifications can be accomplished in a range not apart from the scope of the present invention.

What is claimed is:

1. A semiconductor device which is used to supply a load current to a load, comprising:
    a first semiconductor region of a first conductive type;
    a common drain electrode electrically connected with the first semiconductor region;
    a second semiconductor region joined with the first semiconductor region and being of a second conductive type which is different from the first conductive type;
    a first diffusion layer formed in the second semiconductor region, heavily doped with impurity of the first conductive type, and functioning as a source of a first transistor;
    a third semiconductor region of the second conductive type joined with the first semiconductor region;
    a second diffusion layer formed in the third semiconductor region, heavily doped with impurity of the first conductive type, and functioning as a source of a second transistor;
    a gate insulating film;
    a gate electrode disposed to oppose to the first semiconductor region, the second semiconductor region and the third semiconductor region through the gate insulating film; and
    a voltage detecting circuit,
    wherein the load current flows between the common drain electrode and the first diffusion layer, and
    wherein the voltage detecting circuit generates a detection signal in response to a voltage between the second diffusion layer and a voltage taking-out electrode formed to have a same voltage as that of the common drain electrode or a voltage corresponding to the voltage of the common drain electrode.

2. The semiconductor device according to claim 1, further comprising:
    a third diffusion layer formed in the first semiconductor region, and heavily doped with the impurity of the first conductive type,
    wherein the voltage taking-out electrode is joined with the third diffusion layer.

3. The semiconductor device according to claim 1, wherein the voltage detecting circuit generates the detection signal based on whether or not the voltage between the voltage taking-out electrode and the second diffusion layer is higher than a predetermined set threshold voltage.

4. The semiconductor device according to claim 3, further comprising:
    a logic circuit configured to control a voltage of the gate electrode in response to an external control signal,
    wherein the logic circuit controls the voltage of the gate electrode to turn off the first transistor and the second transistor in response to the detection signal regardless of the external control signal when the voltage between the voltage taking-out electrode and the second diffusion layer is higher than the set threshold voltage.

5. The semiconductor device according to claim 3, further comprising:
    a logic circuit configured to output an error signal to a specific external terminal in response to the detection signal, when the voltage between the voltage taking-out electrode and the second diffusion layer is not higher than the set threshold voltage.

6. The semiconductor device according to claim 1, wherein the first semiconductor region, the second semiconductor region and the third semiconductor region are integrated on a same semiconductor substrate,
    wherein the voltage detecting circuit has circuit elements integrated in a surface section of the semiconductor substrate.

7. The semiconductor device according to claim 1, further comprising:
    a fourth semiconductor region joined with the first semiconductor region and heavily doped with impurity of the first conductive type; and
    a fifth semiconductor region heavily doped with impurity of the first conductive type,
    wherein the first semiconductor region, the second semiconductor region, the third semiconductor region, the fourth semiconductor region and the fifth semiconductor region are integrated on a same semiconductor substrate,
    wherein the fourth semiconductor region is formed on a back-side main surface of the semiconductor substrate, wherein the fifth semiconductor region disposed to pass through the first semiconductor region to the fourth semiconductor region from the front-side main surface of the semiconductor substrate, and wherein the voltage taking-out electrode is joined with the fifth semiconductor region.

8. The semiconductor device according to claim 1, further comprising:

a power supply terminal to which a DC power supply is connected; and a load terminal to which the load is connected, wherein the power supply terminal is connected with the common drain electrode and the load terminal is connected with the first diffusion layer.

9. The semiconductor device according to claim 1, further comprising:

a load terminal to which the load is connected; and a ground terminal, wherein the load terminal is connected with the common drain electrode, and the ground terminal is connected with the first diffusion layer.

10. The semiconductor device according to claim 9, further comprising:

a control input terminal to which an external control signal is supplied;

a gate resistance connected between the gate electrode and the control input terminal;

an input circuit; and a short-circuit switch connected between the gate electrode and the ground terminal, wherein the voltage detecting circuit generates the detection signal based on whether or not the voltage between the voltage taking-out electrode and the second diffusion layer is higher than the predetermined set threshold voltage, and wherein the input circuit turns on the short-circuit switch in response to the detection signal, when the voltage between the voltage taking-out electrode and the second diffusion layer is higher than the set threshold voltage.

11. The semiconductor device according to claim 1, wherein the first semiconductor region, the second semiconductor region and the third semiconductor region are integrated on the first semiconductor substrate, and wherein the voltage taking-out electrode and the voltage detecting circuit are integrated on the second semiconductor substrate.

12. The semiconductor device according to claim 11, further comprising:

a die pad with which the first semiconductor substrate and the second semiconductor substrate are joined, wherein the first semiconductor substrate further comprises a fourth semiconductor region joined with the first semiconductor region and heavily doped with impurity of the first conductive type, wherein the common drain electrode is joined with the fourth semiconductor region, wherein the second semiconductor substrate comprises:

a sixth semiconductor region heavily doped with impurity of the first conductive type;

a seventh semiconductor region of the first conductive type joined with the sixth semiconductor substrate; and a fourth diffusion layer formed in the seventh semiconductor region and heavily doped with impurity of the first conductive type, wherein the sixth semiconductor region is joined with the back electrode, wherein the common drain electrode and the back electrode are joined with the die pad, and wherein the voltage taking-out electrode is joined with the fourth diffusion layer.

13. The semiconductor device according to claim 11, further comprising:

a die pad with which the first semiconductor substrate and the second semiconductor substrate are joined, wherein the first semiconductor substrate is heavily doped with impurity of the first conductive type, and further comprises a fourth semiconductor region joined with the first semiconductor region, wherein the common drain electrode is joined with a fourth semiconductor region, wherein the second semiconductor substrate comprises a wiring line structure, wherein the voltage taking-out electrode is provided in the wiring line structure, and wherein the die pad and the voltage taking-out electrode are connected by a bonding wire.

14. The semiconductor device according to claim 1, wherein the first semiconductor region, the second semiconductor region and the third semiconductor region are integrated on a semiconductor substrate, wherein a first trench extending to pass through a region between the second semiconductor region and the third semiconductor region from the front-side main surface of the semiconductor substrate to the first semiconductor region, and a second trench extending to pass through the second semiconductor region from the front-side main surface of the semiconductor substrate to the first semiconductor region are formed in the semiconductor substrate, wherein the gate insulating film is formed to cover the first trench, and wherein the voltage taking-out electrode is joined with the first semiconductor region inside the second trench.

15. The semiconductor device according to claim 14, further comprising:

a sense current terminal configured to output sense current from the voltage taking-out electrode; and a sense current control circuit comprising the voltage detecting circuit, wherein the sense current control circuit controls the sense current in response to the detection signal such that the voltage of the voltage taking-out electrode and the voltage of the second diffusion layer are coincident with each other.

16. The semiconductor device according to claim 14, further comprising:

a sense current terminal configured to output the sense current from the voltage taking-out electrode; and a PMOS transistor having a source connected with the voltage taking-out electrode, a drain connected with the sense current terminal and a gate supplied with the detection signal.

17. The semiconductor device according to claim 15, further comprising:

a third diffusion layer formed in the first semiconductor region and heavily doped with impurity of the first conductive type;

a second voltage taking-out electrode joined with the third diffusion layer; and a second voltage detecting circuit configured to generate a second detection signal based on whether or not the voltage between the second voltage taking-out electrode and the second diffusion layer is higher than the predetermined set threshold voltage.

18. The semiconductor device according to claim 17, further comprising:
a logic circuit configured to control the voltage of the gate electrode in response to an external control signal,
wherein the logic circuit controls the voltage of the gate electrode in response to the second detection signal to turn off the first transistor and the second transistor regardless of the external control signal when the voltage between the second voltage taking-out electrode and the second diffusion layer is higher than the set threshold voltage.

19. The semiconductor device according to claim 1, wherein, when a gate voltage is applied to the gate electrode such that the first transistor and the second transistor are turned on, a boundary between the first semiconductor region and the second semiconductor region is electrically connected with the second diffusion layer through an accumulation layer which is formed on a surface opposing to the gate electrode of the first semiconductor region and an inversion layer which is formed on a surface opposing to the gate electrode of the third semiconductor region.

20. The semiconductor device according to claim 1, further comprising:
a fourth semiconductor region joined with the first semiconductor region and heavily doped with impurity of the first conductive type,
wherein the common drain electrode is joined with the fourth semiconductor region.

21. The semiconductor device according to claim 1, wherein the first semiconductor region, the second semiconductor region and the third semiconductor region are integrated on the semiconductor substrate,
wherein the trench is formed to pass through a region between the second semiconductor region and the third semiconductor region from a front-side main surface of the semiconductor substrate to the first semiconductor region, and
wherein the gate insulating film is formed to cover the first trench.

22. The semiconductor device according to claim 1, wherein the first semiconductor region, the second semiconductor region and the third semiconductor region are integrated on the semiconductor substrate,
wherein a part of the first semiconductor region passes through a region between the second semiconductor region and the third semiconductor region to the front-side main surface of the semiconductor substrate, and
wherein the gate insulating film is formed on the front-side main surface of the semiconductor substrate.

23. The semiconductor device according to claim 22, further comprising:
a fourth semiconductor region joined with the first semiconductor region and heavily doped with the impurity of the first conductive type;
a fifth semiconductor region joined with the fourth semiconductor region and heavily doped with the impurity of the second conductive type,
wherein the common drain electrode is joined with the fifth semiconductor region.

24. An in-vehicle electronic system comprising:
a semiconductor device configured to supply a load current to a load; and
a controller,
wherein said semiconductor device comprises:
a first semiconductor region of a first conductive type;
a common drain electrode electrically connected with the first semiconductor region;
a second semiconductor region which is of a second conductive type which is different from the first conductive type, and which is joined with the first semiconductor region;
a first diffusion layer formed in the second semiconductor region, heavily doped with an impurity of the first conductive type and configured to function as a source of a first transistor;
a third semiconductor region of the second conductive type joined with the first semiconductor region;
a second diffusion layer formed in the third semiconductor region, heavily doped with the impurity of the first conductive type, and configured to function as a source of a second transistor;
a gate insulating film;
a gate electrode formed to oppose to the first semiconductor region, the second semiconductor region and the third semiconductor region through the gate insulating film; and
a voltage detecting circuit,
wherein the load current flows between the common drain electrode and the first diffusion layer,
wherein the voltage detecting control circuit generates a detection signal in response to a voltage between the second diffusion layer and a voltage taking-out electrode which is formed to have a voltage which is identical with a voltage of the common drain electrode or a voltage corresponding to the voltage of the common drain electrode, and
wherein the controller receives the detection signal from the semiconductor device and detects an extraordinary event of the load based on the detection signal.

25. An in-vehicle electronic system comprising:
a semiconductor device configured to supply a load current to a load; and
a controller,
wherein the semiconductor device comprises:
a first semiconductor region of a first conductive type;
a common drain electrode electrically connected with the first semiconductor region;
a second semiconductor region which is of a second conductive type which is different from the first conductive type, and which joined with the first semiconductor region;
a first diffusion layer formed in the second semiconductor region, heavily doped with an impurity of the first conductive type and configured to function as a source of a first transistor;
a third semiconductor region of the second conductive type joined with the first semiconductor region;
a second diffusion layer formed in the third semiconductor region, heavily doped with an impurity of the first conductive type, and configured to function as a source of a second transistor;
a gate insulating film;
a gate electrode formed to oppose to the first semiconductor region, the second semiconductor region the third semiconductor region through the gate insulating film;
a sense current terminal; and
a sense current control circuit,
wherein the load current flows between the common drain electrode and the first diffusion layer, wherein the sense current control circuit generates a detection signal in response to a voltage between the second diffusion layer and a voltage taking-out electrode which is formed to have a voltage which is identical with a voltage of the common drain electrode or a voltage corresponding to the voltage of the common drain electrode, wherein the first semiconductor region, the second semiconductor region and the third semiconductor region are integrated on the semiconductor substrate, wherein a first trench is formed in the semiconductor substrate to pass through a region between the second semiconductor region and the third semiconductor region to the first semiconductor region from a front-side main surface of the semiconductor substrate, and a second trench is formed in the semiconductor substrate to pass through the second semiconductor region to the first semiconductor region from the front-side main surface of the semiconductor substrate, wherein the gate insulating film is formed to cover the first trench;

wherein the voltage taking-out electrode is joined with the first semiconductor region inside the second trench;

wherein the sense current terminal outputs a sense current drawn out from the voltage taking-out electrode to an external unit;

wherein the sense current control circuit controls the sense current in response to the detection signal such that the voltage of the voltage taking-out electrode and the voltage of the second diffusion layer coincide with each other, and wherein the controller detects the extraordinary event of the load based on the sense current.

26. A vehicle comprising the in-vehicle electronic system according to claim 24.

27. A vehicle comprising the in-vehicle electronic system according to claim 25.

* * * * *